(12) United States Patent
Kataoka et al.

(10) Patent No.: US 8,866,647 B2
(45) Date of Patent: Oct. 21, 2014

(54) COMPUTER PRODUCT, INFORMATION PROCESSING APPARATUS, AND INFORMATION SEARCH APPARATUS

(75) Inventors: Masahiro Kataoka, Kawasaki (JP); Tatsuhiro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 341 days.

(21) Appl. No.: 13/486,192

(22) Filed: Jun. 1, 2012

(65) Prior Publication Data
US 2012/0268297 A1 Oct. 25, 2012

Related U.S. Application Data

(63) Continuation of application No. 12/913,225, filed on Oct. 27, 2010, now Pat. No. 8,193,954.

(30) Foreign Application Priority Data

Nov. 6, 2009 (JP) ................................. 2009-254794

(51) Int. Cl.
H03M 7/40 (2006.01)
H03M 7/30 (2006.01)
H04L 29/08 (2006.01)
H04N 19/61 (2014.01)

(52) U.S. Cl.
CPC . H03M 7/40 (2013.01); H03M 7/30 (2013.01); H04L 29/08072 (2013.01); H04N 7/50 (2013.01)
USPC ............................................. 341/65; 341/67

(58) Field of Classification Search
CPC ............ H03M 7/40; H03M 7/30; H04N 7/50; H04L 29/08072
USPC .......... 341/65, 67, 50, 106, 51; 707/769, 693, 707/623, 667, 737, 673, 101, 200
See application file for complete search history.

(56) References Cited

U.S. PATENT DOCUMENTS

2009/0006399 A1* 1/2009 Raman et al. .................... 707/7

FOREIGN PATENT DOCUMENTS

JP 2986865 B 10/1999
JP 3024544 B 1/2000

OTHER PUBLICATIONS

USPTO, (Lauture) Notice of Allowance and Notice of Allowability, Feb. 10, 2012, in parent U.S. Appl. No. 12/913,225 [allowed—issue date Jun. 5, 2012].
USPTO, Issue Notification, May 16, 2012, in parent U.S. Appl. No. 12/913,225 [allowed—issue date Jun. 5, 2012].

* cited by examiner

*Primary Examiner* — Joseph Lauture
(74) *Attorney, Agent, or Firm* — Fujitsu Patent Center

(57) ABSTRACT

A recording medium stores an information processing program that causes a computer to execute storing a compression symbol map group having a bit string indicating for each character code, presence or absence of the character code in a file group, and a Huffman tree whose leaf corresponding to the character code has a pointer to a compression symbol map of the character code, the Huffman tree converting the character code into a compression symbol of the character code; compressing sequentially and according to the Huffman tree, a character code to be compressed and described in a file of the file group; detecting access to the leaf at the compressing; identifying by a pointer in the accessed leaf, a compression symbol map of the character code to be compressed; and updating a bit that indicates presence or absence of the character code to be compressed, in the identified compression symbol map.

19 Claims, 76 Drawing Sheets

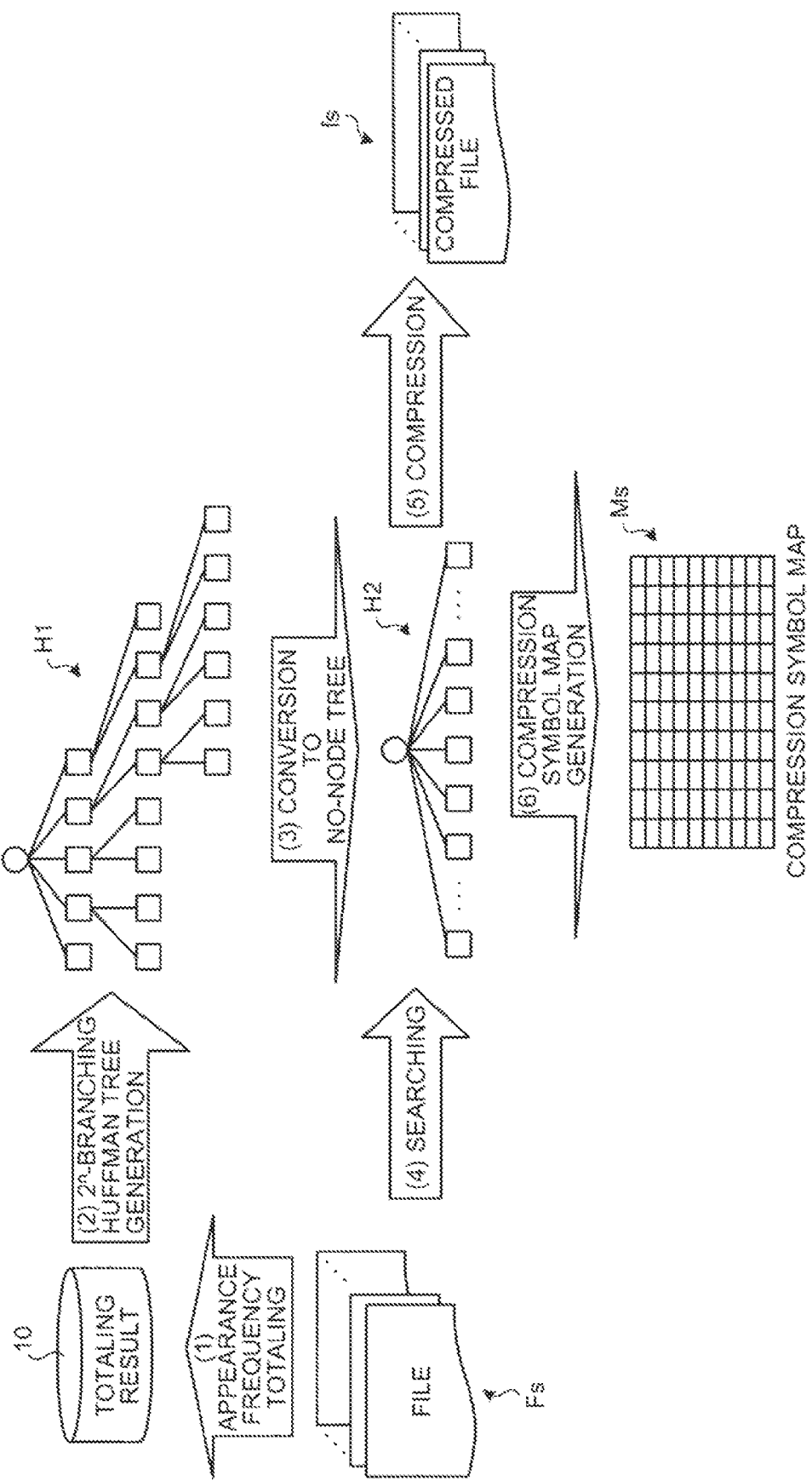

| CHARACTER APPEARANCE FREQUENCY TOTALING TABLE ||
|---|---|
| CHARACTER | COUNTER VALUE |
| 0 | ... |
| ⋮ | ⋮ |
| 9 | ... |
| A | ... |
| ⋮ | ⋮ |
| Z | ... |
| a | ... |
| ⋮ | ⋮ |
| z | ... |
| あ | ... |
| ⋮ | ⋮ |
| ん | ... |
| ア | ... |
| ⋮ | ⋮ |
| ン | ... |
| 足 | ... |
| ⋮ | ⋮ |
| 我 | ... |

FIG.7

| RESERVED WORD APPEARANCE FREQUENCY TOTALING TABLE ||
|---|---|
| RESERVED WORD | COUNTER VALUE |
| <br> | ... |
| </a> | ... |
| <a name=" | ... |
| ⋮ | ⋮ |

TOTALING RESULT TABLE

| RANK | CHARACTER CODE OR RESERVED WORD | COUNTER VALUE | APPEARANCE RATE [%] | APPEARANCE RATE AREA |
|---|---|---|---|---|
| 1 | 0 | : | : | : |
| 2 | ^ | : | : | : |
| 3 | \<br\> | : | : | : |
| ... | ... | ... | ... | ... |

| DIVIDED-CHARACTER-CODE APPEARANCE FREQUENCY TOTALING TABLE ||
|---|---|
| DIVIDED CHARACTER CODE | APPEARANCE FREQUENCY |
| 00 | ... |
| 01 | ... |
| 02 | ... |
| ⋮ | ⋮ |
| FF | ... |

| UPPER-DIVIDED-CHARACTER-CODE APPEARANCE FREQUENCY TOTALING TABLE ||
|---|---|
| UPPER DIVIDED CHARACTER CODE | APPEARANCE FREQUENCY |
| 00 | ... |
| 01 | ... |
| 02 | ... |
| ⋮ | ⋮ |
| FF | ... |

| LOWER-DIVIDED-CHARACTER-CODE APPEARANCE FREQUENCY TOTALING TABLE ||
|---|---|
| LOWER DIVIDED CHARACTER CODE | APPEARANCE FREQUENCY |
| 00 | ... |
| 01 | ... |
| 02 | ... |
| ⋮ | ⋮ |
| FF | ... |

FIG.10

| ITEM | FIRST LAYER | SECOND LAYER | THIRD LAYER | FOURTH LAYER |
|---|---|---|---|---|
| NUMBER OF STRUCTURE CELLS $Nt(i)$ | 1 | 16 | 256 | 4096 |
| NUMBER OF LEAVES $Nl(i)$ | 3 | 54 | 353 | 885 |
| NUMBER OF POINTERS TO LEAVES $Nlp(i)$ | 3 | 54 | 353 | 885 |
| NUMBER OF POINTERS TO LOWER NODES $Nnp(i)$ | 5 | 26 | 56 | 0 |
| NUMBER OF USED STRUCTURE CELLS $Ncu(i)$ | 1 | 5 | 26 | 56 |
| ACCUMULATED VALUE OF NUMBERS OF POINTERS TO LEAVES $\Sigma Nlp(i)$ | 3 | 57 | 410 | 1295 |
| NUMBER OF BLANK CELLS FROM HEAD $Ncst(i)$ | 0 | 3 | 57 | 410 |
| NUMBER OF BLANK POINTERS TO TAIL $Npse(i)$ | 9 | 131 | 2775 | 58091 |
| NUMBER OF BLANK CELLS TO TAIL $Ncse(i)$ | 0 | 8 | 173 | 3630 |

| ITEM | FIRST LAYER | SECOND LAYER | THIRD LAYER | FOURTH LAYER |
|---|---|---|---|---|
| NUMBER OF LEAVES TO ADD OR DELETE | | | 885 | -885 |
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 54 | 1238 | 0 |
| NUMBER OF POINTERS TO LOWER NODES Nnp(i) | 5 | 78 | 1 | 0 |
| NUMBER OF USED STRUCTURE CELLS Ncsu(i) | 1 | 9 | 78 | 1 |
| ACCUMULATED VALUE OF NUMBERS OF POINTERS TO LEAVES ΣNlp(i) | 3 | 57 | 1295 | 1295 |
| NUMBER OF BLANK CELLS FROM HEAD Ncsf(i) | 0 | 3 | 57 | 1295 |
| NUMBER OF BLANK POINTERS TO TAIL Npse(i) | 9 | 76 | 1945 | 44816 |
| NUMBER OF BLANK CELLS TO TAIL Ncse(i) | 0 | 4 | 121 | 2801 |

| ITEM | FIRST LAYER | SECOND LAYER | THIRD LAYER | FOURTH LAYER |
|---|---|---|---|---|
| NUMBER OF LEAVES TO ADD OR DELETE | | 76 | 809 | -885 |
| NUMBER OF STRUCTURE CELLS Nl(i) | 1 | 16 | 256 | 4096 |
| NUMBER OF LEAVES Nlp(i) | 3 | 54 | 353 | 885 |
| NUMBER OF POINTERS TO LEAVES Nlp(i) | 3 | 130 | 1162 | 0 |
| NUMBER OF POINTERS TO LOWER NODES Nnp(i) | 9 | 73 | 1 | 0 |
| NUMBER OF USED STRUCTURE CELLS Nou(i) | 1 | 13 | 73 | 1 |
| ACCUMULATED VALUE OF NUMBERS OF POINTERS TO LEAVES ΣNlp(i) | 3 | 133 | 1295 | 1295 |
| NUMBER OF BLANK CELLS FROM HEAD Ncst(i) | 0 | 3 | 133 | 1295 |
| NUMBER OF BLANK POINTERS TO TAIL Npse(i) | 4 | 5 | 805 | 44816 |
| NUMBER OF BLANK CELLS TO TAIL Ncse(i) | 0 | 0 | 50 | 2801 |

| ITEM | FIRST LAYER | SECOND LAYER | THIRD LAYER | FOURTH LAYER |
|---|---|---|---|---|
| NUMBER OF LEAVES TO ADD OR DELETE | 0 | 76 | 809 | -885 |
| NUMBER OF STRUCTURE CELLS M(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 130 | 1162 | 0 |
| NUMBER OF POINTERS TO LOWER NODES Nnp(i) | 9 | 73 | 1 | 0 |
| NUMBER OF USED STRUCTURE CELLS Ncu(i) | 1 | 13 | 73 | 1 |
| ACCUMULATED VALUE OF NUMBERS OF POINTERS TO LEAVES ΣNlp(i) | 3 | 133 | 1295 | 1295 |
| NUMBER OF BLANK CELLS FROM HEAD Ncst(i) | 0 | 3 | 133 | 1295 |
| NUMBER OF BLANK POINTERS TO TAIL Npse(i) | 4 | 5 | 805 | 44816 |
| NUMBER OF BLANK CELLS TO TAIL Ncse(i) | 0 | 0 | 50 | 2801 |

FIG.15

| LEAF NUMBER | COMPRESSION SYMBOL LENGTH | COMPRESSION SYMBOL | CHARACTER CODE | CHARACTER CODE LENGTH |
|---|---|---|---|---|
| 1 | 4 | 0000 | e1 | 16 |
| 2 | 4 | 0001 | e2 | 16 |
| 3 | 4 | 0010 | e3 | 16 |
| 4 | 8 | 00110000 | e4 | 16 |
| ⋮ | ⋮ | ⋮ | ⋮ | ⋮ |
| 19 | 8 | 00111111 | e19 | 16 |
| ⋮ | ⋮ | ⋮ | ⋮ | ⋮ |
| 24 | 8 | 01000100 | e24(0x6E30) | 16 |
| ⋮ | ⋮ | ⋮ | ⋮ | ⋮ |
| 79 | 8 | 01111011 | e79(0x6F30) | 16 |
| ⋮ | ⋮ | ⋮ | ⋮ | ⋮ |
| 117 | 8 | 10010000 | e117 | 16 |
| ⋮ | ⋮ | ⋮ | ⋮ | ⋮ |
| 132 | 8 | 10011111 | e132 | 16 |
| 133 | 8 | 10100000 | e133 | 16 |
| 134 | 8 | 10100001 | e134 | 16 |
| 135 | 12 | 101000100000 | e135 | 16 |
| ⋮ | ⋮ | ⋮ | ⋮ | ⋮ |
| 150 | 12 | 101000101111 | e150 | 16 |
| ⋮ | ⋮ | ⋮ | ⋮ | ⋮ |
| 156 | 12 | 101000110101 | e156(0x4E) | 8 |
| ⋮ | ⋮ | ⋮ | ⋮ | ⋮ |
| 167 | 12 | 101001000000 | e167(0x51) | 8 |
| ⋮ | ⋮ | ⋮ | ⋮ | ⋮ |
| 691 | 12 | 110001001100 | e691(0x216B) | 16 |
| ⋮ | ⋮ | ⋮ | ⋮ | ⋮ |
| 1295 | 12 | 101111110100 | e1295 | 16 |

FIG.16

| STRUCTURE OF RESERVED WORD ||
|---|---|
| TOTAL NUMBER OF RESERVED WORDS | 15 |
| LONGEST BIT LENGTH OF RESERVED WORDS | Lrmax |
| BIT LENGTH OF RESERVED WORD r1 | Lr1(=64) |
| RESERVED WORD r1(<br>) ||
| POINTER TO LEAF OF RESERVED WORD r1 ||
| BIT LENGTH OF RESERVED WORD r2 | Lr2(=64) |
| RESERVED WORD r2(</a>) ||
| POINTER TO LEAF OF RESERVED WORD r2 ||
| ⋮ ||
| BIT LENGTH OF RESERVED WORD r15 | Lr15 |
| RESERVED WORD r15 ||
| POINTER TO LEAF OF RESERVED WORD r15 ||
| EOT(0xFFFF) ||

| STRUCTURE OF HIGHER-LEVEL CHARACTER CODE ||
|---|---|
| CHARACTER CODE | POINTER TO LEAF |
| ⋮ | ⋮ |
| e691(0x216B:次) | POINTER TO LEAF e691 |
| ⋮ | ⋮ |
| e24(0x6E30:の) | POINTER TO LEAF e24 |
| ⋮ | ⋮ |
| e79(0x6F30:は) | POINTER TO LEAF e79 |
| ⋮ | ⋮ |

| STRUCTURE OF DIVIDED CHARACTER CODE ||
|---|---|
| DIVIDED CHARACTER CODE | POINTER TO LEAF |
| 0x00 | POINTER TO LEAF OF "0x00" |
| 0x01 | POINTER TO LEAF OF "0x01" |
| ⋮ | ⋮ |
| 0xFF | POINTER TO LEAF OF "0xFF" |

FIG.29

| LEAF NUMBER | COMPRESSION SYMBOL | COMPRESSION SYMBOL LENGTH | EXPANSION TYPE | CHARACTER CODES, ETC. | POINTER TO COMPRESSION SYMBOL MAP | |
|---|---|---|---|---|---|---|
| | | | | | SYMBOL CATEGORY | ADDRESS VALUE |
| 1 | 0000 | 4 | ... | e1 | 1 | adr1 |
| 2 | 0001 | 4 | ... | e2 | 1 | adr2 |
| 3 | 0010 | 4 | ... | e3 | 1 | adr3 |
| 4 | 00110000 | 8 | ... | e4 | 1 | adr4 |
| ... | ... | ... | ... | ... | ... | ... |
| 24 | 01000100 | 8 | 16 BITS | e24(0x6E30) | 0 | adr24 |
| ... | ... | ... | ... | ... | ... | ... |
| 79 | 01111011 | 8 | 16 BITS | e79(0x6F30) | 0 | adr79 |
| ... | ... | ... | ... | ... | ... | ... |
| 134 | 10100001 | 8 | ... | e134 | 1 | adr134 |
| 135 | 101000100000 | 12 | ... | e135 | 1 | adr135 |
| ... | ... | ... | ... | ... | ... | ... |
| 156 | 101000110100 | 12 | 8 BITS | e156(0x4E) | 0 | adr156 |
| 167 | 101001000000 | 12 | 8 BITS | e167(0x51) | 0 | adr167 |
| ... | ... | ... | ... | ... | ... | ... |
| 691 | 110001001100 | 12 | 16 BITS | e691(0x216B) | 1 | adr691 |
| ... | ... | ... | ... | ... | ... | ... |
| 1295 | 101111110100 | 12 | ... | e1295 | 1 | adr1295 |
| ... | ... | ... | ... | ... | ... | ... |

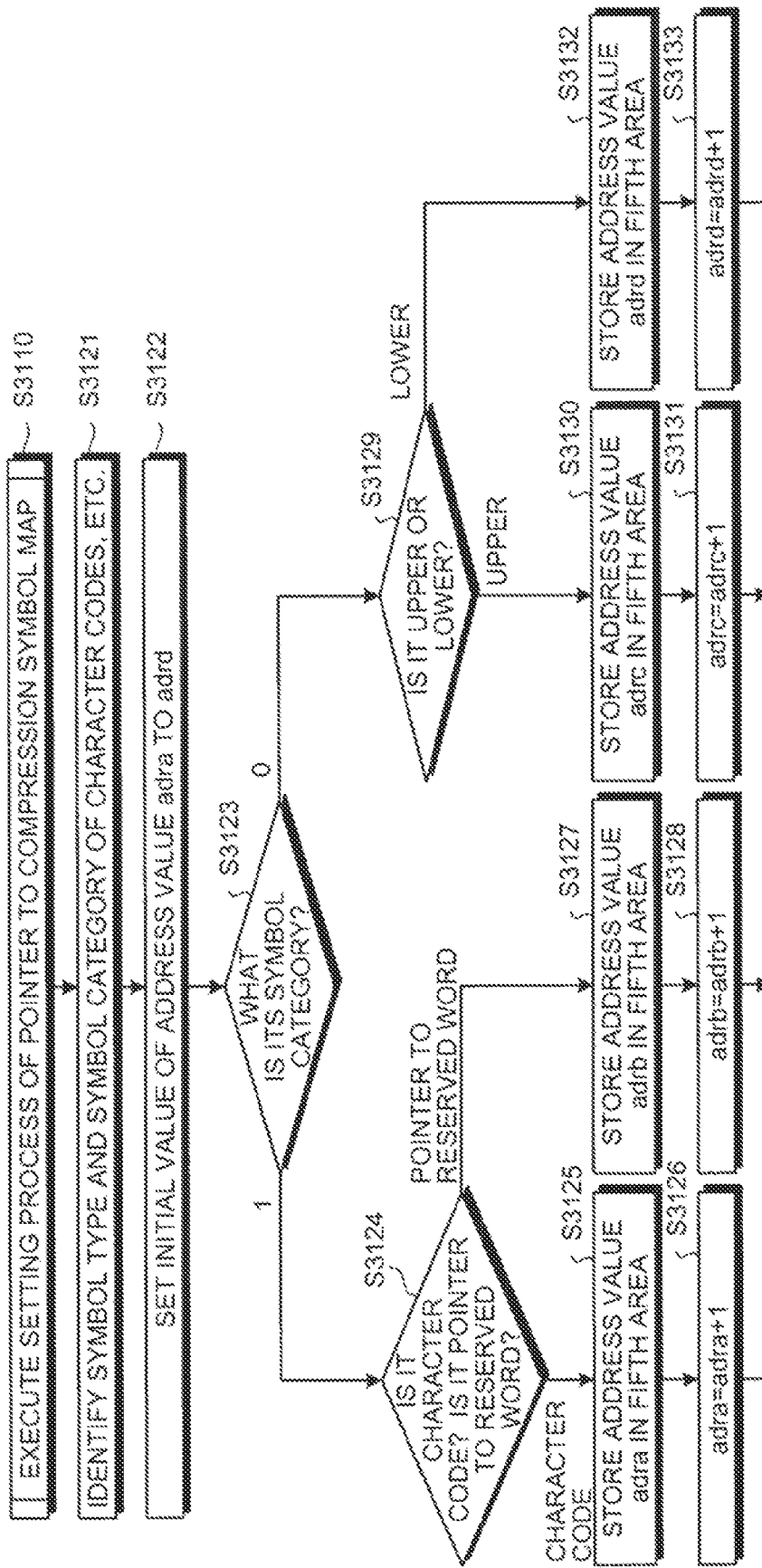

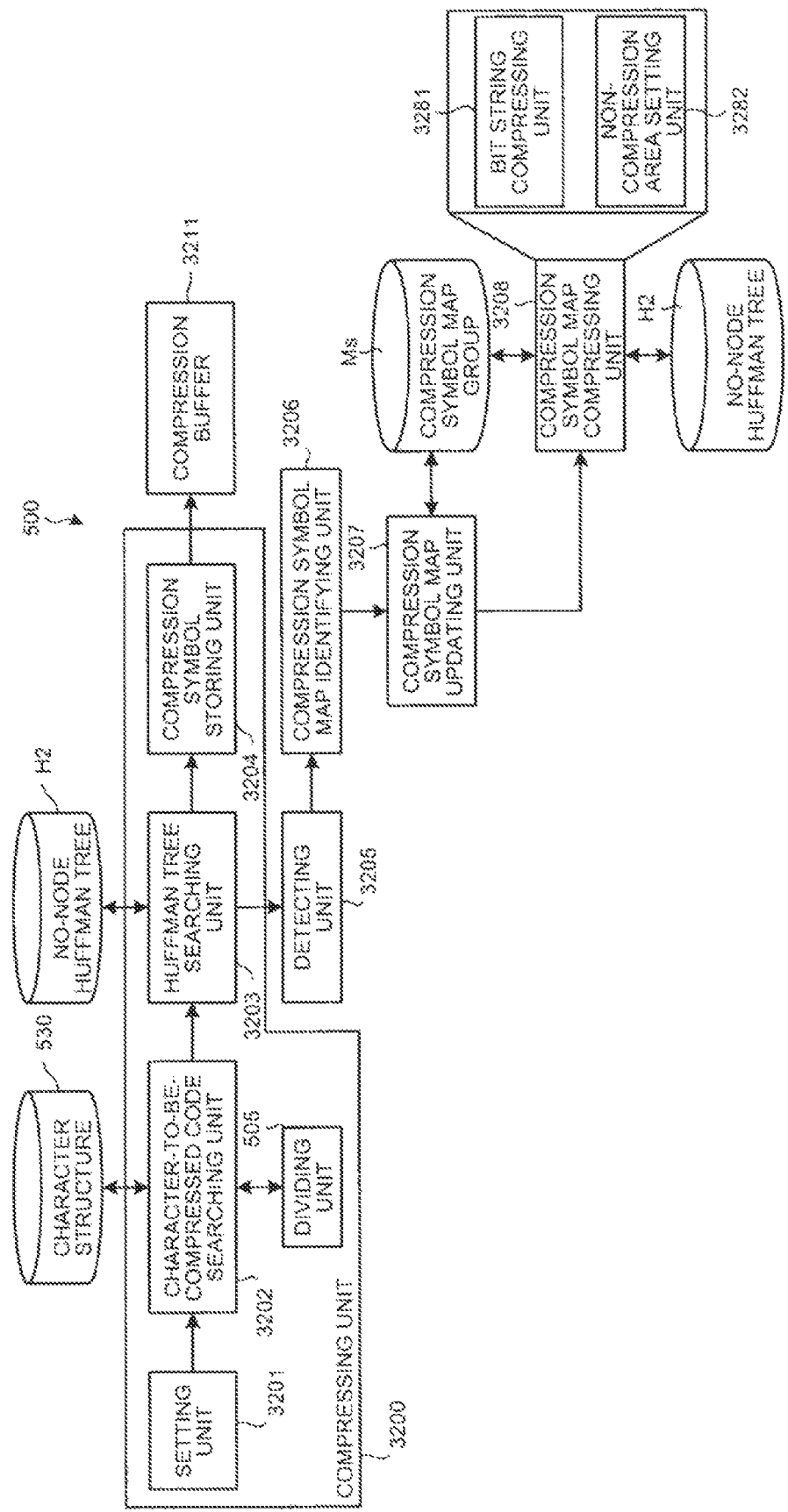

FIG.33A

| CHARACTER STRING | 犬 | | | | の | | | | 発 | | | | は | | | |
|---|---|---|---|---|---|---|---|---|---|---|---|---|---|---|---|---|
| | | | | | | | | | UPPER | LOWER | | | | | | |
| CHARACTER CODE STRING (HEXADECIMAL) | 2 | 1 | 6 | B | 6 | E | 3 | 0 | 5 | 1 | 4 | E | 6 | F | 3 | 0 |
| CHARACTER CODE STRING (BINARY) | 0010 | 0001 | 0110 | 1011 | 0110 | 1110 | 0011 | 0000 | 0101 | 0001 | 0100 | 1110 | 0110 | 1111 | 0011 | 0000 |

FIG.33B

| CHARACTER STRING | 次 | の | 兎 || は |
|---|---|---|---|---|---|
| | | | UPPER | LOWER | |
| COMPRESSION SYMBOL STRING | 110001001100 | 01000100 | 10100100000 | 10100110101 | 01111011 |

FIG.39A

INITIAL STATE

| ADDRESS | | FILE NUMBER | | | | | | |
|---|---|---|---|---|---|---|---|---|
| CATEGORY | ADDRESS PORTION | α | α-1 | ... | 4 | 3 | 2 | 1 |
| 1 | 0001 | 0 | 0 | ... | 0 | 0 | 0 | 0 |
| 1 | 0002 | 0 | 0 | ... | 0 | 0 | 0 | 0 |
| 1 | 0003 | 0 | 0 | ... | 0 | 0 | 0 | 0 |
| ⋮ | ⋮ | ⋮ | ⋮ | ⋮ | ⋮ | ⋮ | ⋮ | ⋮ |
| 1 | 1024 | 0 | 0 | ... | 0 | 0 | 0 | 0 |
| 1 | 1025 | 0 | 0 | ... | 0 | 0 | 0 | 0 |
| ⋮ | ⋮ | ⋮ | ⋮ | ⋮ | ⋮ | ⋮ | ⋮ | ⋮ |
| 1 | 1039 | 0 | 0 | ... | 0 | 0 | 0 | 0 |
| 0 | 0001 | 0 | 0 | ... | 0 | 0 | 0 | 0 |
| 0 | 0002 | 0 | 0 | ... | 0 | 0 | 0 | 0 |
| 0 | 0003 | 0 | 0 | ... | 0 | 0 | 0 | 0 |
| ⋮ | ⋮ | ⋮ | ⋮ | ⋮ | ⋮ | ⋮ | ⋮ | ⋮ |
| 0 | 0256 | 0 | 0 | ... | 0 | 0 | 0 | 0 |
| 0 | 0257 | 0 | 0 | ... | 0 | 0 | 0 | 0 |
| ⋮ | ⋮ | ⋮ | ⋮ | ⋮ | ⋮ | ⋮ | ⋮ | ⋮ |
| 0 | 0512 | 0 | 0 | ... | 0 | 0 | 0 | 0 |

AFTER UPDATING OF MAP  Ms

| ADDRESS | | FILE NUMBER | | | | | | |
|---|---|---|---|---|---|---|---|---|
| CATEGORY | ADDRESS PORTION | α | α-1 | ... | 4 | 3 | 2 | 1 |
| 1 | 0001 | 1 | 0 | ... | 0 | 0 | 0 | 0 |
| 1 | 0002 | 0 | 1 | ... | 1 | 0 | 1 | 0 |
| 1 | 0003 | 0 | 0 | ... | 0 | 0 | 0 | 1 |
| ⋮ | ⋮ | ⋮ | ⋮ | ⋮ | ⋮ | ⋮ | ⋮ | ⋮ |
| 1 | 1024 | 0 | 0 | ... | 1 | 1 | 1 | 1 |
| 1 | 1025 | 0 | 1 | ... | 1 | 0 | 0 | 0 |
| ⋮ | ⋮ | ⋮ | ⋮ | ⋮ | ⋮ | ⋮ | ⋮ | ⋮ |
| 1 | 1039 | 0 | 0 | ... | 0 | 0 | 0 | 0 |
| 0 | 0001 | 0 | 0 | ... | 0 | 1 | 0 | 0 |
| 0 | 0002 | 0 | 0 | ... | 0 | 1 | 1 | 0 |
| 0 | 0003 | 0 | 0 | ... | 0 | 1 | 0 | 1 |
| ⋮ | ⋮ | ⋮ | ⋮ | ⋮ | ⋮ | ⋮ | ⋮ | ⋮ |
| 0 | 0256 | 0 | 0 | ... | 0 | 1 | 0 | 0 |
| 0 | 0257 | 0 | 0 | ... | 1 | 0 | 0 | 1 |
| ⋮ | ⋮ | ⋮ | ⋮ | ⋮ | ⋮ | ⋮ | ⋮ | ⋮ |
| 0 | 0512 | 0 | 0 | ... | 0 | 0 | 1 | 0 |

FIG.41

| APPEARANCE RATE AREA | COMPRESSION PATTERN | COMPRESSION RATE |
|---|---|---|
| E | 16+1 (64 BITS) KINDS OF HUFFMAN TREE | 7% |
| D | 16+1 (32 BITS) KINDS OF HUFFMAN TREE | 14% |
| C | 16+1 (16 BITS) KINDS OF HUFFMAN TREE | 28% |
| B | 16 KINDS OF HUFFMAN TREE | 64% |
| A | NON-COMPRESSION | 100% |
| A' | | |
| B' | 16 KINDS OF HUFFMAN TREE | 64% |
| C' | 16+1 (16 BITS) KINDS OF HUFFMAN TREE | 28% |
| D' | 16+1 (32 BITS) KINDS OF HUFFMAN TREE | 14% |
| E' | 16+1 (64 BITS) KINDS OF HUFFMAN TREE | 7% |

| SYMBOL STRING | SYMBOL WORD |
|---|---|
| 0000 | 01 |
| 0010 | 100 |
| 0100 | 101 |
| 1000 | 110 |
| 0001 | 1110 |
| 0111 | 111100 |
| 1011 | 111101 |
| 1101 | 1111100 |
| 1110 | 1111101 |
| 0011 | 11111100 |
| 0101 | 111111010 |
| 0110 | 111111011 |
| 1001 | 111111100 |
| 1010 | 111111101 |
| 1100 | 111111110 |
| 1111 | 111111111 |

FIG.42B

| SYMBOL STRING | SYMBOL WORD |
|---:|---:|
| 0000000000000000 | 00 |
| 0000 | 01 |
| 0010 | 100 |
| 0100 | 101 |
| 1000 | 110 |
| 0001 | 1110 |
| 0111 | 111100 |
| 1011 | 111101 |
| 1101 | 1111100 |
| 1110 | 1111101 |
| 0011 | 11111100 |
| 0101 | 111111010 |
| 0110 | 111111011 |
| 1001 | 111111100 |
| 1010 | 1111111101 |
| 1100 | 1111111110 |
| 1111 | 1111111111 |

| SYMBOL STRING | SYMBOL WORD |
|---|---:|
| 0000· · · 0000(32bit) | 00 |
| 0000 | 01 |
| 0010 | 100 |
| 0100 | 101 |
| 1000 | 110 |
| 0001 | 1110 |
| 0111 | 111100 |
| 1011 | 111101 |
| 1101 | 1111100 |
| 1110 | 1111101 |
| 0011 | 11111100 |
| 0101 | 111111010 |
| 0110 | 111111011 |
| 1001 | 111111100 |
| 1010 | 1111111101 |
| 1100 | 1111111110 |
| 1111 | 1111111111 |

| SYMBOL STRING | SYMBOL WORD |
|---|---|
| 0000・・・0000(64bit) | 00 |
| 0000 | 01 |
| 0010 | 100 |
| 0100 | 101 |
| 1000 | 110 |
| 0001 | 1110 |
| 0111 | 111100 |
| 1011 | 111101 |
| 1101 | 1111100 |
| 1110 | 1111101 |
| 0011 | 11111100 |
| 0101 | 111111010 |
| 0110 | 111111011 |
| 1001 | 111111100 |
| 1010 | 111111101 |
| 1100 | 111111110 |
| 1111 | 111111111 |

FIG.44

| ADDRESS | | NON-COMPRESSION AREA | | | COMPRESSION AREA | |
|---|---|---|---|---|---|---|
| | | FILE NUMBER OF ADDED FILE | | | COMPRESSION SYMBOL STRING OF COMPRESSION SYMBOL MAP OF FILE NUMBERS 1 TO α | |
| CATEGORY | ADDRESS PORTION | β | ... | α+1 | | |
| 1 | 0001 | 1 | ... | 0 | ... | 00 |
| 1 | 0002 | 0 | ... | 0 | ... | 111111110 |
| 1 | 0003 | 0 | ... | 1 | ... | 1110 |
| ⋮ | ⋮ | ⋮ | ⋮ | ⋮ | ⋮ | ⋮ |
| 1 | 1024 | 0 | ... | 1 | ... | 111111111 |
| 1 | 1025 | 0 | ... | 0 | ... | 1000 |
| ⋮ | ⋮ | ⋮ | ⋮ | ⋮ | ⋮ | ⋮ |
| 1 | 1039 | 0 | ... | 0 | ... | 01 |
| 0 | 0001 | 0 | ... | 0 | ... | 101 |
| 0 | 0002 | 0 | ... | 0 | ... | 111111011 |
| 0 | 0003 | 0 | ... | 1 | ... | 111111010 |
| ⋮ | ⋮ | ⋮ | ⋮ | ⋮ | ⋮ | ⋮ |
| 0 | 0256 | 0 | ... | 0 | ... | 101 |
| 0 | 0257 | 0 | ... | 1 | ... | 111111100 |
| ⋮ | ⋮ | ⋮ | ⋮ | ⋮ | ⋮ | ⋮ |
| 0 | 0512 | 0 | ... | 0 | ... | 100 | ms

FIG.45

| FILE NUMBER OF ADDED FILE | | | FILE NUMBER | | | | | | |
|---|---|---|---|---|---|---|---|---|---|
| β | ... | α+1 | α | α-1 | ... | 4 | 3 | 2 | 1 |
| 1 | ... | 1 | 1 | 1 | ... | 1 | 1 | 1 | 1 |

⇩

| FILE NUMBER OF ADDED FILE | | | FILE NUMBER | | | | | | |
|---|---|---|---|---|---|---|---|---|---|
| β | ... | α+1 | α | α-1 | ... | 4 | 3 | 2 | 1 |
| 1 | ... | 1 | 1 | 1 | ... | 1 | 0 | 1 | 1 |

FIG.52

| SEARCH KEYWORD "増殖細胞" | FILE NUMBER | | | |
|---|---|---|---|---|
| | 4 | 3 | 2 | 1 |
| M1 — COMPRESSION SYMBOL MAP OF "増" | 1 | 1 | 1 | 0 |
| M2 — COMPRESSION SYMBOL MAP OF "殖" | 0 | 1 | 1 | 0 |
| M3 — COMPRESSION SYMBOL MAP OF "細" | 0 | 1 | 1 | 0 |
| M4 — COMPRESSION SYMBOL MAP OF "胞" | 0 | 1 | 1 | 0 |
| Md — DELETION MAP | 1 | 1 | 0 | 1 |
| AND-COMPUTATION RESULT | 0 | 1 | 0 | 0 |

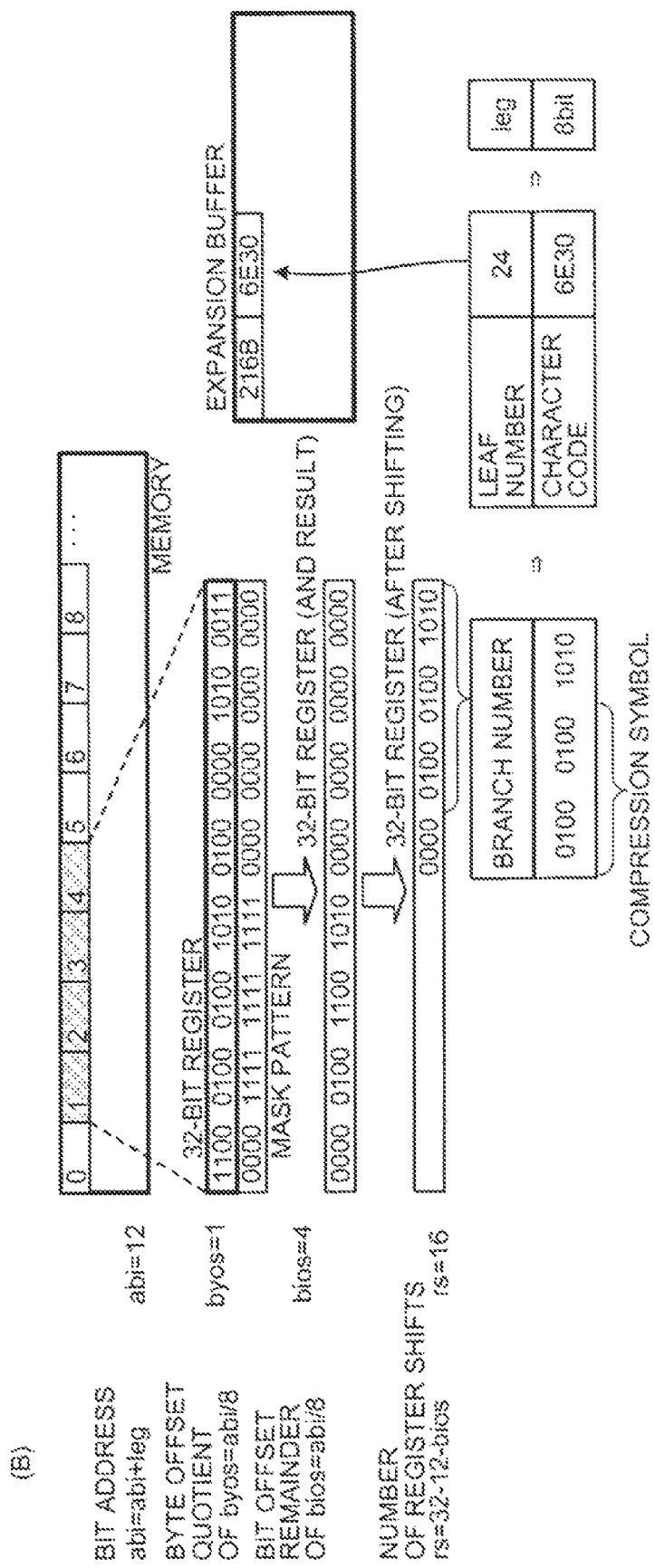

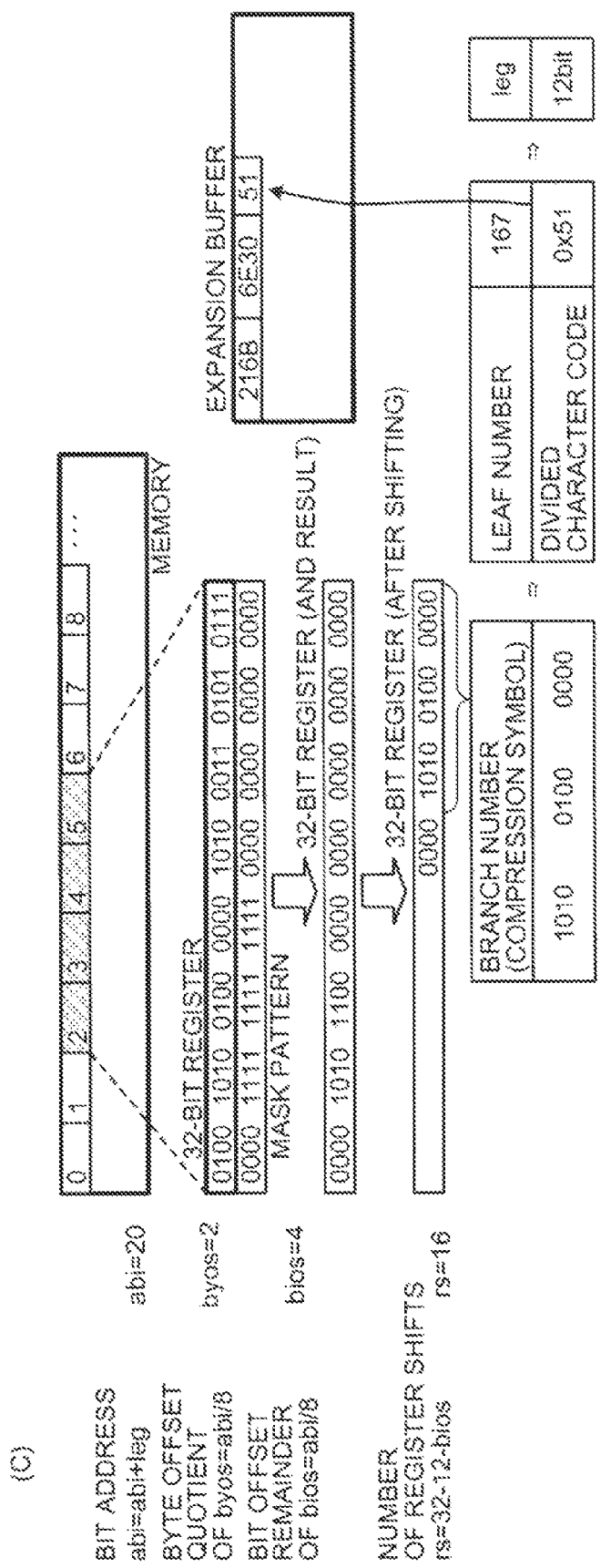

FIG.54B
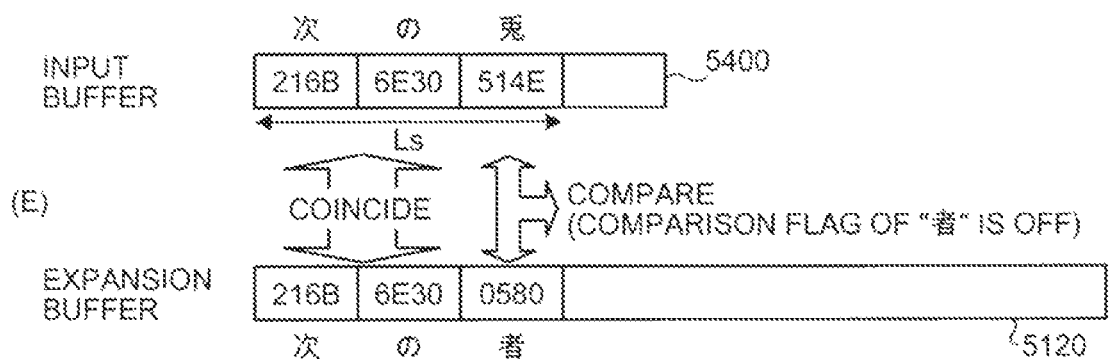
(E)
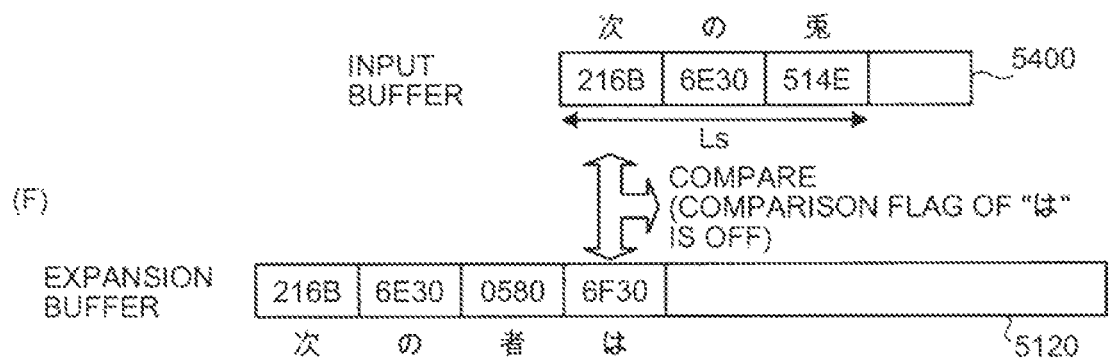
(F)

FIG.54C
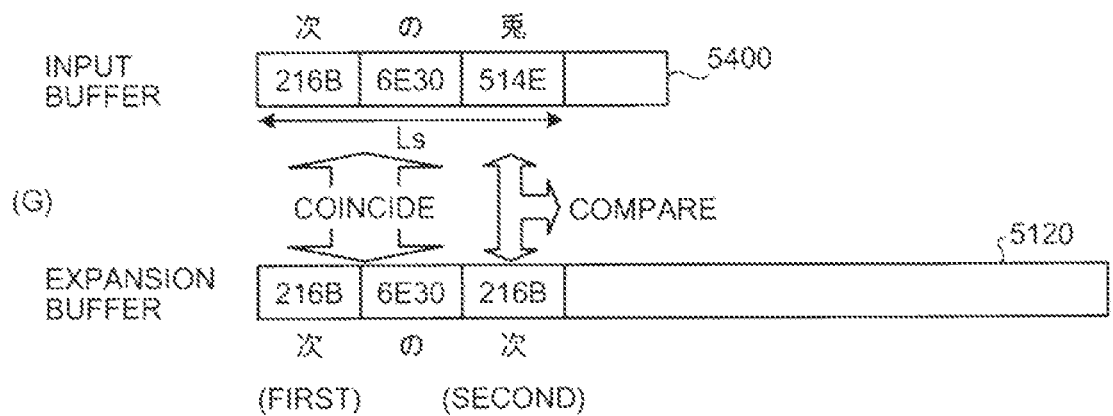
(G)
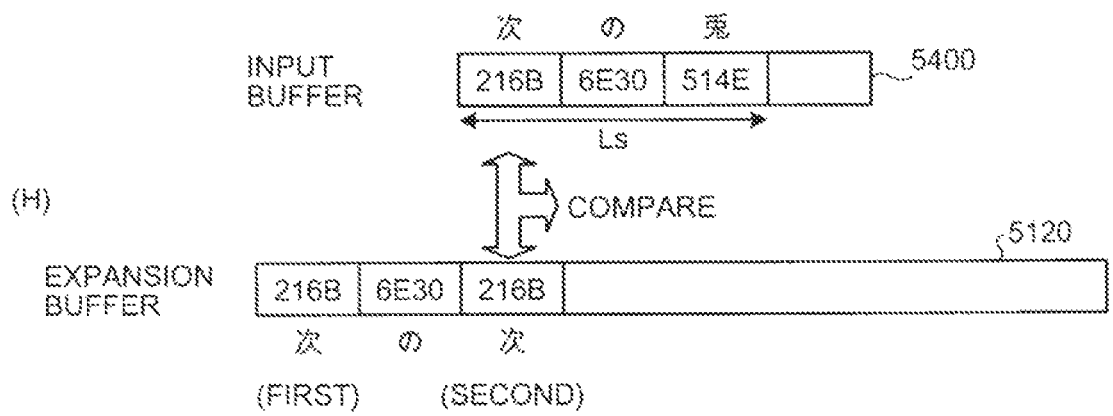
(H)

COMPUTER PRODUCT, INFORMATION PROCESSING APPARATUS, AND INFORMATION SEARCH APPARATUS

CROSS REFERENCE TO RELATED APPLICATIONS

This application is a continuation of application Ser. No. 12/913,225 filed Oct. 27, 2010, which is based upon and claims the benefit of priority of the prior Japanese Patent Application No. 2009-254794, filed on Nov. 6, 2009, the entire contents of which are incorporated herein by reference.

FIELD

The embodiments discussed herein are related to compression and expansion of information using a Huffman tree.

BACKGROUND

Conventionally, a search technique is present that includes a character component table indicating the correlation between a character and a document including the character, and a condensed text file correlating a document and condensed text generated by removing bound-form words from the document. According to the searching technique: the character component table is referred to; a document that corresponds to the character included in a search keyword is identified; and the document including the search keyword is identified from the condensed text in the condensed text file according to the execution result of the step of referring to the character component table (see, e.g., Japanese Patent No. 2986865).

A search technique is disclosed according to which: when a real-time process request is accepted, the process request from a user can be accepted assuming that the acceptance is immediately completed; and, even while an index file is being generated in a real-time process, both a search for the index file and a search for real-time process data are executed and their results are compared (see, e.g., Japanese Patent No. 3024544).

However, according to the conventional techniques, the character component table is generated using 64,000 kinds of character codes, each of which is a 16-bit character code for content configured by a huge number (for example, 10,000) of document files. On the other hand, to reduce the read speed of a document file, a huge number of document files are compressed. Even using the same document files, the compression process and the character component table generation process have nothing in common. Therefore, the compression process and the generation process must be executed separately from each other. Therefore, a problem arises that the processing time is increased.

SUMMARY

According to an aspect of an embodiment, a non-transitory, computer-readable recording medium stores therein an information processing program that causes a computer to execute storing to a storage medium, a compression symbol map group having a bit string indicating for each character code, presence or absence of the character code in a file group, and a Huffman tree whose leaf corresponding to the character code stores therein a pointer to a compression symbol map of the character code, the Huffman tree converting the character code into a compression symbol of the character code; compressing sequentially and according to the Huffman tree, a character code to be compressed that is described in a file selected from the file group; detecting access to the leaf of the Huffman tree at the compressing; identifying a compression symbol map of the character code to be compressed, among the compression symbol map group by a pointer stored in the accessed leaf; and updating a bit that indicates presence or absence of the character code to be compressed in the compression symbol map identified at the identifying the compression symbol map.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is an explanatory diagram of a process procedure to compress files.

FIG. 6 is an explanatory diagram of a character appearance frequency totaling table.

FIG. 7 is an explanatory diagram of a reserved word appearance frequency totaling table.

FIG. 8 is an explanatory diagram of a totaling result table that integrates appearance frequencies of character codes and reserved words.

FIG. 9A is an explanatory diagram of a divided-character-code appearance frequency totaling table.

FIG. 9B is an explanatory diagram of a divided-character-code appearance frequency totaling table concerning upper eight bits.

FIG. 9C is an explanatory diagram of a divided-character-code appearance frequency totaling table concerning lower eight bits.

FIG. 10 is an explanatory diagram of a calculation result table by a calculating unit 507.

FIG. 13A is an explanatory diagram of exemplary updating of a calculation result table when optimization from a fourth layer to a third layer is executed.

FIG. 13B is an explanatory diagram of exemplary updating of the calculation result table when optimization from the third layer to a second layer is executed.

FIG. 13C is an explanatory diagram of exemplary updating of the calculation result table when optimization from the second layer to a first layer is executed.

FIG. 15 is an explanatory diagram of information that is stored by the structures of leaves in the $2^n$-branching Huffman tree after the optimization.

FIG. 16 is an explanatory diagram of a reserved word structure.

FIG. 17 is an explanatory diagram of a higher-level character code structure.

FIG. 18 is an explanatory diagram of a divided character code structure.

FIG. 29 is an explanatory diagram of information stored in a structure of a leaf.

FIG. 31B is a flowchart detailing a process procedure of a pointer setting process to the compression symbol map M# (step S3110) depicted in FIG. 31A.

FIG. 32 is a block diagram of a third functional configuration of the information processing apparatus according to the embodiment.

FIG. 33A is an explanatory diagram of an example of a character code string to be compressed.

FIG. 33B is an explanatory diagram of an example of a compression symbol string.

FIG. 39A is an explanatory diagram of the initial state of a compression symbol map group.

FIG. 39B is an explanatory diagram of the compression symbol map group after updating by a compression symbol map updating unit.

FIG. 41 is an explanatory diagram of a compression pattern table having compression patterns by appearance rate area.

FIG. 42A is an explanatory diagram of the compression pattern for the B and B' areas.

FIG. 42B is an explanatory diagram of the compression pattern for C and C' areas.

FIG. 42C is an explanatory diagram of the compression pattern for D and D' areas.

FIG. 42D is an explanatory diagram of the compression pattern for E and E' areas.

FIG. 44 is an explanatory diagram of an addition of a bit string to the compressed compression symbol map group.

FIG. 45 is an explanatory diagram of a deletion map.

FIG. 52 is an explanatory diagram of exemplary identification by a compressed file identifying unit.

FIGS. 53A to 53E are explanatory diagrams of an example of an expansion process by an extracting unit, a leaf identifying unit, and an expansion code storing unit using the $2^m$-branching no-node Huffman tree.

FIGS. 54A to 54C are explanatory diagrams of an example of a comparison process.

DESCRIPTION OF EMBODIMENTS

Figure 2A:
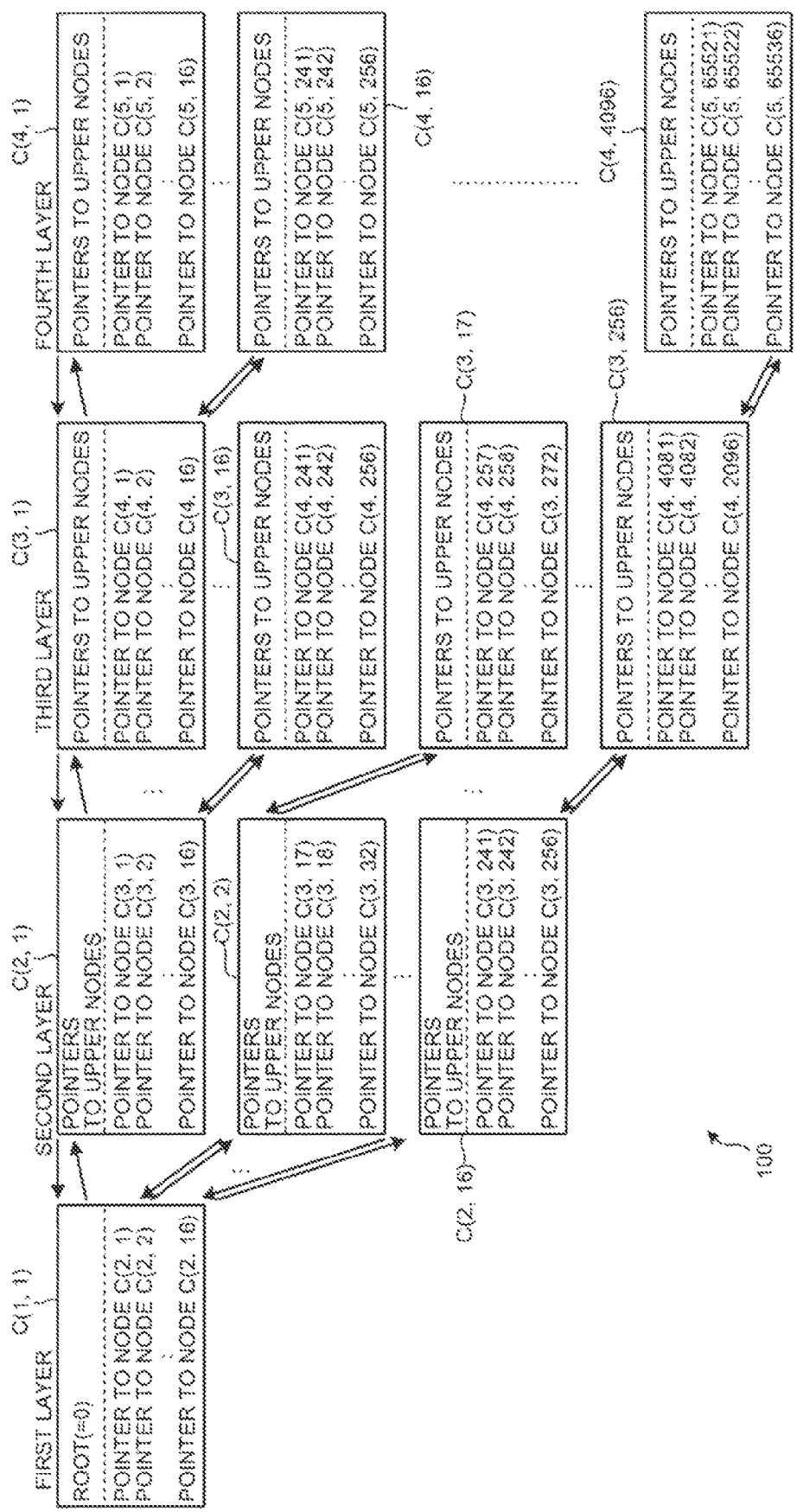
FIG. 2A is an explanatory diagram of a node aggregate that is the generation origin of the $2^n$-branching Huffman tree.

Preferred embodiments of the present invention will be explained with reference to the accompanying drawings. A $2^n$-branching Huffman tree according to the embodiment will be described.

FIG. 1 is an explanatory diagram of the flow of the process procedure to compress files. In the embodiment: (1) an information processing apparatus reads a file group Fs subject to processing and totals the appearance frequency of each character that appears in the file group Fs. The file group Fs is an electronic document having described therein several 1,000 to several 10,000 kinds of characters (i.e., character codes).

When the file group Fs includes character codes, the file group Fs may be in a text format or may be described in HyperText Markup Language (HTML) or eXtensible Markup Language (XML). For example, dictionary data such as a Japanese language dictionary, a foreign language dictionary (such as an English-Japanese dictionary or a Japanese-English dictionary), or a technical term dictionary, or webpage is applicable as the file group Fs.

"Appearance frequency" is the number of times that a character appears. For example, if the file group Fs includes three files (F1 to F3) and the number of times a character "X" appears is two in the file F1, is three in the file F2, and is zero in the file F3, the appearance frequency of the character "X" is five. The appearance frequency totaled for a character is referred to as "totaling result 10".

(2) The information processing apparatus generates a $2^n$-branching Huffman tree H1 using the totaling result 10. The $2^n$-branching Huffman tree H1 is a Huffman tree whose number of branches from a node thereof to its lower nodes is $2^n$ where "n" is a natural number and n≥2. The number of layers of nodes is k (where "k" is a natural number and k≥2). The number of nodes in the i-th layer (where "i" is a natural number and is 1≤i≤k) is $2^{n(i-1)}$. Each node stores therein pointers to upper nodes.

Each node can store therein $2^n$ leaves or $2^n$ pointers to its lower nodes. In the embodiment, because a Chinese character used in the Japanese language, etc., are each represented by a 16-bit code, when 16-bit character codes are to be compressed or expanded, the description will be made assuming that n is n=4 and k is k=4. The details of the $2^n$-branching Huffman tree H1 will be described later with reference to FIGS. 2A and 2B.

(3) The information processing apparatus converts the $2^n$-branching Huffman tree H1 into a $2^m$-branching no-node Huffman tree H2. The "no-node Huffman tree H2" is a Huffman tree that has only branches and leaves and that has no internal node. The no-node Huffman tree H2 is a Huffman tree that has an increased number of branches while each leaf thereof is accessible from its root through one path. The details of the no-node Huffman tree H2 will be described with reference to FIG. 26.

Thereafter, (4) the information processing apparatus reads the file group Fs, one file at a time and searches for compression symbols using the no-node Huffman tree. (5) The information processing apparatus compresses the file group Fs by arranging the compression symbols retrieved and filing the compression symbols. Thereby, a compressed file group fs is obtained.

(6) A compression symbol map group Ms is generated in parallel with the process of (5). The "compression symbol map group Ms" is a set of compression symbol maps M. A "compression symbol map M" is a table indicating for each character, the presence or absence of the character in the file group Fs. By using the compression symbol map group Ms, a compressed file group fs that includes the characters constituting a search keyword can be sieved out. More specifically, the compression symbol map group Ms is stored in a storage medium such as, for example, a RAM, a magnetic disk, and an optical disk and is accessible by a CPU.

More specifically, the compression symbol map group Ms is configured by a bit string indicating for each character, the number of the file(s) that the character appears in. For example, for the character X, if the value of a bit that corresponds to a file number # is "1", this indicates that the character X is present in a file F#. On the other hand, if the value of the bit that corresponds to the file number # for the character X is "0", this indicates that the character X is not present in the file F#. The details of the compression symbol map group Ms will be described later with reference to FIGS. 39A and 39B.

FIG. 2A is an explanatory diagram of a node aggregate that is the generation origin of the $2^n$-branching Huffman tree (n=4 and therefore, $2^n$=16). In a node aggregate 100 of FIG. 2A, a first layer has one node structure cell; a second layer has 16 node structure cells; a third layer has 256 node structure cells; and a fourth layer has 4,096 node structure cells. Each of the structure cells C(i, j) stores therein pointers to upper nodes that each are a link origin. The node structure cell C(1, 1) in the first layer that is the highest level is a root structure and therefore, has no pointer to any upper node.

Figure 2B:
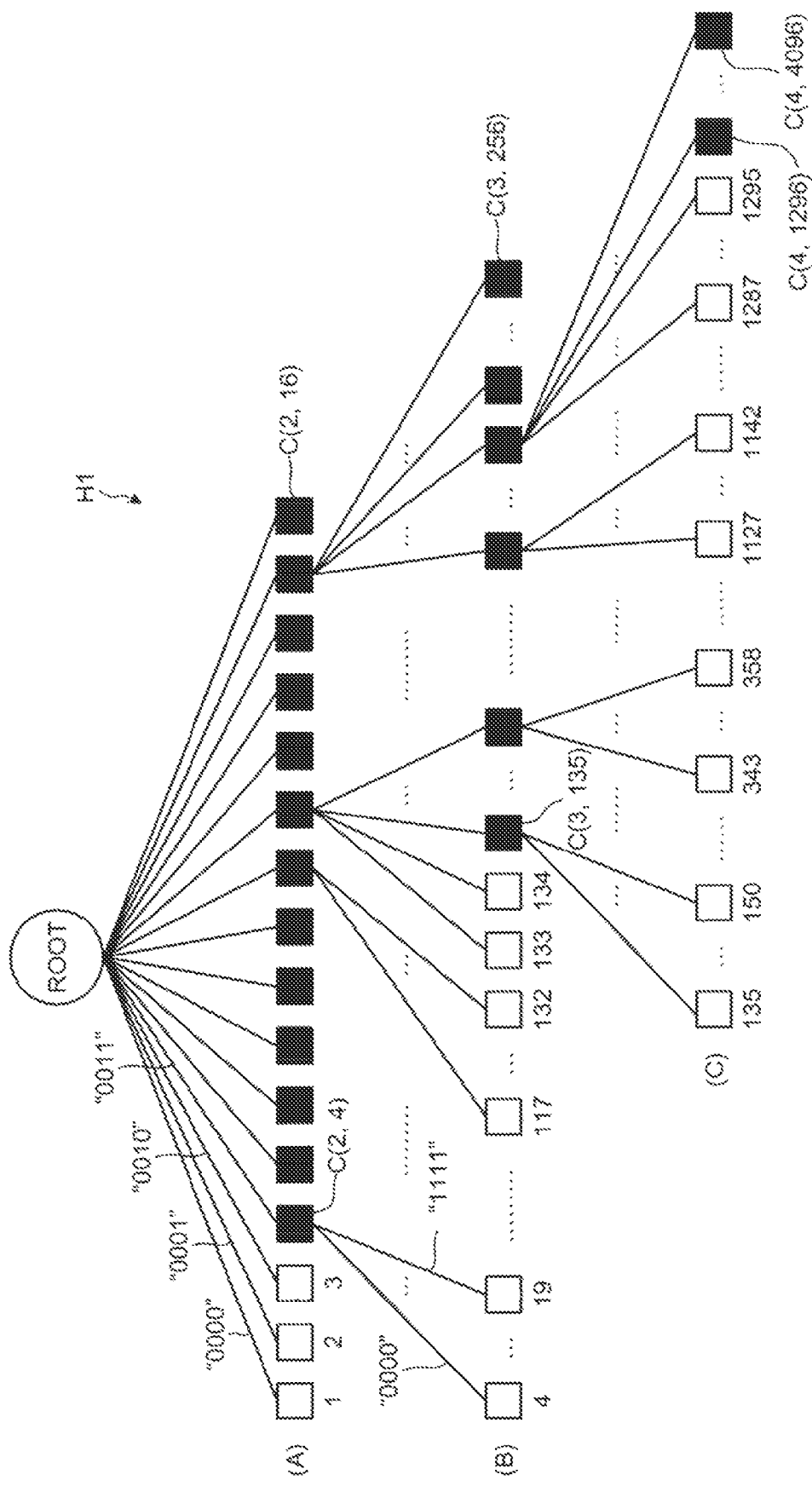
FIG. 2B is an explanatory diagram of the $2^n$-branching Huffman tree.

FIG. 2B is an explanatory diagram of the $2^n$-branching Huffman tree. In FIG. 2B, "n" is n=4, that is, this Huffman tree is a 16-branching Huffman tree. More specifically, for example, the $2^n$-branching Huffman tree is stored in a storage medium such as the RAM, the magnetic disk, and the optical disk and is accessible by the CPU.

In the $2^n$-branching Huffman tree H1, the root corresponds to the node structure cell C(1, 1) in the first layer of FIG. 2A. (A) to (C) represent nodes or leaves. In FIG. 2B, each □ represents a leaf and each ■ represents a node. Each ■ that has no branch to a lower node or leaf is an unused node. A digit immediately beneath a leaf represents its leaf number. Hereinafter, a leaf is denoted by L# (# indicates the number of a leaf).

□ in (A) are leaves L1 to L3 that are linked from the root in the first layer. ■ are nodes in the second layer that are linked from the root, and correspond to node structure cells C(2, 4) to C(2, 16). □ in (B) are leaves L4 to L134 that are linked from the nodes in the second layer. ■ are nodes in the third layer that are linked from the root, and correspond to the node structure cells C(3, 135) to C(3, 256). □ in (C) are leaves L135 to L1295 that are linked from the nodes in the third layer. ■ are nodes in the fourth layer that are linked from the root, and correspond to the node structure cells C(4, 1296) to C(4, 4096). A pre-process of the compression will be described.

Figure 3:
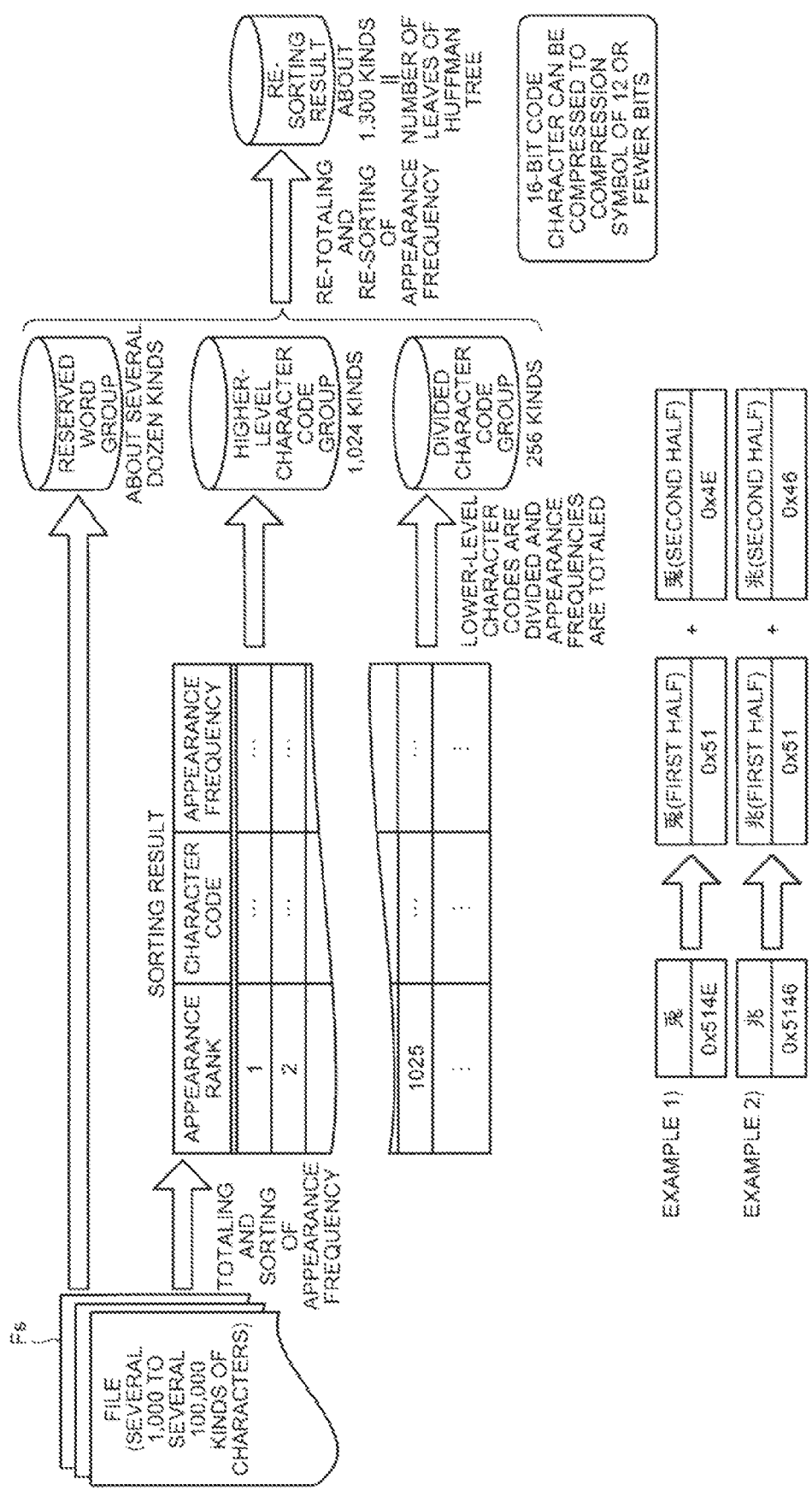
FIG. 3 is an explanatory diagram of a compression pre-process.

FIG. 3 is an explanatory diagram of the compression pre-process. The file group Fs describes therein the several 1,000 to several 10,000 kinds of characters and, in the program, the appearance frequencies of the character codes in the file group Fs are totaled and are sorted in descending order of appearance frequency. The character codes are divided into character codes at higher levels (for example, the first to a 1,024th level) and character codes at lower levels (1,025th or lower).

The appearance frequencies of the character codes at the higher levels are high and therefore, compression symbols are allocated as 16-bit codes. Each of the lower-level character codes is divided into an upper eight bits and a lower eight bits. Up to 65,536 (256×256) kinds of characters can be handled using 16-bit codes. However, by dividing each of the lower-level character codes into 8-bit sections, the 60,000 or more kinds of lower-level character codes can be suppressed to 256 kinds of divided character codes.

For example, the 16-bit character code of a Chinese character "兎" is "0x514E" and therefore, is divided into an upper eight bits "0x51" and a lower eight bits "0x4E". Similarly, the 16-bit character code of a Chinese character "兆" is "0x5146" and therefore, is divided into an upper eight bits "0x51" and a lower eight bits "0x46". The appearance frequencies of the divided 8-bit character codes are totaled. In the examples of "兎" and "兆", the appearance frequency of the divided character code "0x51" is two and the appearance frequency of each of the divided character codes "0x4E" and "0x46" is one.

A tag such as <p> or <p/> is referred to as a reserved word. Several dozen kinds of reserved words are determined in advance. A higher-level character code group, a divided character code group, and a reserved word group are mixed and from this mixture, the appearance frequencies are again totaled and sorted in descending order of appearance frequency. Thereby, about 1,300 kinds of character codes are obtained that are sorted in descending order of appearance frequency. By suppressing the number of kinds of character codes to this extent, 16-bit character codes can be compressed to compression symbols of 12 bits or fewer and the compression symbols can be expanded to 16-bit character codes.

Figure 4:
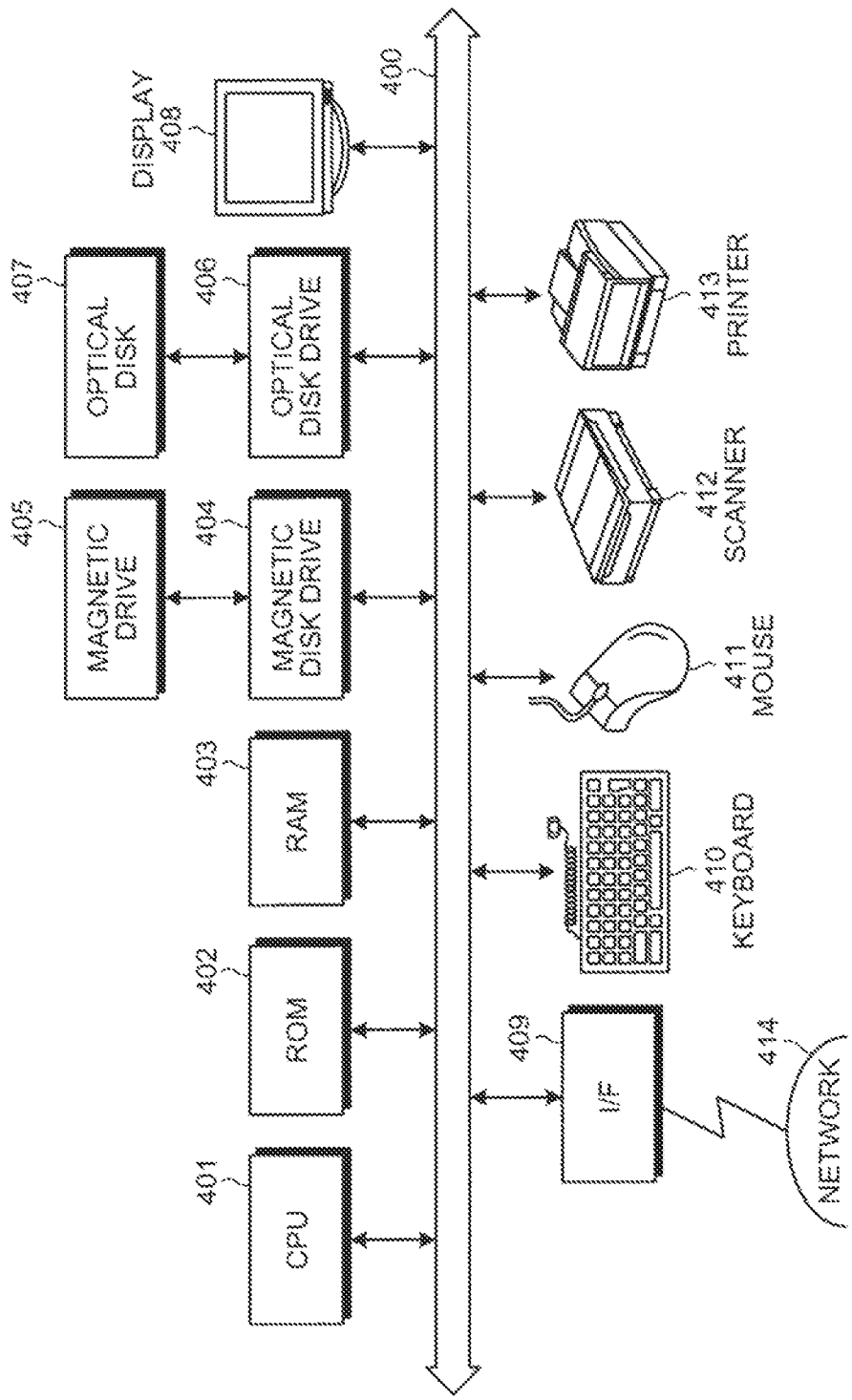
FIG. 4 is a block diagram of a hardware configuration of an information processing apparatus according to the embodiment.

FIG. 4 is a block diagram of a hardware configuration of an information processing apparatus according to the embodiments. As depicted in FIG. 4, the information processing apparatus includes a central processing unit (CPU) 401, a read-only memory (ROM) 402, a random access memory (RAM) 403, a magnetic disk drive 404, a magnetic disk 405, an optical disk drive 406, an optical disk 407, a display 408, an interface (I/F) 409, a keyboard 410, a mouse 411, a scanner 412, and a printer 413, respectively connected by a bus 400.

The CPU 401 governs overall control of the information processing apparatus. The ROM 402 stores therein programs such as a boot program. The RAM 403 is used as a work area of the CPU 401. The magnetic disk drive 404, under the control of the CPU 401, controls the reading and writing of data with respect to the magnetic disk 405. The magnetic disk 405 stores therein data written under control of the magnetic disk drive 404.

The optical disk drive 406, under the control of the CPU 401, controls the reading and writing of data with respect to the optical disk 407. The optical disk 407 stores therein data written under control of the optical disk drive 406, the data being read by a computer.

The display 408 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 408.

The I/F 409 is connected to a network 414 such as a local area network (LAN), a wide area network (WAN), and the Internet through a communication line and is connected to other apparatuses through the network 414. The I/F 409 administers an internal interface with the network 414 and controls the input/output of data from/to external apparatuses. For example, a modem or a LAN adaptor may be employed as the I/F 409.

The keyboard 410 includes, for example, keys for inputting letters, numerals, and various instructions and performs the input of data. Alternatively, a touch-panel-type input pad or numeric keypad, etc. may be adopted. The mouse 411 is used to move the cursor, select a region, or move and change the size of windows. A track ball or a joy stick may be adopted provided each respectively has a function similar to a pointing device.

The scanner 412 optically reads an image and takes in the image data into the information processing apparatus. The scanner 412 may have an optical character reader (OCR) function as well. The printer 413 prints image data and text data. The printer 413 may be, for example, a laser printer or an ink jet printer.

Figure 5:
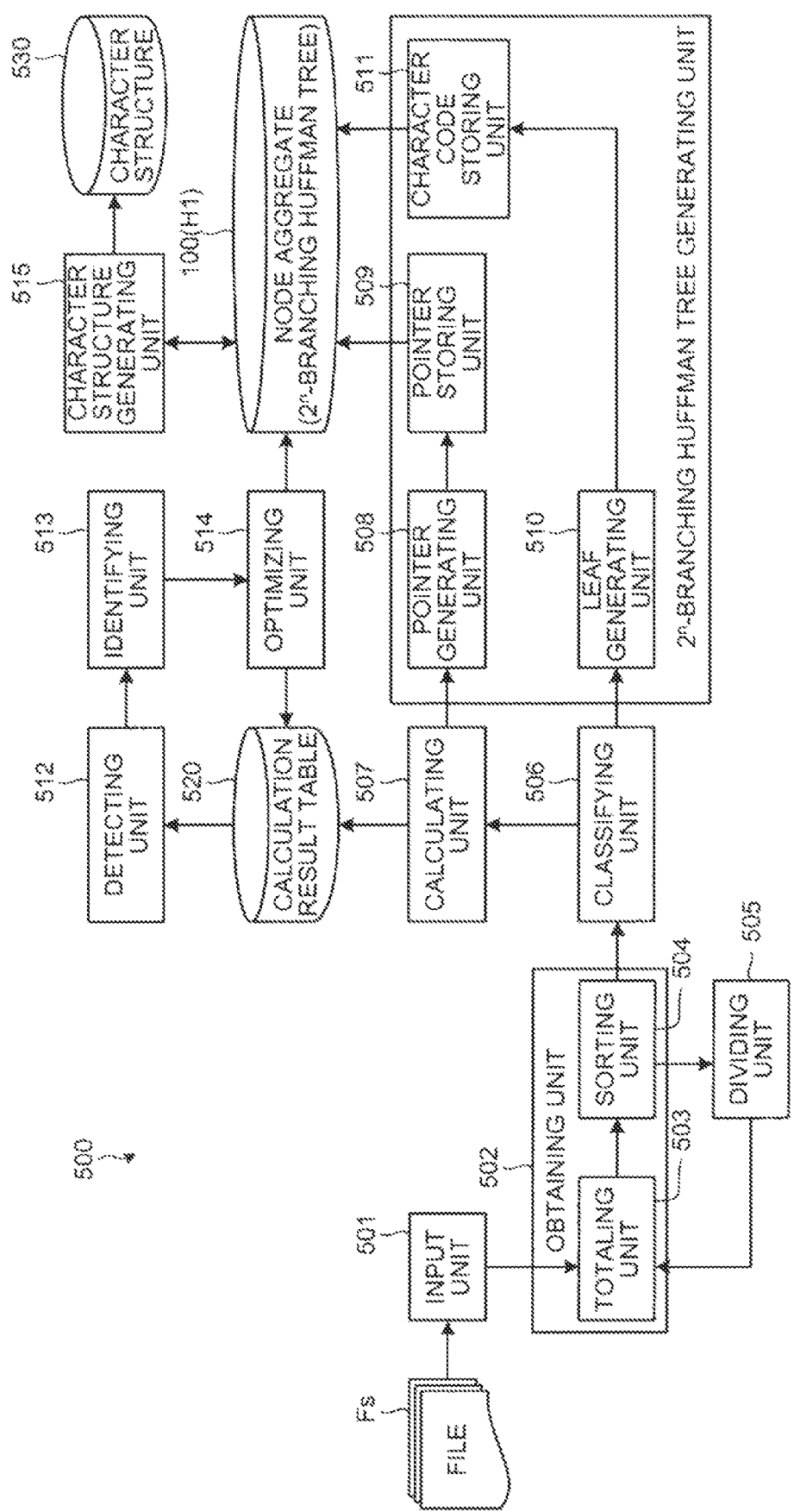
FIG. 5 is a block diagram of a first functional configuration of the information processing apparatus according to the embodiment.

FIG. 5 is a block diagram of a first functional configuration of the information processing apparatus according to the embodiment. FIG. 5 depicts the functional configuration to execute processes of (1) and (2) of the flow of processes (1) to (6) depicted in FIG. 1. In FIG. 5, the information processing apparatus 500 includes an input unit 501, an obtaining unit 502, a classifying unit 506, a calculating unit 507, a $2^n$-branching Huffman tree generating unit (a pointer generating unit 508, a pointer storing unit 509, a leaf generating unit 510, and a character code storing unit 511), a detecting unit 512, an identifying unit 513, an optimizing unit 514, and a character structure generating unit 515.

Functions of the input unit 501 to the character structure generating unit 515 are implemented by causing the CPU 401 to execute a program stored in a storage medium such as the RAM 403, the magnetic disk 405, or the optical disk 407 depicted in FIG. 4, or by using the I/F 409.

The input unit 501 has a function of inputting character codes from the file group Fs. More specifically, for example, the CPU 401 scans the file group Fs and thereby, sequentially reads the $2^n$-bit character codes from the file group Fs. The character codes read are retained in a register in the CPU 401.

The obtaining unit 502 has a function of obtaining the totaling result of the appearance frequencies of the $2^n$-bit character codes described in the file group Fs. If only the totaling result can be obtained, the totaling result itself may directly be read, or character codes set in the register by the input unit 501 may sequentially be totaled. In the latter case, the obtaining unit 502 includes, for example, a totaling unit 503 and a sorting unit 504. The totaling unit 503 totals the number of character codes set in the register. For example, the CPU 401 increments a counter value in a character appearance frequency totaling table for a character code that coincides with the character code set in the register.

FIG. 6 is an explanatory diagram of the character appearance frequency totaling table. The character appearance frequency totaling table 600 is stored in a storage medium such as the RAM 403, the magnetic disk 405, or the optical disk 407 depicted in FIG. 4 and is accessible by the CPU 401. The character appearance frequency totaling table 600 stores therein a counter value for each character. Items in the "character" column are represented by various characters for convenience of description. However, the character column is actually allocated with character codes that are compared with the input character codes. The CPU 401 scans the character items for the input character codes and thereby, detects character codes that coincide with the input character codes. If a character code that coincides with an input character code is detected, the CPU 401 increments the corresponding counter value by one point.

FIG. 7 is an explanatory diagram of a reserved word appearance frequency totaling table. The reserved word appearance frequency totaling table 700 is also stored in a storage medium such as the RAM 403, the magnetic disk 405, and the optical disk 407 depicted in FIG. 4, and is accessible by the CPU 401. The reserved word appearance frequency totaling table 700 stores therein a counter value for each reserved word. Items in the "reserved word" column are represented by various characters for convenience of description. However, the reserved word column is actually allocated with character code strings that are compared with the input character codes. Prior to the comparison with the character appearance frequency totaling table 600 depicted in FIG. 6, the CPU 401 scans the reserved word items for the input character codes and thereby, detects a reserved word that coincides with the input character code.

If an input character code coincides with a reserved word, the CPU 401 scans the reserved word items for the next input character code. This is repeated and if a character code string coincides with an input character code, the CPU 401 increments the counter value of the character code string of the reserved word by one point. If no character codes coincide with any of the input character codes, the CPU 401 accesses the character appearance frequency totaling table 600 and increments by one point, the counter value of each of the character codes of the character code strings that so far coincide with the input character codes. The character codes that do not coincide with the input character codes are totaled using the character appearance frequency totaling table 600 as above.

Referring back to FIG. 5, the sorting unit 504 has a function of sorting the totaling result. More specifically, for example, the CPU 401 sorts, in descending order of the counter value, the characters (character codes) in the character appearance frequency totaling table 600 and the reserved words in the reserved word appearance frequency totaling table 700.

FIG. 8 is an explanatory diagram of a totaling result table that integrates the appearance frequencies of the character codes and the reserved words. In the totaling result table 800, the character codes or the reserved words are sorted in descending order of appearance frequency (counter value). The totaling result table 800 is also stored in a storage medium such as the RAM 403, the magnetic disk 405, and the optical disk 407 depicted in FIG. 4, and is accessible by the CPU 401.

The obtaining unit 502 further calculates an appearance rate for each of the character codes or the reserved words, and identifies an appearance rate area that corresponds to the appearance rate. The "appearance rate" is a value obtained by using the number of all files in the file group Fs as the population (denominator) and using the number of files each having therein the character codes or the reserved words as the numerator. The "appearance rate area" is information indicating the range of the appearance rate, and identifies a Huffman tree used to compress the compression symbol map group Ms (hereinafter, "compression symbol map Huffman tree"). The appearance rate area and the compression symbol map Huffman tree will be described later (see FIGS. 42A to 42D).

The dividing unit 505 divides the result obtained by sorting by the sorting unit 504 into character codes at high levels of the appearance frequency and character codes at low levels thereof, and divides each of the lower-level character codes into an upper bit code and a lower bit code. More specifically, for example, as a result of the sorting of the characters (codes) in the character appearance frequency totaling table 600, in descending order of counter value, for example, the character codes at the first to the 1,024th levels are determined as higher-level character codes and the character codes at the 1,025th and latter levels are determined as lower-level character codes. The CPU 401 divides each of the lower-level character codes into an upper 8-bit code and a lower 8-bit code as depicted in Example 1) or Example 2) of FIG. 3.

The number of kinds of the divided character codes such as the upper 8-bit codes and the lower 8-bit codes is up to 256. Up to 60,000 or more kinds of characters are allocated to 16-bit codes and the same number of leaves is necessary. However, by dividing each of the lower-level character codes each having a low appearance frequency, the character codes that are at 1,025th and latter levels, and that are up to about 60,000 kinds can be represented by merely 256 kinds of divided character codes. Therefore, the number of leaves to be allocated to the character codes can be significantly reduced (1,024+256+several dozen kinds of reserved words). In this case, the totaling unit 503 again totals the appearance frequencies of the divided character codes. The totaling unit 503 again totals the appearance frequencies, dividing these into the appearance frequencies at which the divided character codes appear in the upper eight bits and the appearance frequencies at which the divided character codes appear in the lower eight bits.

FIG. 9A is an explanatory diagram of a divided-character-code appearance frequency totaling table. The divided-character-code appearance frequency totaling table 901 is also stored in a storage medium such as the RAM 403, the magnetic disk 405, and the optical disk 407 depicted in FIG. 4, and is accessible by the CPU 401. The sorting unit 504 integrates the 16-bit higher-level character codes, the reserved words, and the divided character codes (hereinafter, "character codes, etc."), and updates the totaling result table 800 depicted in FIG. 8.

FIG. 9B is an explanatory diagram of a divided-character-code appearance frequency totaling table concerning the upper eight bits. The divided-character-code appearance frequency totaling table 902 is also stored in a storage medium such as the RAM 403, the magnetic disk 405, and the optical disk 407 depicted in FIG. 4, and is accessible by the CPU 401. The divided-character-code appearance frequency totaling table 902 is used to generate the compression symbol map group Ms.

FIG. 9C is an explanatory diagram of a divided-character-code appearance frequency totaling table concerning the lower eight bits. The divided-character-code appearance frequency totaling table 903 is also stored in a storage medium such as the RAM 403, the magnetic disk 405, and the optical disk 407 depicted in FIG. 4, and is accessible by the CPU 401. The divided-character-code appearance frequency totaling table 903 is used to generate the compression symbol map group Ms.

The classifying unit 506 has a function of classifying the character codes, etc., by layer according to their appearance probabilities P based on the totaling result obtained by the obtaining unit 502. More specifically, for example, the classifying unit 506 refers to the character appearance frequency totaling table 600 and classifies the character codes, etc., by layer according to their appearance probabilities P.

"Appearance probability P" is a value obtained by dividing the total number of the character codes, etc., by the number of appearances of each of the character codes, etc., to be classified (the counter value in the character appearance frequency totaling table 600). The CPU 401 calculates the appearance probability P for each of the character codes, etc., and classifies the calculated appearance probabilities P by layer. For example, in the i-th layer, the character codes for which $1/2^{ni} \leq P < 1/2^{n(i-1)}$ are grouped. However, character codes for which $1/2^{ni} \leq P < 1$ are grouped in the first layer (i=1), and character codes for which $P < 1/2^{n(i-1)}$ are grouped in the nth layer (i=n).

For example, when n is n=4, the character codes, etc., in the first layer are character codes whose appearance probabilities P are $1/16 \leq P < 1$. The character codes, etc., in the second layer are character codes whose appearance probabilities P are $1/32 P < 1/16$. The character codes, etc., in the third layer are character codes whose appearance probabilities P are $1/4,096 P \leq 1/32$. The character codes, etc., in the fourth layer are character codes whose P are $P < 1/4,096$. The layer number i and the rank in the totaling result table 800 that are the classification results are given to each of the character codes, etc. The rank in the totaling result table 800 is the leaf number of each of the character codes, etc.

The calculating unit 507 has a function of calculating the number of pointers to leaves in the i-th layer, based on the number of character codes in the i-th layer classified by the classifying unit 506. The calculating unit 507 has a function of calculating based on the number of pointers to the leaves in the i-th layer, the number of used nodes in the i-th layer and the number of pointers to lower-level nodes in the i-th layer, the lower-level node having nodes in the (l+1) layer as a link destination.

More specifically, for example, from the node aggregate 100 and the classification result, the CPU 401 calculates, for the i-th layer, the number of structure cells N(i), the number of leaves Nl(i), the number of pointers to leaves Nlp(i), the number of pointers to lower nodes Nnp(i), the number of used structure cells Ncu(i), an accumulated value of the numbers of pointers to leaves ΣNlp(i), the number of blank cells from the head Ncst(i), the number of blank pointers to the tail Npse(i), and the number of blank cells to the tail Ncse(i).

FIG. 10 is an explanatory diagram of a calculation result table by the calculating unit 507. The calculation result table 520 is also stored in a storage medium such as the RAM 403, the magnetic disk 405, and the optical disk 407 depicted in FIG. 4, and is accessible by the CPU 401. Values of the items calculated for each layer are written into the calculation result table 520 by the CPU 401. FIG. 10 depicts the calculation result for n=4.

The number of structure cells N(i) is the number of node structure cells C(i, j) in the i-th layer. The number of structure cells N(i) is obtained by counting the number of the node structure cells C(i, j) in each of the layers of the node aggregate 100 by the CPU 401. When n is n=4, the number of structure cells N(i) is one (root) in the first layer, is 16 in the second layer, is 256 in the third layer, and is 4,096 in the fourth layer.

The number of leaves Nl(i) is the number of leaf structures in the i-th layer. The number of leaves Nl(i) is the number of character codes in each of the layers that is the classification result. In the example of FIG. 10, the number of leaves Nl(i) is three in the first layer, is 54 in the second layer, is 353 in the third layer, and is 885 in the fourth layer.

The number of pointers to leaves Nlp(i) is the total number of pointers to leaves, that are stored in the node structure cell C(i, j) in the i-th layer. The number of pointers to leaves Nlp(i) is equal to the number of leaves Nl(i).

The number of pointers to lower-level nodes Nnp(i) is the total number of pointers to lower nodes, that are stored in the node structure cell C(i, j) in the i-th layer. The number of pointers to lower nodes Nnp(i) is dependent on the number of pointers to leaves in the (i+1)th layer Nlp(i+1) and the number of pointers to lower nodes Nnp(i+1). For example, the CPU 401 calculates the number of pointers to lower nodes according to Equation (1).

$$Nnp(i)=\{Nlp(i+1)+Nnp(i+1)\}/2^n+1 \qquad (1)$$

Where, fractions are rounded off. When i is i=n, no lower node is present and therefore, Nnp(i) is Nnp(i)=0.

The number of used structure cells Ncu(i) is the total number of structure cells C(i, j) storing therein pointers to leaves and pointers to the lower nodes, of the structure cells C(i, j) in the i-th layer. For example, the CPU 401 calculates the number of used structure cells Ncu(i) according to Equation (2).

$$Ncu(i)=\{Nlp(i)+Nnp(i)\}/2^n+1 \qquad (2)$$

Where, fractions are rounded off.

The accumulated value of the numbers of pointers to leaves ΣNlp(i) is the total sum of the numbers of pointers to leaves Nlp(i) from the first layer to the i-th layer.

The number of blank cells from the head Ncst(i) is the number of unused cells from the structure cell C(i, j) that is the head in the i-th layer. Originally, each of the structure cells C(i, j) that constitute the node aggregate 100 stores therein the pointers to their upper nodes. However, when the structure cell C(i–1, j) of the upper node is linked to a structure of the leaf Lj, the structure of the leaf Lj stores therein pointers to the same upper nodes as those of the structure cell C(i, j).

Because the pointers overlap as described, the number of blank cells from the head Ncst(i) is calculated to prioritize the pointers to the upper nodes, that are stored in the structure of the leaf Lj. More specifically, for example, the CPU 401 calculates the number of blank cells from the head Ncst(i) according to Equation (3).

$$Ncst(i)=\Sigma Nlp(i-1) \qquad (3)$$

Where, when i is i=1, Ncst(i) is Ncst(i)=0.

Therefore, in the example of FIG. 10, in the second layer, the structure cells C(2, 1) to C(2, 3) are blank cells (unused cells) from the head. In the third layer, the structure cells C(3, 1) to C(3, 57) are blank cells (unused cells) from the head. Similarly, in the fourth layer, the structure cells C(4, 1) to C(4, 410) are blank cells (unused cells) from the head.

The number of blank pointers to the tail Npse(i) is the total number of blank pointers obtained when, in the i-th layer, pointers from the next structure cell C(i, j) to the blank cells from the head to leaves and pointers therefrom to the lower nodes are stored. Blank pointers of the blank cells from the head are excluded. More specifically, for example, the CPU 401 calculates the number of blank pointers to the tail Npse(i) according to Equation (4).

$$Npse(i)=N(i)\times 2^n-Nlp(i)-Nnp(i)-Ncst(i)\times 2^n \qquad (4)$$

The number of blank cells to the tail Ncse(i) is the number of structure cells C(i, j) that are left after removing the blank cells from the head and the structure cells C(i, j) storing therein the pointers to the leaves and the pointers to the lower nodes, from the structure cell group in the i-th layer. More specifically, for example, the CPU 401 calculates the number of blank cells to the tail Ncse(i) according to Equation (5).

$$Ncse(i)=N(i)-Ncu(i)-Ncst(i) \qquad (5)$$

The pointer generating unit 508 has a function of generating a pointer to a leaf in the i-th layer and a pointer to a lower node in the i-th layer, based on the calculation result calculated by the calculating unit 507. More specifically, for example, the CPU 401 accesses the calculation result table 520 and obtains the number of pointers to the leaves in the i-th layer and the number of pointers to the lower nodes.

The number of branches from a node is $2^n$ in the 2'-branching Huffman tree H1 and therefore, when n is n=4, the pointer to a lower node that is the branch number is a four-bit code. For example, in the root C(1, 1) in the first layer, the pointer to the leaf L1 is "0000"; the pointer to the leaf L2 is "0001"; the pointer to the leaf L3 is "0010"; the pointer to the lower node C(2, 4) is "0011"; the pointer to the lower node C(2, 5) is "0100"; . . . ; and the pointer to the lower node C(2, 8) is "0111". The pointers generated are temporarily retained in a storage medium such as the RAM 403, the magnetic disk 405, and the optical disk 407 depicted in FIG. 4.

The pointer storing unit 509 has a function of storing to nodes of a number to be used in the i-th layer, the pointers to the leaves in the i-th layer and the pointers to the lower nodes in the i-th layer, that are generated by the pointer generating unit 508. More specifically, for example, among the structure cells C(i, j) in the i-th layer, the CPU 401 identifies a structure cell at the head, capable of storing therein pointers.

More specifically, for example, the CPU 401 accesses the calculation result table 520, obtains the number of blank cells from the head Ncst(i), and determines the structure cell C(i, j) at the head, capable of storing therein the pointers as the structure cell C(i, Ncst(i)+1). The CPU 401 first stores the pointers to the leaves in order of leaf number in this structure cell C(i, Ncst(i)+1) and the structure cells after this, and also stores therein, the pointers to the lower nodes. The total number of the structure cells storing therein the pointers to the leaves and pointers to the lower nodes coincides with the number of used structure cells Ncu(i) in the calculation result table 520.

The leaf generating unit 510 has a function of generating for each character code, leaves of the nodes in the i-th layer using the pointers to the leaves, stored in the nodes in the i-th layer by the pointer storing unit 509 for each character in the i-th layer classified by the classifying unit 506. More specifically, for example, for each of the layers, the leaf generating unit 510 generates structures of the leaves L# for the number of the number of the leaves Nl(i). The structures of the leaf L# is stored in a storage medium such as the RAM 403, the magnetic disk 405, and the optical disk 407 depicted in FIG. 4.

Figure 11:
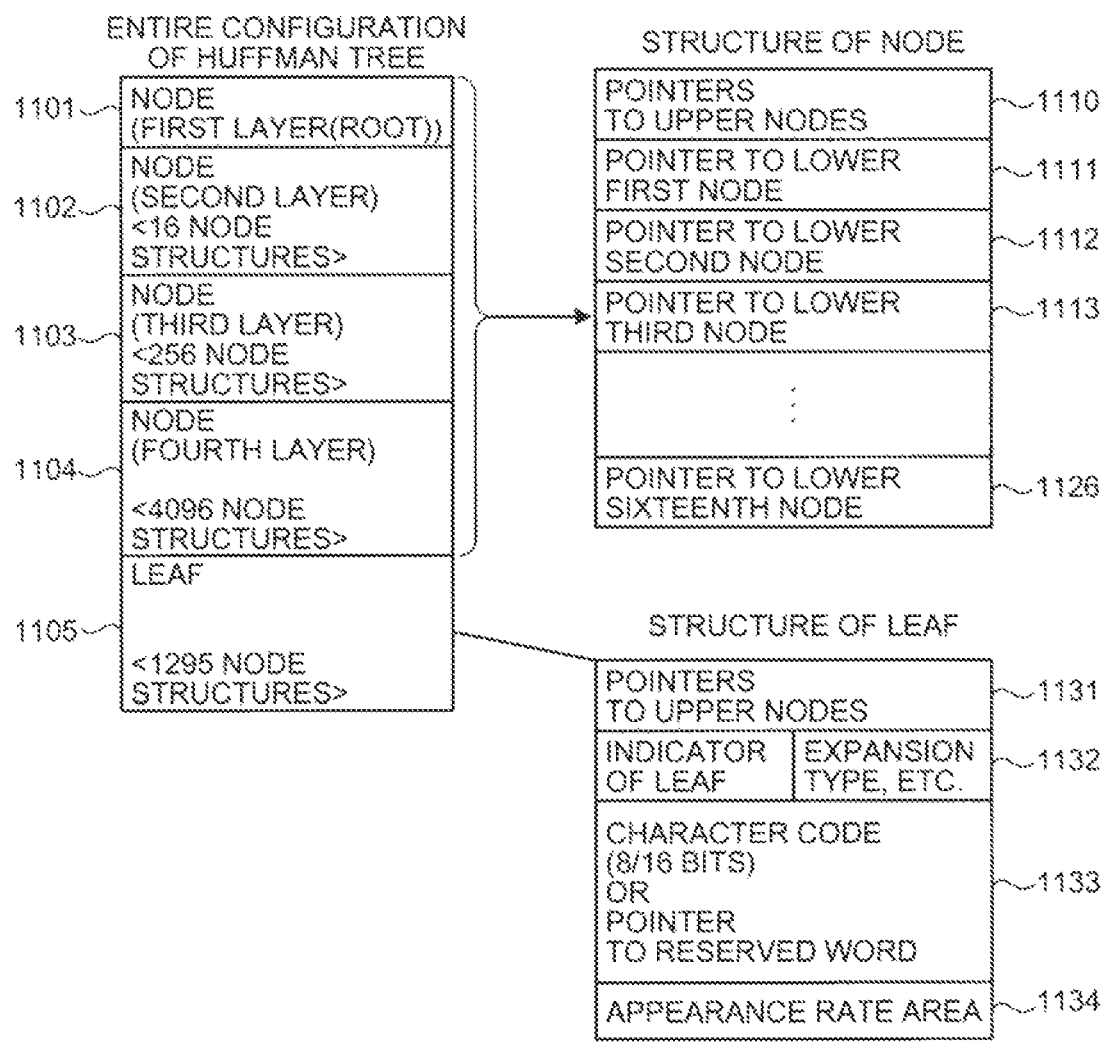
FIG. 11 is an explanatory diagram of structures of a $2^n$-branching Huffman tree.

FIG. 11 is an explanatory diagram of the structures of a $2^n$ (16)-branching Huffman tree. In the case of 16 branches for n that is n=4, the Huffman tree is configured by one node (root) structure 1101 in the first layer, 16 node structures 1102 in the second layer, 256 node structures 1103 in the third layer, 4,096 node structures 1104 in the fourth layer, and 1,295 leaf L# structures 1105.

The node structure is configured by 17 kinds of pointers that are a pointer 1110 to an upper node and pointers 1111 to 1126 to lower first to lower 16th nodes. The leaf L# structure has first to fourth areas 1131 to 1134. The first area 1131 stores therein the pointers to the upper nodes. More specifically, for example, when a pointer of an j-th node structure in the i-th layer to a lower 12th node points a first leaf L# structure, the first area 1131 stores therein a head address (pointer) to the j-th node structure in the i-th layer.

The second area 1132 stores therein an indicator and an expansion type of a leaf. The indicator of a leaf is a flag to be referred to for compression or expansion. When the indicator indicates "0" (indicating "OFF"), this means an ordinary node. When the indicator indicates "1" (indicating "ON"), this means a leaf. The expansion type is an identifier indicating whether the appearance frequency of the object to be expanded is: a higher-level 16-bit character code, an upper 8-bit divided character code divided from a lower-level character code, a lower 8-bit divided character code divided from a lower-level character code, or a reserved word. The third area 1133 stores therein pointers to a higher-level 16-bit character code, an 8-bit divided code, or a reserved word, depending on the expansion type. The fourth area 1134 stores therein the appearance rate area depicted in FIG. 8.

The character code storing unit 511 has a function of generating the $2^n$-branching Huffman tree H1 by storing a character code that is correlated with the leaf number of the leaf, in a leaf generated by the leaf generating unit 510. More specifically, for example, the character code storing unit 511 stores the character code in the third area 1133, which is the structure of the leaf L# storing therein the number # of the leaf L#. The number # of the leaf L# coincides with the rank (see FIG. 8) of the appearance frequency of the character code. For a reserved word, the pointer to the reserved word is stored. Character code string of the reserved word may be stored depending on the size of the third area 1133. Concurrently with the storage of the character codes, the character code storing unit 511 also reads the appearance rate area of the character codes to be stored from the totaling result table 800 and stores the appearance rate area in the fourth area 1134.

As described, the structure of the leaf L# generated by the leaf generating unit 510 is linked to the corresponding node structure cell C(i, j) of the node aggregate 100 depicted in FIG. 1; the pointer storing unit 509 stores therein the pointer to the leaf L# in the structure cell C(i, j) of the node aggregate 100; the character code storing unit 511 stores therein the pointers to the character codes and the reserved words in the structure of the leaf L#; and thereby, the $2^n$-branching Huffman tree H1 is generated from the node aggregate 100.

Figure 12:
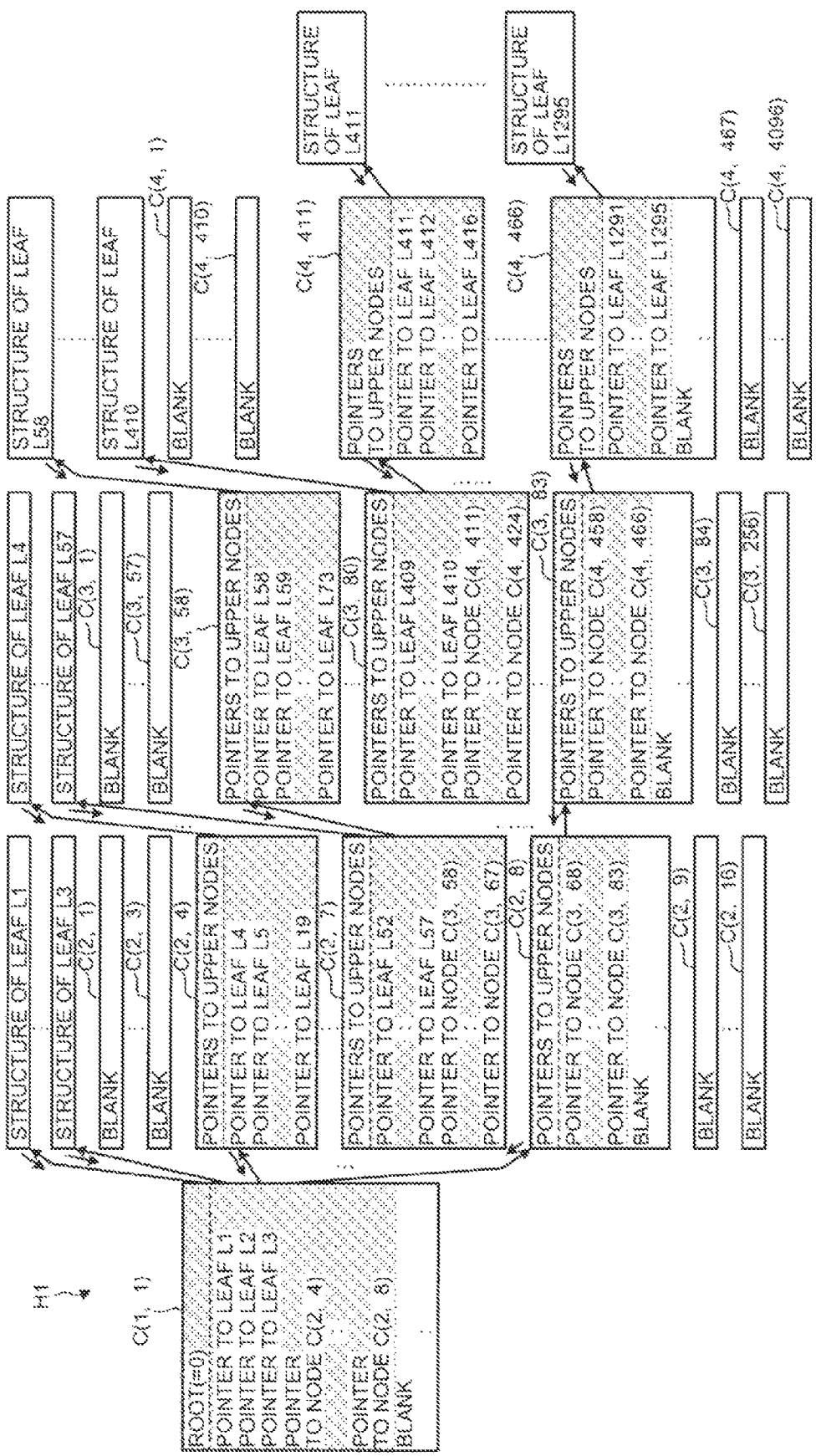
FIG. 12 is an explanatory diagram of the structures of the $2^n$-branching Huffman tree.

FIG. 12 is an explanatory diagram of the structures of the $2^n$-branching Huffman tree H1. The $2^n$-branching Huffman tree H1 is stored in a storage medium such as the RAM 403, the magnetic disk 405, and the optical disk 407 depicted in FIG. 4. FIG. 12 depicts the case for n=4, that is, a 16-branching Huffman tree.

The detecting unit 512 has a function of detecting the number of pointers to the leaves in the i-th layer and the number of blank pointers in the blank nodes in the (i−1)th layer. More specifically, for example, the CPU 401 reads the number of pointers to leaves in the i-th layer Nlp(i) and the number of blank pointers to the tail in the (i−1)th layer Npse(i−1) from the calculation result table 520.

The identifying unit 513 has a function of identifying a pointer to the leaf L# in the i-th layer that is to be moved from a blank node in the i-th layer to that in the (i−1)th layer (hereinafter, "pointer to be moved") based on the number of pointers to the leaves in the i-th layer and the number of blank pointers in the blank nodes in the (i−1)th layer detected by the detecting unit 512. More specifically, for example, the CPU 401 determines according to Equation (6) using the number of pointers to the leaves in the i-th layer Nlp(i), the number of blank pointers to the tail in the (i−1)th layer Npse(i−1), and the number of pointers to the lower nodes in the (i−1)th layer Nnp(i−1) that are read.

$$Npse(i-1)+Nnp(i-1)>Nlp(i) \qquad (6)$$

If Equation (6) is satisfied, all the pointers to the leaves L# in the i-th layer are movable to the (i+1)th layer. If Equation (6) is not satisfied, the same number of pointers to the leaves in the i-th layer as the number of blank pointers to the tail in the (i−1)th layer Npse(i−1) are determined as the pointers to be moved. For example, if the $2^n$-branching Huffman tree H1 of FIG. 11 is optimized, referring to the calculation result table 520, for i that is i=4, the number of pointers to the leaves in the fourth layer Nlp(4) is Nlp(4)=885, the number of blank pointers to the tail in the third layer Npse(3) is Npse(3)=2, 775, and the number of pointers to the lower nodes in the third layer Nnp(3) is Nnp(3)=56. Therefore, Equation (6) is satisfied. Therefore, all the pointers to the leaves L411 to L1,295 in the fourth layer are movable into the blank cells in the third layer.

The optimizing unit 514 has a function of deleting from the nodes in the (i−1)th layer the pointers to the node storing therein the pointers to be moved that are identified by the identifying unit 513, and moving the pointers to be moved to the nodes in the (i−1)th layer. More specifically, for example, in the above example, the optimizing unit 514 deletes from the third layer the pointers to nodes C(4, 411) to C(4, 466) storing therein the pointers to be moved (the pointers to the leaf L411 to the pointers to the leaf L1,295 in the fourth layer), and sequentially moves the pointers to be moved from the structure cell C(3, 80) in the third layer. The structures of the leaves L411 to L1,295 are promoted from the fourth layer to the third layer.

Thus, though the compression symbol length is 16 bits for the fourth layer, the compression symbol length is reduced to 12 bits by being promoted to the third layer. Therefore, improvement of the compression rate can be facilitated. As above, by being promoted from the i-th layer to the (i−1)th layer, the compression symbol length is reduced from n×i bits to n×(i−1) bits. Therefore, improvement of the compression rate can be facilitated.

The optimizing unit 514 updates the calculation result table 520 each time the optimization is executed. FIGS. 13A to 13C depict exemplary updating of the calculation result table 520 when the optimization is executed. As described, the optimization is executed from the lowest layer.

FIG. 13A is an explanatory diagram of exemplary updating of the calculation result table 520 when optimization from the fourth layer to the third layer is executed. FIG. 13A depicts the exemplary updating from the state depicted in FIG. 10.

FIG. 13B is an explanatory diagram of exemplary updating of the calculation result table 520 when optimization from the third layer to the second layer is executed. FIG. 13B depicts the exemplary updating from the state depicted in FIG. 13A.

FIG. 13C is an explanatory diagram of exemplary updating of the calculation result table 520 when optimization from the second layer to the first layer is executed. FIG. 13C depicts the exemplary updating from the state depicted in FIG. 13B.

Figure 14:
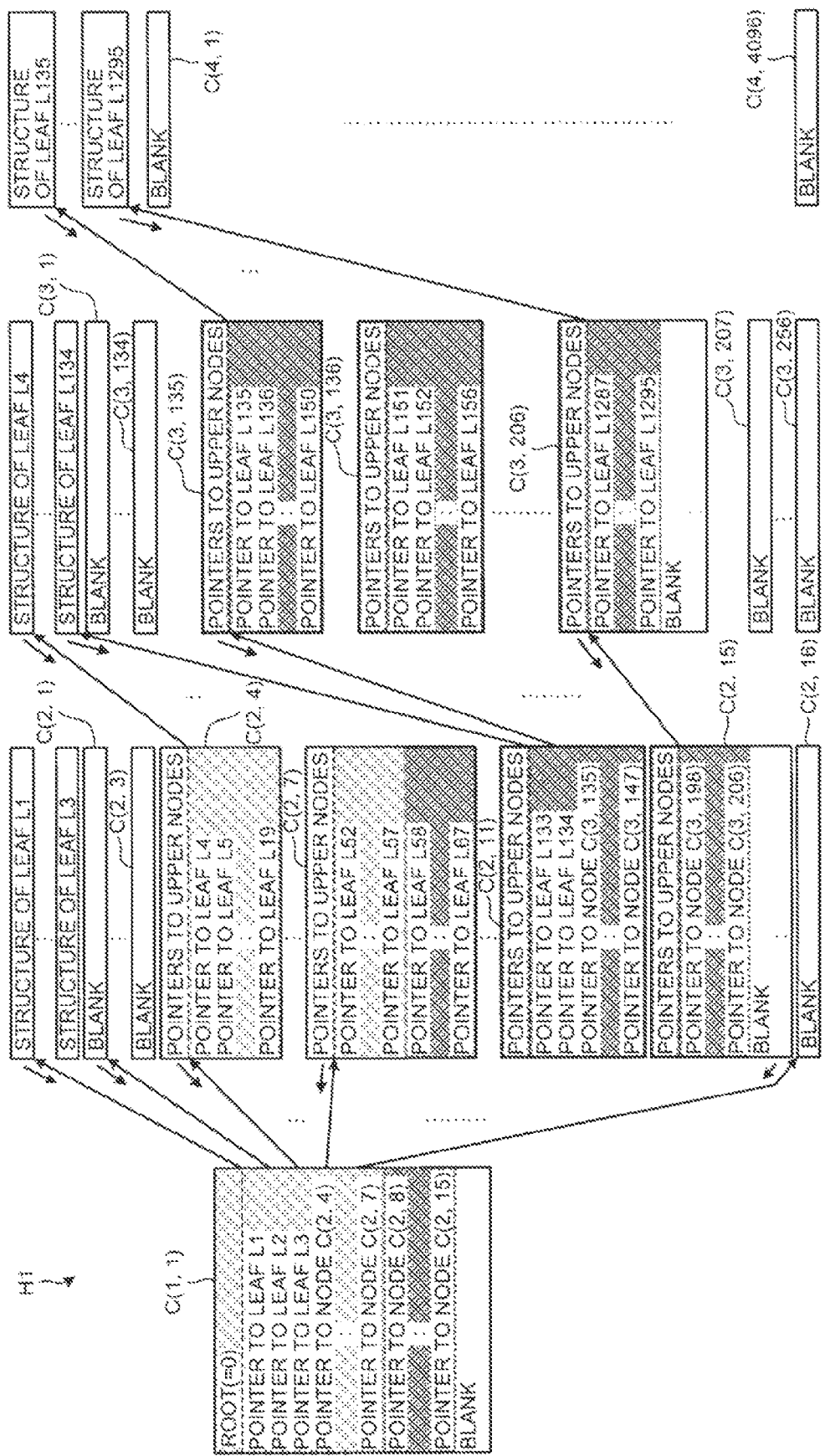
FIG. 14 is an explanatory diagram of the structures of the $2^n$-branching Huffman tree after the optimization.

FIG. 14 is an explanatory diagram of the structures of the $2^n$-branching Huffman tree H1 after the optimization. Compared to FIG. 12, in the $2^n$-branching Huffman tree H1 after the optimization, the structures of the leaves L# in the fourth layer are not present. As above, the pointers to the leaves L# in the lower layer are moved to the blank pointers in the upper layer and therefore, shortening of the compression symbols can be facilitated.

FIG. 15 is an explanatory diagram of information that is stored by the structures of the leaves L# in the $2^n$-branching Huffman tree H1 after the optimization. Each record of FIG. 15 corresponds to the information stored by each of the structures of the leaves L#. The compression symbol is a code string of the pointer to the lower node to the pointer to the leaf that is the branch number from the root to the corresponding leaf L# of the $2^n$-branching Huffman tree H1.

Referring back to FIG. 5, the character structure generating unit 515 has a function of generating a character structure 530. More specifically, for example, the CPU 401 accesses the reserved word appearance frequency totaling table 700, the character appearance frequency totaling table 600, the divided-character-code appearance frequency totaling table 900, and the $2^n$-branching Huffman tree H1 and extracts designated information and thereby, generates a reserved word structure, a higher-level character code structure, and a divided upper character code structure.

FIG. 16 is an explanatory diagram of the reserved word structure. The reserved word structure 1600 is stored in a storage medium such as the RAM 403, the magnetic disk 405, and the optical disk 407 and is accessible by the CPU 401. The reserved word structure 1600 stores therein the total number of reserved words (15 in the example of FIG. 16), the longest bit length of the reserved words Lrmax, the reserved words r1 to r15 and the respective bit lengths, and the pointers to the leaves L#.

The CPU 401 reads the total number of reserved words, the reserved words, the longest bit length of the reserved words, and the bit lengths of the reserved words from the reserved word appearance frequency totaling table 700. The CPU 401 identifies the upper nodes from the structures of the leaves L# of the reserved words in the $2^n$-branching Huffman tree H1, and reads the pointers to the leaves L# of the reserved words in the structure cells of the upper nodes. Thereby, the reserved word structure 1600 is generated.

FIG. 17 is an explanatory diagram of the higher-level character code structure. The higher-level character code structure 1700 is stored in a storage medium such as the RAM 403, the magnetic disk 405, and the optical disk 407 depicted in FIG. 4, and is accessible by the CPU 401. The higher-level character code structure 1700 stores therein character codes e# and the pointers to their leaves L#.

The CPU 401 reads the character codes e# from the character appearance frequency totaling table 600, identifies the upper nodes from the structures of the leaves L# that correspond to the character codes e# in the $2^n$-branching Huffman tree H1, and reads the pointers to the leaves L# that corresponds to the character codes e# in the structure cells of the upper nodes. Thereby, the higher-level character code structure 1700 is generated.

FIG. 18 is an explanatory diagram of the divided character code structure. The divided character code structure 1800 is stored in a storage medium such as the RAM 403, the magnetic disk 405, and the optical disk 407 depicted in FIG. 4, and is accessible by the CPU 401. The divided character code structure 1800 stores therein character codes e# and the pointers to their leaves L#.

The CPU 401 reads the character codes from the divided-character-code appearance frequency totaling table 900, identifies the upper nodes from the structures of the leaves L# that correspond to the character codes in the $2^n$-branching Huffman tree H1, and reads the pointers to the leaves L# that corresponds to the character codes in the structure cells of the upper nodes. Thereby, the divided character code structure 1800 is generated.

Figure 19:
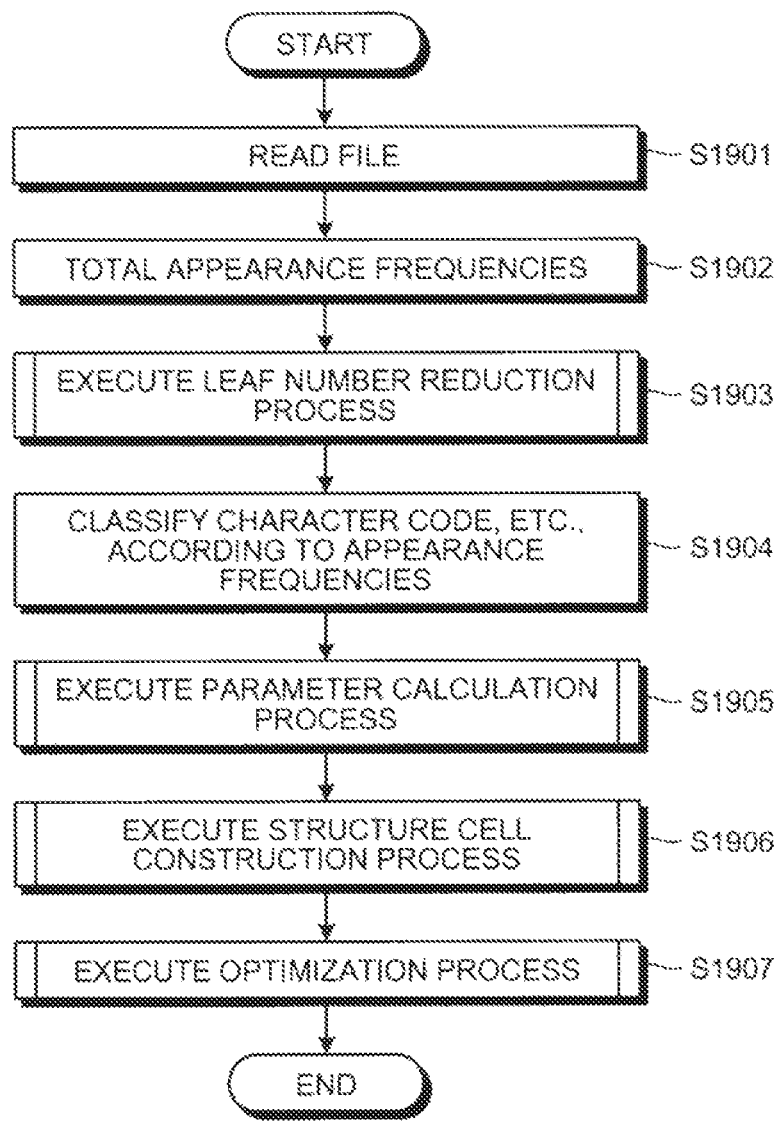
FIG. 19 is a flowchart of a $2^n$-branching Huffman tree generation process automatically executed by the information processing apparatus.

FIG. 19 is a flowchart of the procedure of the $2^n$-branching Huffman tree generation process automatically executed by the information processing apparatus 500. In FIG. 19, the input unit 501 reads the file group Fs (step S1901). The totaling unit 503 totals the appearance frequencies of the character codes and the reserved words (step S1902). A leaf number reduction process is executed (step S1903). The classifying unit 506 classifies the character codes, etc., by layer according to their appearance probabilities P (step S1904).

Thereafter, a parameter calculation process (step S1905) by the calculating unit 507, and a structure cell construction process (step S1906) and an optimization process (step S1907) by the pointer generating unit 508, the pointer storing unit 509, the leaf generating unit 510, and the character code storing unit 511 are executed. Thereby, the $2^n$-branching Huffman tree H1 is automatically generated.

Figure 20:
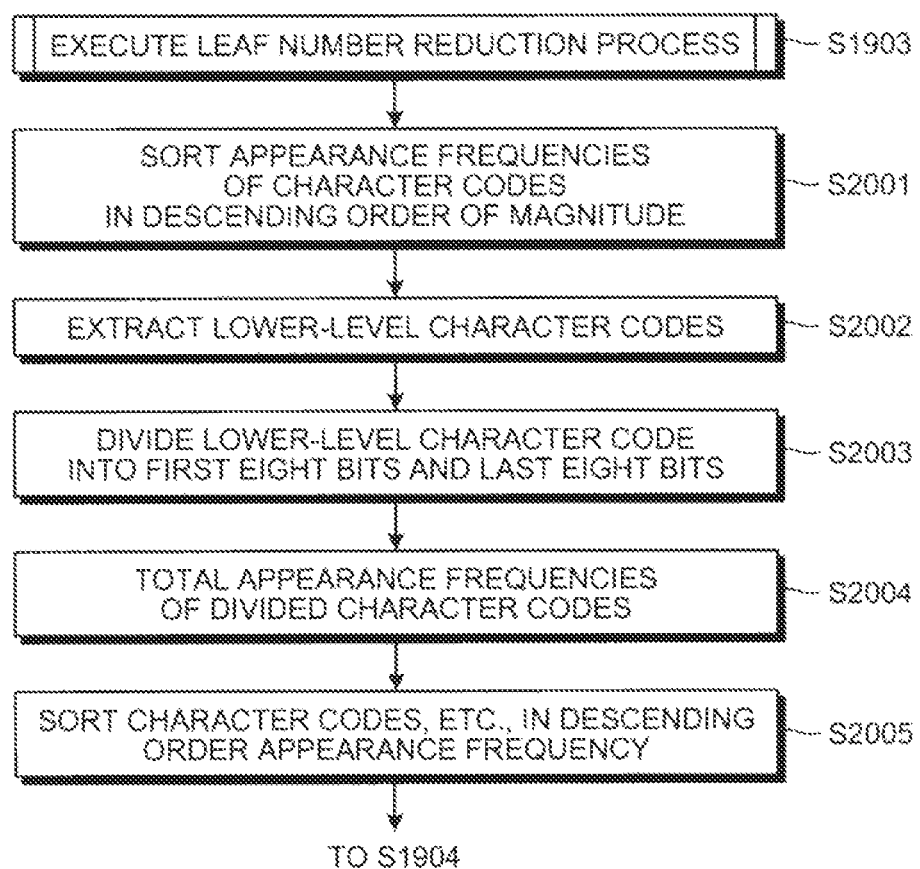
FIG. 20 is a flowchart detailing a process procedure of a leaf number reduction process (step S1903) depicted in FIG. 19.

FIG. 20 is a flowchart detailing the process procedure of the leaf number reduction process (step S1903) depicted in FIG. 19. The sorting unit 504 first sorts the 16-bit character codes and the reserved words in descending order of appearance frequency (step S2001), refers to the ranks thereof, extracts the lower-level character codes (step S2002), divides the lower-level character codes into respective first half and second half 8-bit divided character codes (step S2003), totals the appearance frequencies of the divided character codes (step S2004), and finally sorts the appearance frequencies of all the 16-bit character codes, the divided character codes, and the reserved words in descending order of appearance frequency (step S2005). Thereafter, the procedure moves to step S1904.

Figure 21:
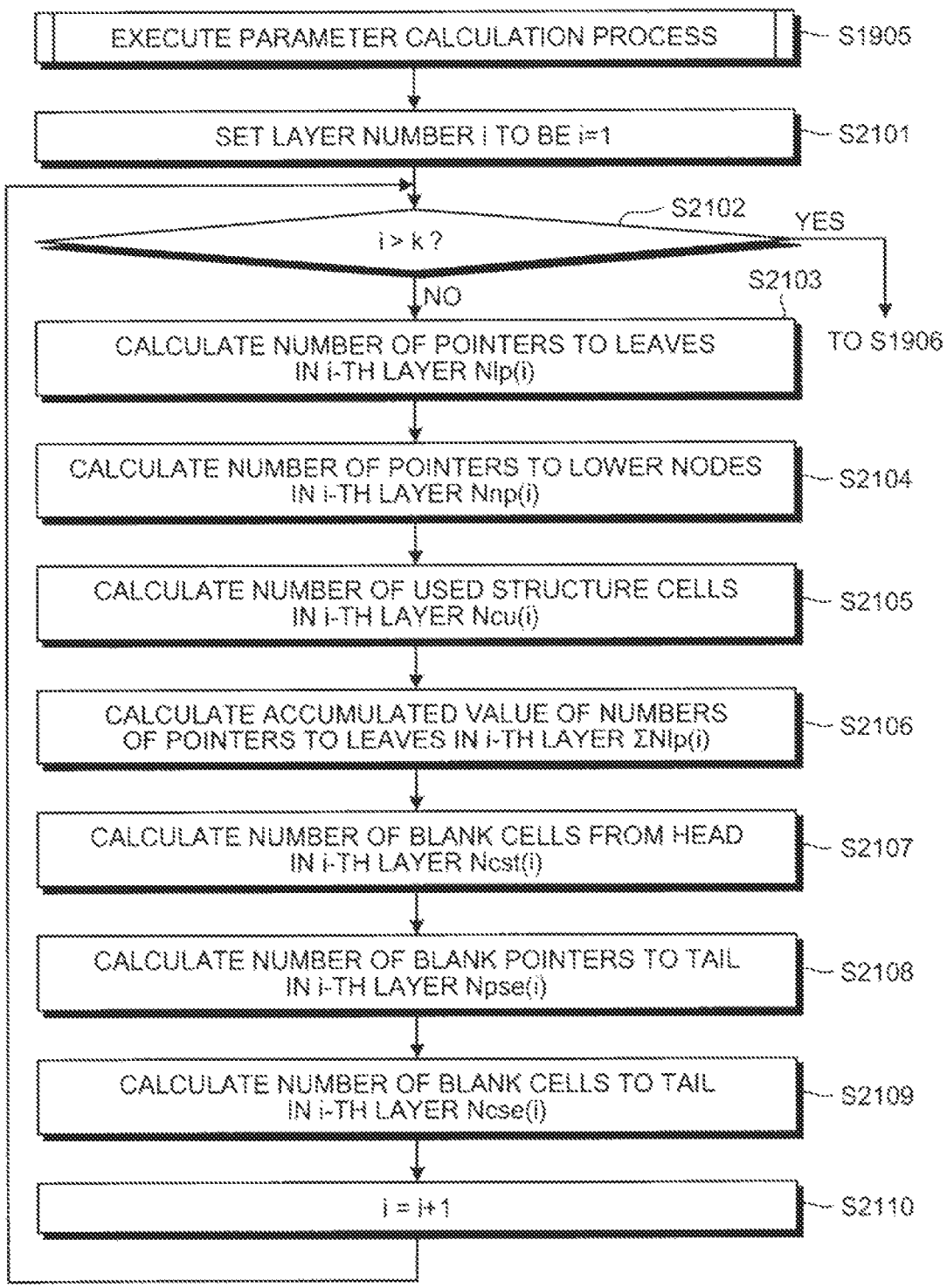
FIG. 21 is a flowchart detailing a process procedure of a parameter calculation process (step S1905) depicted in FIG. 19.

FIG. 21 is a flowchart detailing the process procedure of the parameter calculation process (step S1905) depicted in FIG. 19. The layer number i is set to be i=1 (step S2101) and whether i is i>k is determined (step S2102).

If it is determined that i is not i>k (step S2102: NO), the number of pointers to the leaves L# in the i-th layer Nlp(i), the number of pointers to the lower nodes in the i-th layer Nnp(i), the number of used structure cells C(i, j) in the i-th layer Ncu(i), the accumulated value of the numbers of pointers to leaves ΣNlp(i), the number of blank cells from the head in the i-th layer Ncst(i), the number of blank pointers to the tail in the i-th layer Npse(i), and the number of blank cells to the tail in the i-th layer Ncse(i) are calculated (steps S2103 to S2109).

The layer number i is incremented by one point (step S2110) and the procedure returns to step S2102. If it is determined at step S2102 that i is i>k (step S2102: YES), the procedure moves to step S1906.

Figure 22:
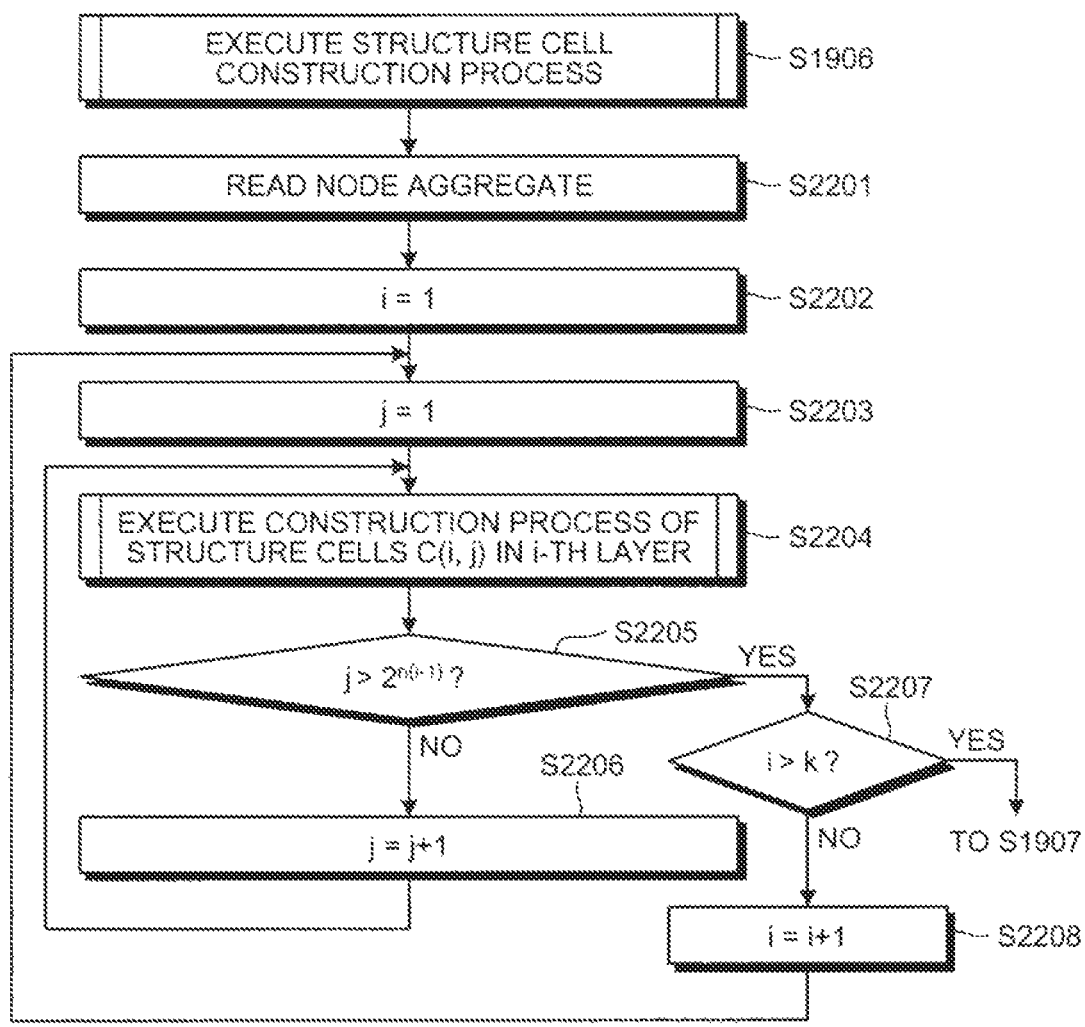
FIG. 22 is a flowchart detailing a process procedure of a structure cell construction process (step S1906) depicted in FIG. 19.

FIG. 22 is a flowchart detailing the process procedure of the structure cell construction process (step S1906) depicted in FIG. 19. The node aggregate 100 is read (step S2201). The layer number i is set to be i=1 (step S2202). The cell number j is set to be j=1 (step S2203). The construction process of the structure cell C(i, j) in the i-th layer is executed (step S2204).

Thereafter, whether j is $j > 2^{n(i-1)}$ for the number of nodes in the i-th layer $2^{n(i-1)}$ is determined (step S2205). If it is determined that j is not $j > 2^{n(i-1)}$ (step S2205: NO), j is incremented by one point (step S2206) and the procedure returns to step S2204. On the other hand, if it is determined that j is $j > 2^{n(i-1)}$ (step S2205: YES), whether is i>k is determined (step S2207). If it is determined that i is not i>k (step S2207: NO), i is incremented by one point (step S2208) and the procedure returns to step S2203. On the other hand, if it is determined that i is i>k (step S2207: YES), the procedure moves to step S1907.

Figure 23:
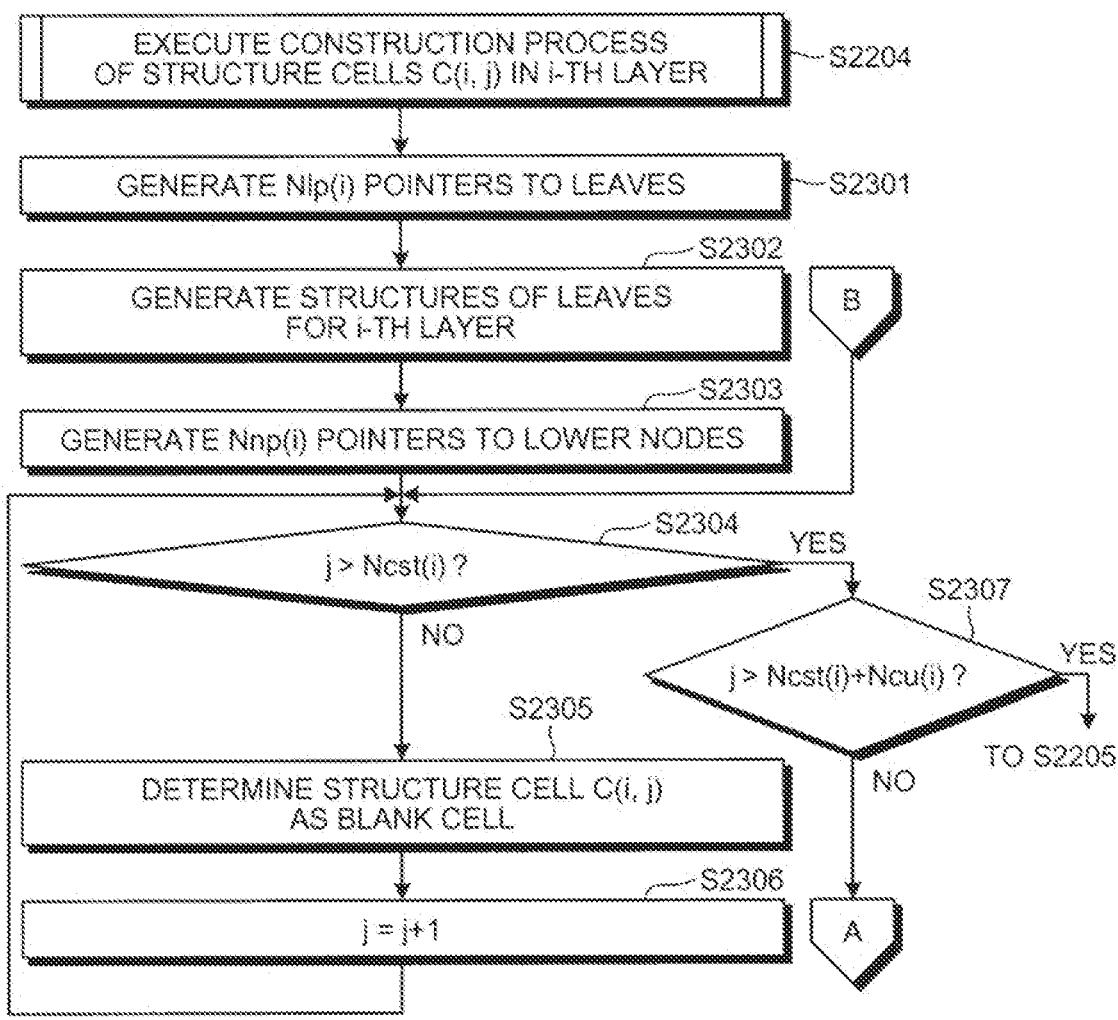
FIG. 23 is a flowchart detailing a process procedure of a construction process (step S2204) of a structure cell C(i, j) in an i-th layer depicted in FIG. 22.

FIG. 23 is a flowchart detailing the process procedure of the construction process (step S2204) of the structure cell C(i, j) in the i-th layer depicted in FIG. 22. Pointers to Nip(i) leaves L# are generated (step S2301) and the structures of the leaves L# for the i-th layer are generated (step S2302). Pointers to Nnp(i) lower nodes are generated (step S2303). Thereafter, whether the cell number j is j>Ncst(i) for the number of blank cells from the head Ncst(i) is determined (step S2304).

If it is determined that the cell number j is not j>Ncst(i) (step S2304: NO), the structure cell C(i, j) is determined to be a blank cell (step S2305). The cell number j is incremented by one point (step S2306) and the procedure returns to step S2304. On the other hand, if it is determined that the cell number j is j>Ncst(i) (step S2304: YES), whether the cell number j is j>Ncst(i)+Ncu(i) is determined (step S2307). "Ncu(i)" is the number of used cells in the i-th layer.

If it is determined that the cell number j is j>Ncst(i)+Ncu(i) (step S2307: YES), the procedure moves to step S2205. On the other hand, if it is determined that the cell number j is not j>Ncst(i)+Ncu(i) (step S2307: NO), the procedure moves to step S2401.

Figure 24:
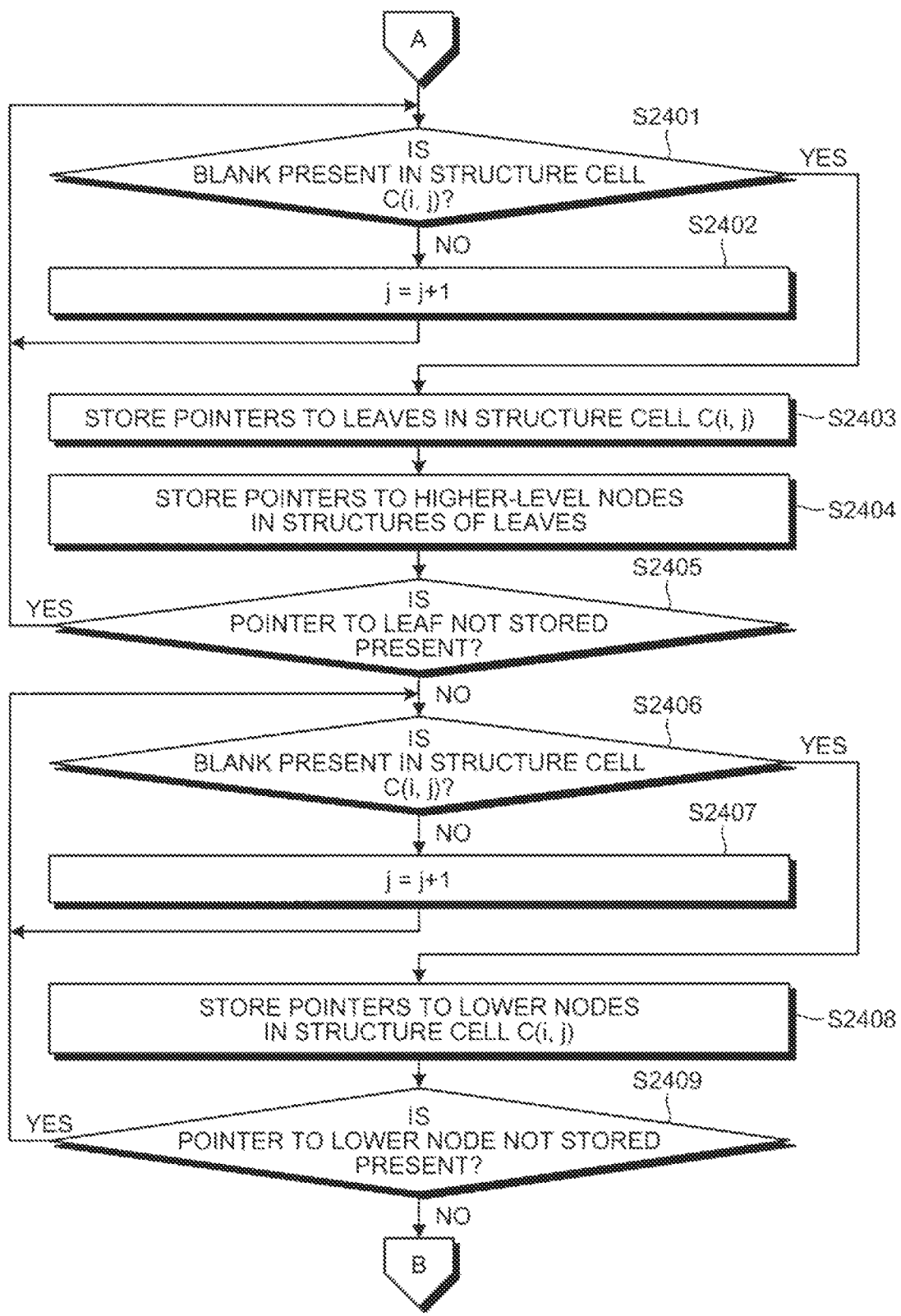
FIG. 24 is another flowchart detailing the process procedure of the construction process (step S2204) of the structure cell C(i, j) in the i-th layer depicted in FIG. 22.

FIG. 24 is another flowchart detailing the process procedure of the construction process (step S2204) of the structure cell C(i, j) in the i-th layer depicted in FIG. 22. At step S2401, whether the structure cell C(i, j) includes any blanks is determined (step S2401). If it is determined that the structure cell C(i, j) includes no blanks (step S2401: NO), j is incremented by one point (step S2402) and the procedure returns to step S2401.

On the other hand, if it is determined that the structure cell C(i, j) includes a blank (step S2401: YES), the pointers to the leaves L# are stored in the structure cell C(i, j) in ascending order of leaf number # (step S2403). Based on the pointers of the leaves L# stored, pointers to upper nodes C(i−1, j) are generated and are stored in the structures of the leaves L# (step S2404).

Whether any pointers to the leaves L# not stored are present is determined (step S2405). If it is determined that pointers to the leaves L# not stored are present (step S2405: YES), the procedure returns to step S2401. On the other hand, if it is determined that pointers to the leaves L# not stored are not present (step S2405: NO), whether the structure cell C(i, j) includes any blanks is determined (step S2406). If it is determined that the structure cell C(i, j) includes no blanks (step S2406: NO), j is incremented by one point (step S2407) and the procedure returns to step S2406.

On the other hand, if it is determined that the structure cell C(i, j) includes a blank (step S2406: YES), the pointers to the lower nodes are stored in the structure cell C(i, j) in ascending order of node number (step S2408). Whether pointers to the lower nodes not stored are present is determined (step S2409). If it is determined that pointers to the lower nodes not stored are present (step S2409: YES), the procedure returns to step S2406. On the other hand, if it is determined that pointers to the lower nodes not stored are not present (step S2409: NO), the procedure returns to step S2304 of FIG. 23.

Figure 25:
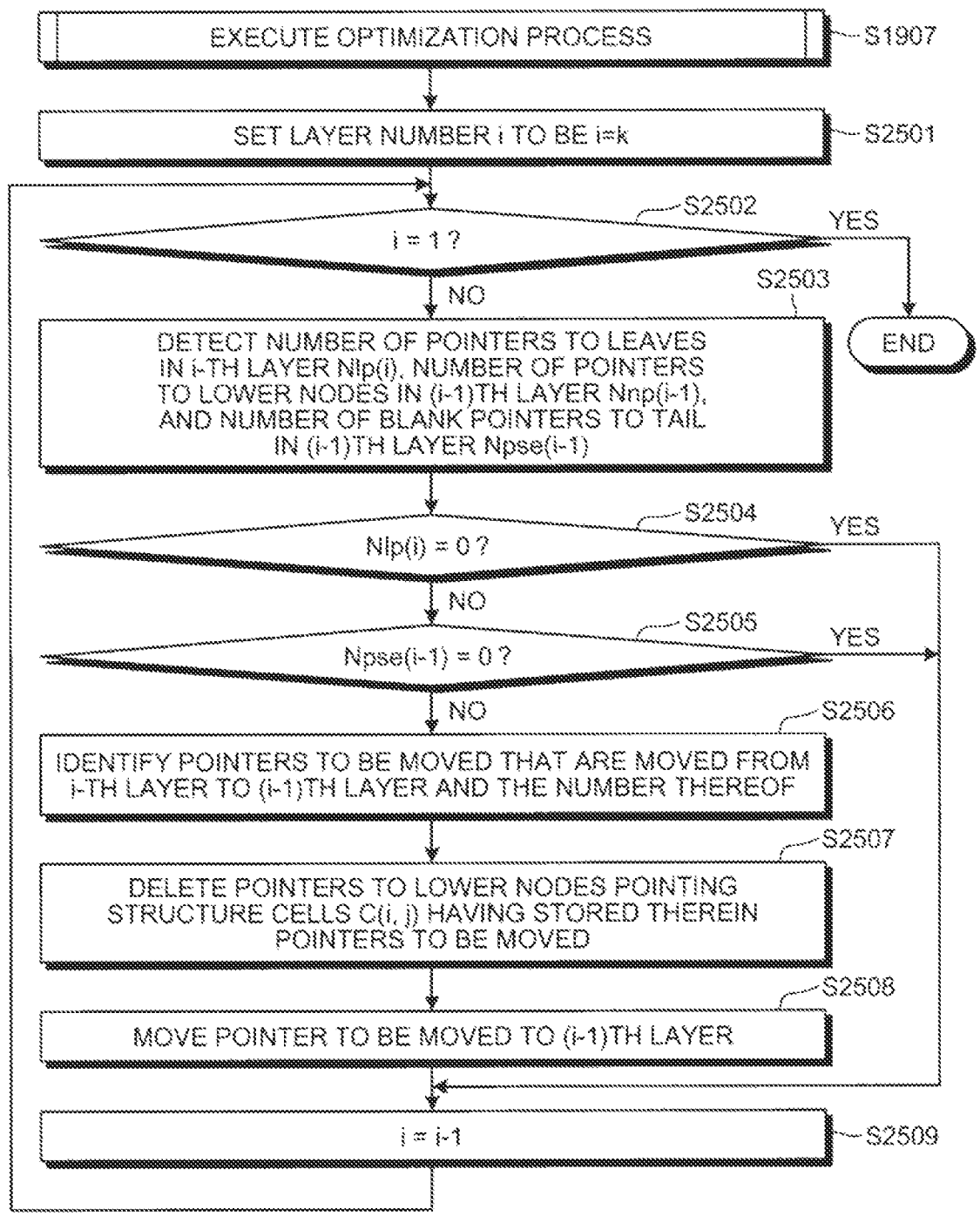
FIG. 25 is a flowchart detailing a process procedure of an optimization process (step S1907) depicted in FIG. 19.

FIG. 25 is a flowchart detailing the process procedure of the optimization process (step S1907) depicted in FIG. 19. The layer number i is set to be i=k (step S2501) and whether i is i=1 is determined (step S2502). When it is determined that i is not i=1 (step S2502: NO), the detecting unit 512 detects from the calculation result table 520 the number of pointers to leaves L# in the i-th layer Nlp(i), the number of pointers to lower nodes in the (i−1)th layer Nnp(i−1), and the number of blank pointers to the tail in the (i−1)th layer Npse(i−1) (step S2503).

Whether Nlp(i) is Nlp(i)=0 is determined (step S2504). If it is determined that Nlp(i) is Nlp(i)=0 (step S2504: YES), no pointer to the leave L# to be moved is present and therefore, the procedure moves to step S2509. On the other hand, if it is determined that Nlp(i) is not Nlp(i)=0 (step S2504: NO), whether Npse(i−1) is Npse(i−1)=0 is determined (step S2505). If it is determined that Npse(i−1) is Npse(i−1)=0 (step S2505: YES), no blank is present and therefore, the procedure moves to step S2509.

On the other hand, if it is determined that Npse(i−1) is not Npse(i−1)=0 (step S2505: NO), the identifying unit 513, using Equation (6), identifies the pointers to the leaves L# to be moved from the i-th layer to the (i−1)th layer (pointers to be moved) and the number thereof (step S2506).

The pointers to the lower nodes C(i, j) in the (i−1)th layer pointing the structure cells C(i, j) storing therein the pointers to be moved are deleted from the (i−1)th layer (step S2507). The pointers to be moved are moved into the (i−1)th layer and are stored such that the numbers # of the leaves L# are sequentially arranged (step S2508). Thereafter, at step S2509, the layer number i is incremented by one point (step S2509) and the procedure returns to step S2502. If it is determined at step S2502 that the layer number i is i=1 (step S2502: YES), the process comes to an end. Thereby, the series of description sections of the procedure of the $2^n$-branching Huffman tree generation process automatically executed by the information processing apparatus 500 come to an end.

A compression process and an expansion process using the 2-branching Huffman tree H1 will be described. In this case, the $2^n$-branching Huffman tree H1 automatically generated by the generation process may be used and the $2^n$-branching Huffman tree H1 provided in advance may also be used. More specifically, the $2^n$-branching Huffman tree H1 is converted into a no-node Huffman tree H2 and the compression process and the expansion process are executed using the no-node Huffman tree H2.

The no-node Huffman tree H2 will be described. The "no-node Huffman tree H2" is a Huffman tree that is configured only by a root and leaves and that has no internal node. The no-node Huffman tree H2 has an increased number of branches while each of its leaves is accessible from its root through one path. The no-node Huffman tree H2 is stored in a storage medium such as the RAM 403, the magnetic disk 405, and the optical disk 407 depicted in FIG. 4 and is accessible by the CPU 401.

Figure 26:
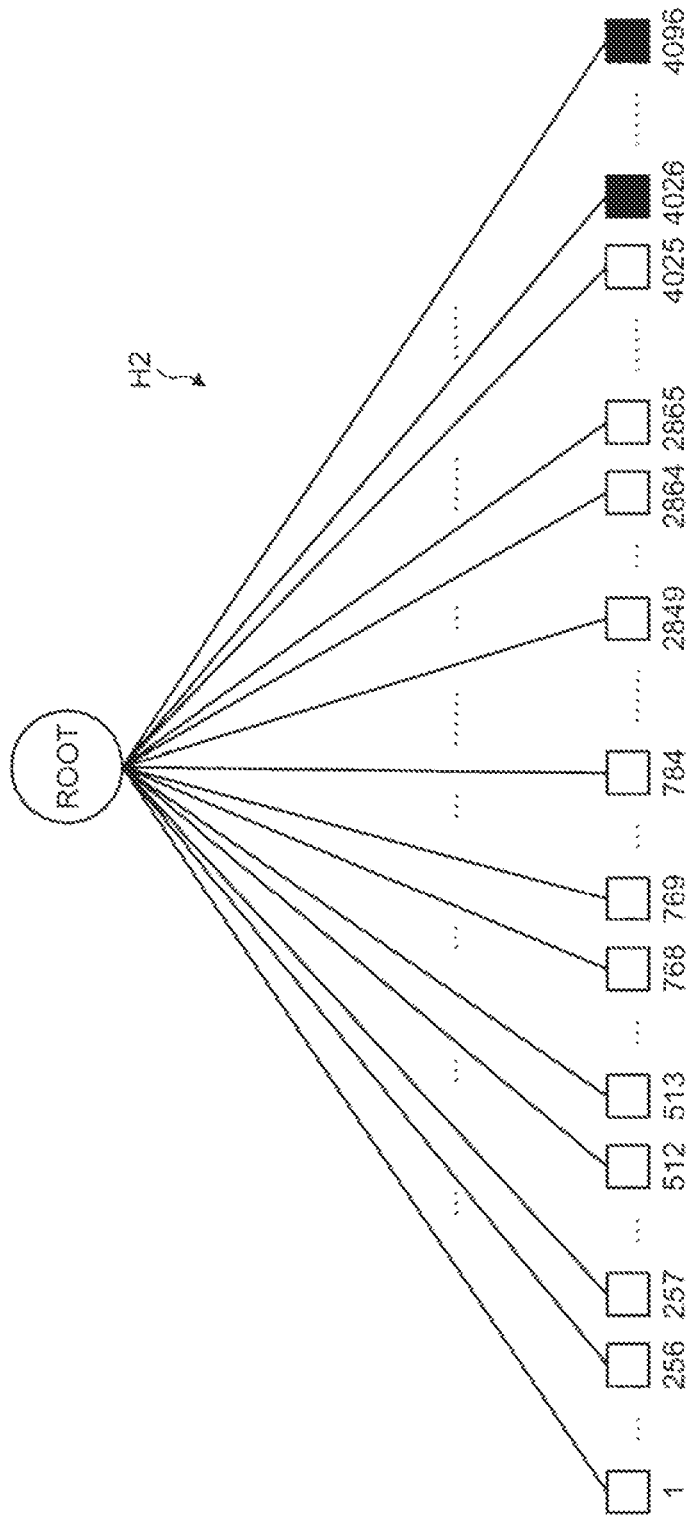
FIG. 26 is an explanatory diagram of a $2^m$-branching no-node Huffman tree.

FIG. 26 is an explanatory diagram of a $2^m$-branching no-node Huffman tree. In the $2^m$ (m=12)-branching no-node Huffman tree H2, a branch number that is a pointer from the root to a leaf is an m-bit-code address. The pointers to the leaves of the leaf numbers 1 to 4,096 are "000000000000" to "111111111111". A 16-bit character code is compressed to a code that is 12 or fewer bits. "m" is a value that is $m < 2^n$ and, for example, the largest value that is a multiple of four, among the values that satisfy the inequality is used as "m". "m" is set in advance according to "n". For example, if n is n=4, m is set to be m=12.

Figure 27:
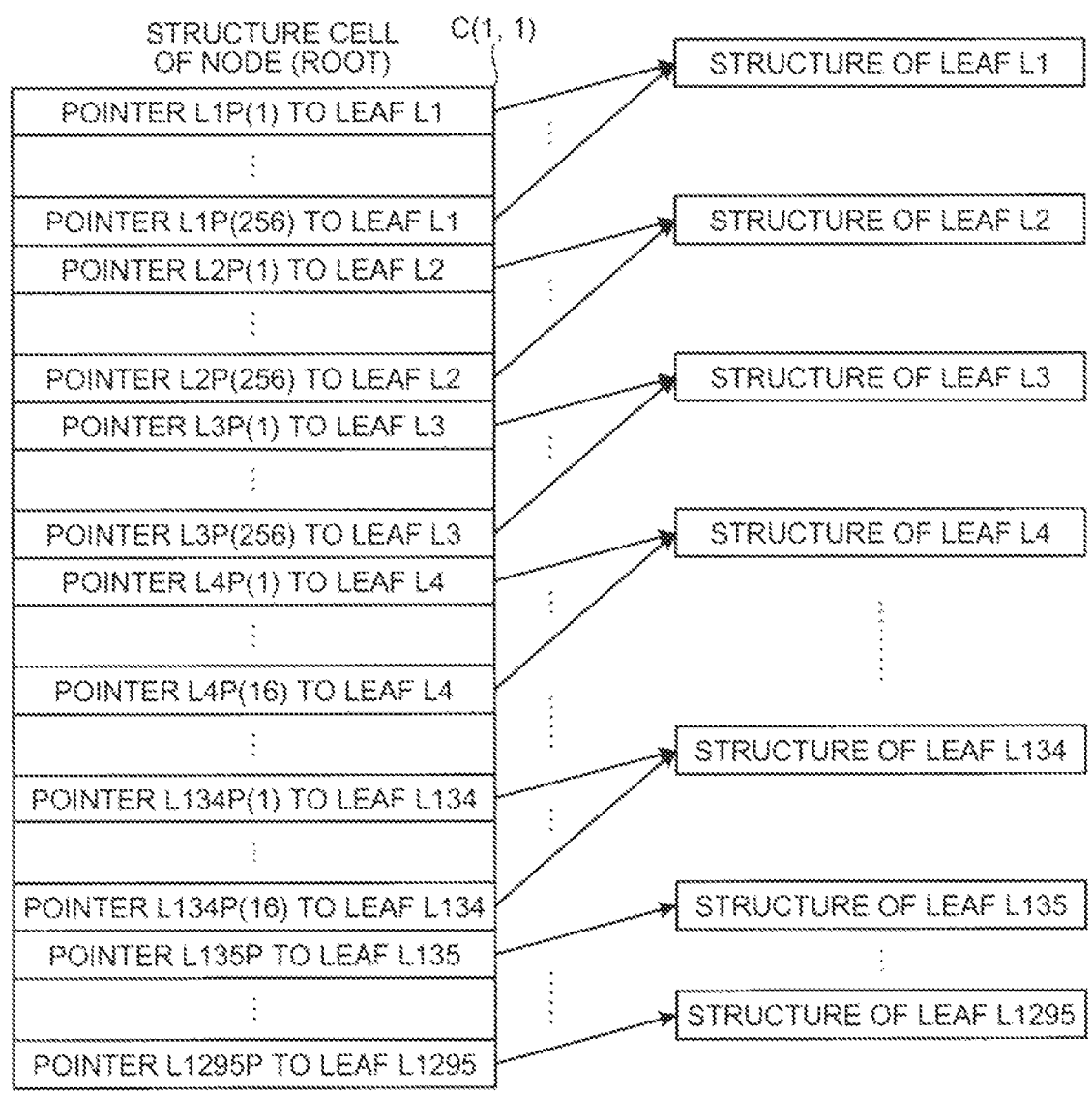
FIG. 27 is an explanatory diagram of a node (root) structure of the $2^m$-branching no-node Huffman tree.

FIG. 27 is an explanatory diagram of a node (root) structure of the $2^m$-branching no-node Huffman tree H2. Similarly to the case of the $2^n$-branching Huffman tree H1, assuming that the total number of the leaves is 1,295, the number of leaves is excessive. Therefore, plural (for example, 256) pointers are prepared for a leaf that stores therein the character codes, etc., having high appearance frequencies.

In FIG. 27, 256 pointers to leaves are allocated to each of the leaves L1 to L3 having high appearance frequencies in the first layer of the $2^n$-branching Huffman tree H1, and the pointers are stored in the root structure cell C(1, 1). 16 pointers to leaves are also allocated to each of the leaves L4 to L134 having high appearance frequencies in the second layer, and the pointers are stored in the root structure cell C(1, 1). One pointer to a leaf is allocated to each of leaves L135 to L1,295 in the third layer, and the pointers are stored in the root structure cell C(1, 1).

Figure 28:
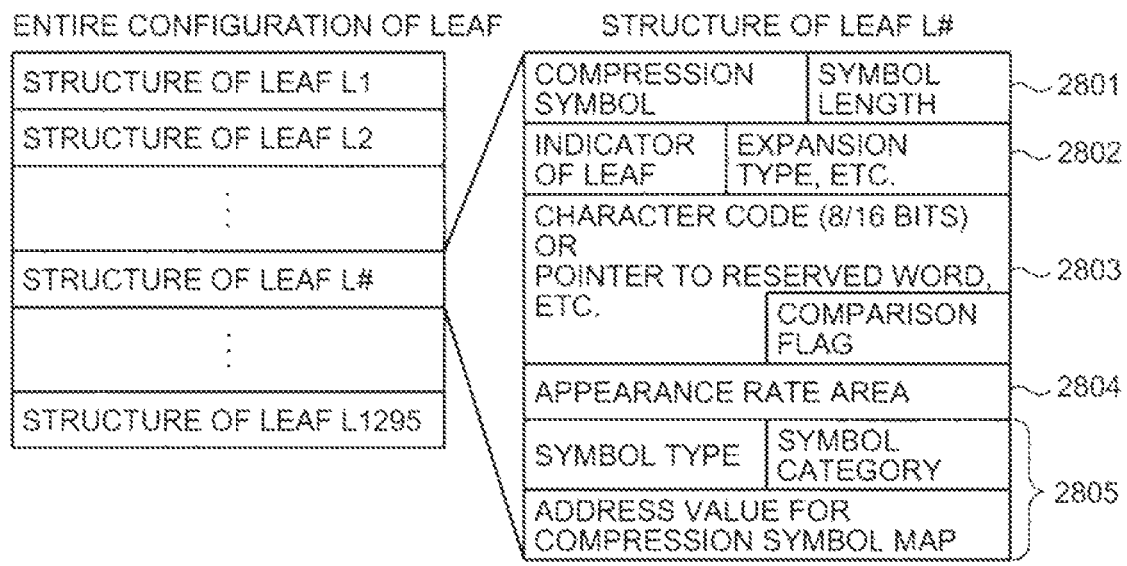
FIG. 28 is an explanatory diagram of leaf structures of the no-node Huffman tree.

FIG. 28 is an explanatory diagram of leaf structures of the no-node Huffman tree H2. Overall, the leaves have a first to a fifth areas 2801 to 2805. The leaf structures of the no-node Huffman tree H2 are structures that are duplicated from the leaf structures of the $2^n$-branching Huffman tree H1 and therefore, the first to the fourth areas 2801 to 2804 correspond to the first to the fourth areas 1131 to 1134 of FIG. 11. The first area 2801 stores therein a compression symbol and its compression symbol length. The second area 2802 stores therein an indicator and an expansion type of a leaf similarly to FIG. 11. The third area 2803 stores therein a pointer to a higher-level 16-bit character code, a lower-level divided 8-bit character code, or a reserved word, depending on the expansion type, similarly to FIG. 11.

The fourth area 2804 stores therein an appearance frequency area similarly to FIG. 11. The fifth area 2805 stores therein a symbol type and a symbol category. The "symbol type" is information that identifies which among a digit, an English character, a special symbol, a katakana character, a hiragana character, and a Chinese character, a character code corresponds to, or whether the character code is a pointer to a reserved word. The "symbol category" is information that identifies whether the character code is a 16-bit code or an 8-bit code. When the character code is a 16-bit character code or a reserved word, "1" is allocated as the symbol category. When the character code is an 8-bit divided character code, "0" is allocated as the symbol category.

The fifth area 2805 stores therein an address value that constitutes a pointer to the compression symbol map group Ms. The "pointer to the compression symbol map group Ms" is a pointer that accesses a compression symbol map M# specific to a character code stored in the structure of the leaf L# of the compression symbol map group Ms. For 1,024 kinds of higher-level character codes, address values of 0001 to 1024 are respectively allocated to the 1,024 character codes.

For 15 kinds of reserved words, address values of 1025 to 1039 are respectively allocated to (the pointers of) the 15 reserved words. For the upper 8-bit divided character codes, address values of 0001 to 0256 are allocated to the upper 8-bit divided character codes. For the lower 8-bit divided character codes, address values of 0257 to 0512 are allocated to the lower 8-bit divided character codes. The pointer to the compression symbol map group Ms is configured by the symbol category and the address value of the fifth area 2805.

FIG. 29 is an explanatory diagram of information stored in the structure of the leaf L#. Each record corresponds to the structure of the leaf L#. The structure of each leaf L# includes information such as a compression symbol and its compression symbol length, a leaf number, the expansion type, character codes, etc., (a pointer to a character code (16/eight bits) or a reserved word), and a pointer to the compression symbol map M#. The pointer to the compression symbol map M# is an address formed by connecting a symbol category and an address value adr#.

The no-node Huffman tree H2 can be generated by conversion from the $2^n$-branching Huffman tree H1. More specifically, for example, the $2^m$-branching (m=n×k) no-node Huffman tree H2 can be generated from the $2^n$-branching Huffman tree H1. The functional configuration for the conversion into the $2^m$-branching no-node Huffman tree H2 will be described.

Figure 30:
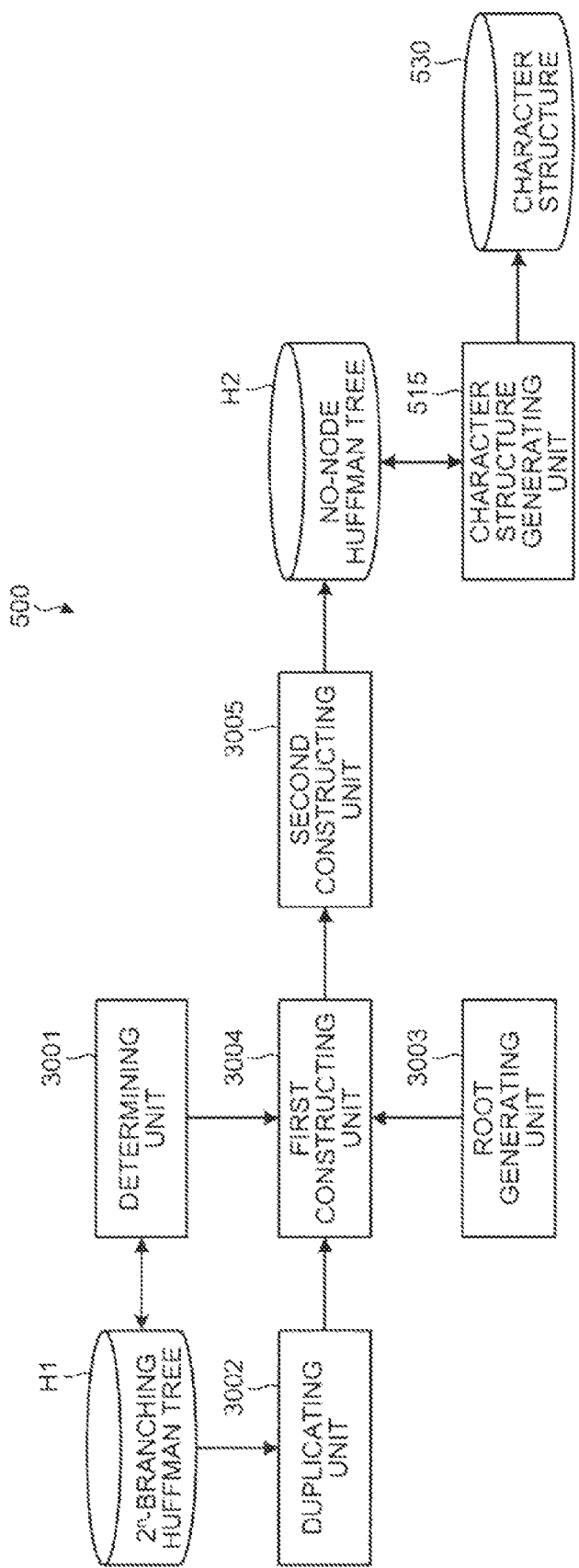
FIG. 30 is a block diagram of a second functional configuration of the information processing apparatus according to the embodiment.

FIG. 30 is a block diagram of a second functional configuration of the information processing apparatus 500 according to the embodiment. FIG. 30 depicts a functional configuration that executes the process of (3) of the process flow (1) to (6) depicted in FIG. 1. Components identical to those depicted in FIG. 5 are given the same reference numerals used in FIG. 5 and will not again be described.

In FIG. 30, the information processing apparatus 500 includes a determining unit 3001, a duplicating unit 3002, a root generating unit 3003, a first constructing unit 3004, a second constructing unit 3005, and a character structure generating unit 515. Functions of the determining unit 3001 to the second constructing unit 3005 are implemented by causing the CPU 401 to execute a program stored in a storage medium such as the RAM 403, the magnetic disk 405, and the optical disk 407 depicted in FIG. 4, or by using the I/F 409.

The determining unit 3001 has a function of determining the number of kinds of pointers to leaves for each leaf in the i-th layer, based on the number of layers of the $2^n$-branching Huffman tree H1 and the number of leaves in the i-th layer. More specifically, for example, the CPU 401 sets, in advance, the numbers of kinds in the first to the third layers to be 256, 16, and one, respectively. For example, in the 2'-branching Huffman tree H1, the numbers of leaves in the first to the third layers are three, 131, and 1,161.

Therefore, the number of pointers to the leaves is 4,025 (=3×256 kinds+131×16 kinds+1,161×one kind) and is equal to or fewer than 4,096·($2^m$). Thereby, the numbers of kinds in the first to the third layers are determined to be 256, 16, and one, respectively. If the number of pointers exceeds 4,096, the number of pointers is optimized to be equal to or fewer than 4,096 by varying the number of kinds in the first layer to 16 or varying the number of kinds in the second layer to one.

The duplicating unit 3002 has a function of duplicating a leaf of the $2^n$-branching Huffman tree H1. More specifically, for example, the CPU 401 duplicates the structure of the leaf L# and clears the pointer to an upper node and the compression symbol length therein.

The root generating unit 3003 has a function of generating a root capable of storing therein pointers to $2^m$ leaves, and storing the root in a storing apparatus. More specifically, for example, when n is n=4, the root generating unit 3003 generates a root structure having the number obtained when m is m=12, that is, 4,096 blank pointers.

The first constructing unit 3004 has a function of generating pointers to leaves for each of the leaves duplicated by the duplicating unit 3002, based on the number of kinds determined by the determining unit 3001, and storing the pointers in the root generated by the root generating unit 3003. More specifically, for example, when the number of kinds is determined to be 256 for the first layer, the first constructing unit 3004 generates pointers to the leaf L1 L1P(1) to L1P(256) for the leaf L1 concerning the first layer, and stores the pointers to the leaf L1 L1P(1) to L1P(256) in the root structure.

If the number of kinds is determined to be 16 for the second layer, the first constructing unit 3004 generates pointers to the leaf L4 L4P(1) to L4P(16) for the leaf L4 concerning the second layer, and stores the pointers to the leaf L4 L4P(1) to L4P(16) in the root structure. If the number of kinds is determined to be one for the third layer, the first constructing unit 3004 generates a pointer to the leaf L135 L135P(1) for the leaf L135 concerning the first layer, and stores the pointer to the leaf L135 L135P(1) in the root structure.

The second constructing unit 3005 has a function of generating the no-node Huffman tree H2 configured by the root and the leaves by extracting a compression symbol that is configured by a bit string common to a group of pointers to a leaf for the leaf, storing the compression symbol and its compression symbol length in the leaf, and re-constructing the leaf. More specifically, for example, when plural kinds of pointers to a leaf L# are generated for the arbitrary leaf L#, a bit string common to these pointers is identified as a compression symbol. The compression symbol length of the compression symbol is also obtained. The compression symbol and its compression symbol length are stored in the structure of the leaf L#.

For example, for the leaf L1, assuming that 256 kinds of pointers to the leaf L1 L1P(1) to L1P(256) are generated, the bit strings are as follows.

```
Pointer L1P(1)    :000000000000
Pointer L1P(2)    :000000000001
Pointer L1P(3)    :000000000010
Pointer L1P(4)    :000000000011
       ⋮                ⋮
Pointer L1P(256)  :000011111111
```

For the pointers L1P(i) to L1P(256), the upper four bits "0000" become the common bit string and therefore, the upper four bits "0000" are identified as a compression symbol of the structure of the leaf L1. The compression symbol length of this is four bits and therefore, this is stored together with the compression symbol "0000" in the structure of the leaf L1. Therefore, the structure of the leaf L1 is accessed when any of the 256 kinds of pointers to the leaf L1 L1P(1) to L1P(256) is designated. Thereby, the access frequency is increased and therefore, for the character codes that are stored in the structure of the leaf L1, the access frequency to their compression symbol is also increased. The same applies for the leaves L2 and L3.

For the leaf L4, assuming that 16 kinds of pointers to the leaf L4 L4P(1) to L4P(16) are generated, the bit strings are as follows.

```
Pointer L4P(1)    :001100000000
Pointer L4P(2)    :001100000001
Pointer L4P(3)    :001100000010
Pointer L4P(4)    :001100000011
       ⋮                ⋮
Pointer L4P(16)   :001100001111.
```

For the pointers L4P(1) to L4P(16), the upper eight bits of "00110000" become the common bit string and therefore, the upper eight bits "00110000" are identified as a compression symbol of the structure of the leaf L4. The compression symbol length of this is eight bits and therefore, this is stored together with the compression symbol "00110000" in the structure of the leaf L4. Therefore, the structure of the leaf L4 is accessed when any of the 16 kinds of pointers to the leaf L4 L4P(1) to L4P(16) is designated. Thereby, the access frequency is increased (though lower than that of each of the leaves L1 to L3) and therefore, for the character codes that are stored in the structure of the leaf L4, the access frequency to their compression symbol is also increased.

For the leaf L135, assuming that one kind of pointer to the leaf L135 L135P(1) is generated, the bit string is as follows.
Pointer L135P(1):101000100000

The pointer L135P(1) is only one kind and therefore, these 12 bits "101000100000" are identified as a compression symbol of the structure of the leaf L135. The compression symbol length of this is 12 bits and therefore, this is stored together with the compression symbol "101000100000" in the structure of the leaf L135. By the construction described, the no-node Huffman tree H2 is generated. The root of the no-node Huffman tree H2 is allocated with the pointers as branches to the leaves, which are of lengths corresponding to the number of leaves. The pointers allocated are in a quantity corresponding to the appearance rate of the character code.

When the second constructing unit 3005 stores the compression symbol in the structure of the leaf L#, the second constructing unit 3005 stores together with the symbol category an unused address value adr# according to the symbol category. More specifically, the second constructing unit 3005 refers to the expansion type and stores the symbol category in the structure of the leaf L#, and stores the unused address value adr# for each symbol category. Thereby, for each of the character codes, etc., the pointers to the compression symbol map M# can be stored in each structure of the leaf L#.

The character structure generating unit 515 refers to the newly constructed no-node Huffman tree H2 and again generates (updates) the character structure 530. The pointers to the leaves newly generated are stored in the reserved word structure 1600, the higher-level character code structure 1700, and the divided character code structure 1800.

Figure 31A:
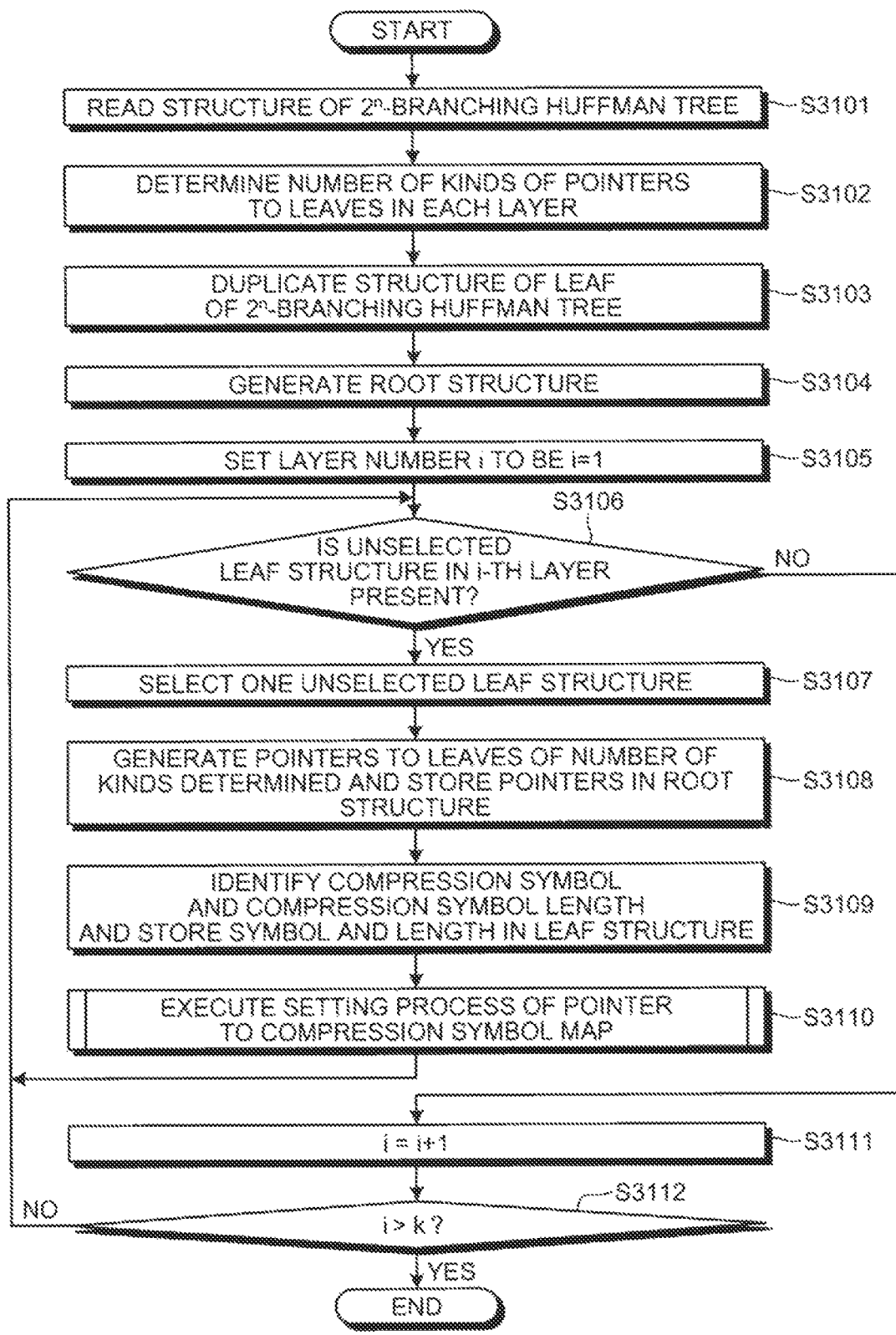
FIG. 31A is a flowchart of a procedure of a process of converting from the $2^n$-branching Huffman tree to the $2^m$-branching no-node Huffman tree.

FIG. 31A is a flowchart of the procedure of the process of converting from the $2^n$-branching Huffman tree H1 to the $2^m$-branching no-node Huffman tree automatically executed by the information processing apparatus 500. In FIG. 31A, the structure of the $2^n$-branching Huffman tree H1 is read (step S3101) and the determining unit 3001 determines the number of kinds of the pointers to the leaves, for each layer (step S3102).

The duplicating unit 3002 duplicates the structures of the leaves L# of the $2^n$-branching Huffman tree H1 (step S3103) and the root generating unit 3003 generates the root structure (step S3104). The layer number i is determined to be i=1 (step S3105) and whether any unselected structure of the leaf L# in the i-th layer is present is determined (step S3106).

Is it is determined that some unselected structures of the leaves L# are present (step S3106: YES), one of the unselected structures of the leaves L# is selected (step S3107) and pointers to the leaves of the determined number of kinds are generated and are stored in the root structure (step S3108). The compression symbol and the compression symbol length are identified from the pointers to the leaves of the determined number of kinds and are stored in the structure of the leaf L# (step S3109). Thereafter, the pointer setting process to the compression symbol map M# is executed (step S3110) and the procedure returns to step S3106. The pointer setting process to the compression symbol map M# will be described later with reference to FIG. 31B.

On the other hand, if it is determined at step S3106 that no unselected structure of the leaf L# is present (step S3106: NO), the layer number i is incremented by one point (step S3111) and whether the layer number i is i>k for the number of layers k of the $2^n$-branching Huffman tree H1 is determined (step S3112). If it is determined that the layer number i is not i>k (step S3112: NO), the procedure returns to step S3106. On the other hand, if it is determined that the layer number i is i>k (step S3112: YES), the converting process comes to an end.

FIG. 31B is a flowchart detailing the process procedure of the pointer setting process to the compression symbol map M# (step S3110) depicted in FIG. 31A. The structure of the leaf L# selected at step S3107 is referred to, and the symbol type and the symbol category of the character codes, etc., are identified (step S3121). The initial values of the address values adra to adrd are set according to the symbol type and the symbol category identified (step S3122).

More specifically, if the symbol type is a character code such as that for a digit, an English character, a special symbol, a katakana character, a hiragana character, or a Chinese character and the symbol category is "1" for the structure of the leaf L#, the initial value of the address value adra for the 16-bit character code is set to be adra=0001.

If the symbol type is a pointer to a reserved word and the symbol category is "1" for the structure of the leaf L#, the initial value of the address value adrb for the pointer to the reserved word is set to be adrb=1025.

If the symbol type is an upper 8-bit divided character code and the symbol category is "0" for the structure of the leaf L#, the initial value of the address value adrc for the upper 8-bit divided character code is set to be adrc=0001.

If the symbol type is a lower 8-bit divided character code and the symbol category is "0" for the structure of the leaf L#, the initial value of the address value adrd for the lower 8-bit divided character code is set to be adrd=0257.

The symbol category in the structure of the leaf L# is determined (step S3123). If the symbol category is "1" (step S3123: 1) and the symbol type is "character code" (step S3124: character code), the address value adra is stored in the fifth area 2805 of the structure of the leaf L# (step S3125). Thereafter, the address value adra is incremented (step S3126) and the procedure moves to step S3106.

At step S3123, if the symbol category is "1" (step S3123: 1) and the symbol type is "pointer to reserved word" (step S3124: pointer to reserved word), the address value adrb is stored in the fifth area 2805 of the structure of the leaf L# (step S3127). Thereafter, the address value adrb is incremented (step S3128) and the procedure moves to step S3106.

At step S3123, if the symbol category is "0" (step S3123: 0) and the symbol type is "upper 8-bit divided character code"  (step S3129: upper), the address value adrc is stored in the fifth area 2805 of the structure of the leaf L# (step S3130). Thereafter, the address value adrc is incremented (step S3131) and the procedure moves to step S3106.

At step S3123, if the symbol-category is "0" (step S3123: 0) and the symbol type is "lower 8-bit divided character code" (step S3129: lower), the address value adrd is stored in the fifth area 2805 of the structure of the leaf L# (step S3132). Thereafter, the address value adrd is incremented (step S3133) and the procedure moves to step S3106. Thereby, the pointer to the compression symbol map M# is set in the structure of each leaf L. Therefore, the compression symbol map M# can be identified when the no-node Huffman tree H2 is searched.

As described, by converting from the $2^n$-branching Huffman tree H1 to the $2^m$-branching no-node Huffman tree H2, the no-node Huffman tree H2 is used for the compression and expansion. By using the no-node Huffman tree H2 for the compression and the expansion, improvement of the compression rate and the search speed can be facilitated compared to the $2^n$-branching Huffman tree H1.

The compression process using the $2^m$-branching no-node Huffman tree H2 will be described. In the $2^m$-branching no-node Huffman tree H2, each leaf can be accessed through one path and therefore, an increase of the search speed can be facilitated. A functional configuration for this will be described.

FIG. 32 is a block diagram of a third functional configuration of the information processing apparatus 500 according to the embodiment. FIG. 32 depicts the functional configuration to execute processes of (4) to (6) of the flow of processes (1) to (6) depicted in FIG. 1. Components identical to those depicted in FIG. 5 are given the same reference numerals used in FIG. 5 and will not again be described. In FIG. 32, the information processing apparatus 500 includes a compressing unit 3200 (the dividing unit 505, a setting unit 3201, a character-code-to-be-compressed searching unit 3202, a Huffman tree searching unit 3203, and a compression symbol storing unit 3204), a detecting unit 3205, a compression symbol map identifying unit 3206, a compression symbol map updating unit 3207, a compression symbol map compressing unit 3208 (a bit string compressing unit 3281 and a non-compression area setting unit 3282), and a compression buffer 3211.

Functions of the setting unit 3201 to the compression symbol map compressing unit 3208 are implemented by causing the CPU 401 to execute a program stored in a storage medium such as the RAM 403, the magnetic disk 405, and the optical disk 407 depicted in FIG. 4, or by using the I/F 409. A function of the compression buffer 3211 is implemented by using a storage medium such as RAM 403, the magnetic disk 405, or the optical disk 407 depicted in FIG. 4.

The compressing unit 3200 has a function of sequentially compressing according to the Huffman tree, the character codes to be compressed that are described in an file F selected from the file group Fs. More specifically, for example, the compressing unit 3200 executes the compression using the dividing unit 505, the setting unit 3201, the character-code-to-be-compressed searching unit 3202, the Huffman tree searching unit 3203, and the compression symbol storing unit 3204.

When the compression process is executed, the setting unit 3201 has a function of setting the character codes to be compressed. More specifically, for example, the CPU 401 writes into its internal register or an external buffer, the character codes to be compressed and the compression symbol strings input.

FIG. 33A is an explanatory diagram of an example of a character code string to be compressed. In this example, a character string "次の兎は" is the character string to be compressed and its character code string is listed. "兎" is a lower-level character code and therefore, is divided into an upper eight bits and a lower eight bits.

FIG. 33B is an explanatory diagram of an example of a compression symbol string. In this example, a compression symbol string of the character string "次の兎は" is also listed. Because "兎" is divided into an upper eight bits and a lower eight bits, its compression symbol allocated to each of its divided character codes.

The character-code-to-be-compressed searching unit 3202 has a function of searching among the higher-level character code group, for the character code to be compressed set by the setting unit 3201. More specifically, for example, the CPU 401 searches for the character code to be compressed set in its register by scanning the character structure 530, that is, the reserved word structure 1600 and the higher-level-character-code structure 1700.

If no character code that coincides with the character code to be compressed is retrieved from the reserved word structure 1600 and the higher-level-character-code structure 1700, the CPU 401 using the dividing unit 505, divides the character code to be compressed into upper bits and lower bits, and searches by scanning the divided character code structure 1800 for each of the divided character codes.

The Huffman tree searching unit 3203 has a function of using the pointers to the leaves L# that are correlated with the retrieved character codes, etc. and searching for the compression symbol of the retrieved character codes, etc. More specifically, for example, the CPU 401 reads from the character structure 530, a coinciding pointer to the leaf L# that is correlated with the character codes, etc., identifies the structure of the leaf L#, and extracts the compression symbol of the character code stored in the structure of the leaf L# pointed to.

For example, (refer to FIG. 26), when the character code that corresponds to the leaf L256 is retrieved as a higher-level character code, the pointer to the leaf L256 is read from the higher-level-character-code structure 1700 and the structure of the leaf L256 is accessed. The compression symbol of the character code stored in the structure of the leaf L256 is extracted from the structure of the leaf L256.

The compression symbol storing unit 3204 has a function of storing to a predetermined storage area, the compression symbol retrieved by the Huffman tree searching unit 3203. More specifically, for example, the CPU 401 writes the retrieved compression symbol into the compression buffer 3211.

Before describing the compression symbol map identifying unit 3206 to the compression symbol map compressing unit 3208, a specific example of the compression process of the file group Fs using the $2^m$-branching no-node Huffman tree H2 will be described. In the compression process using the $2^m$-branching no-node Huffman tree H2, in the Huffman tree search, searching toward the root is not necessary because no internal node is present, and the character code stored in the structure of the leaf L# pointed is extracted and is written into the compression buffer 3211. When a pointer to a reserved word is extracted, the reserved word of the pointing destination is extracted and is written into the buffer 3211. Thereby, the speed of the compression process can be increased.

Figure 34:
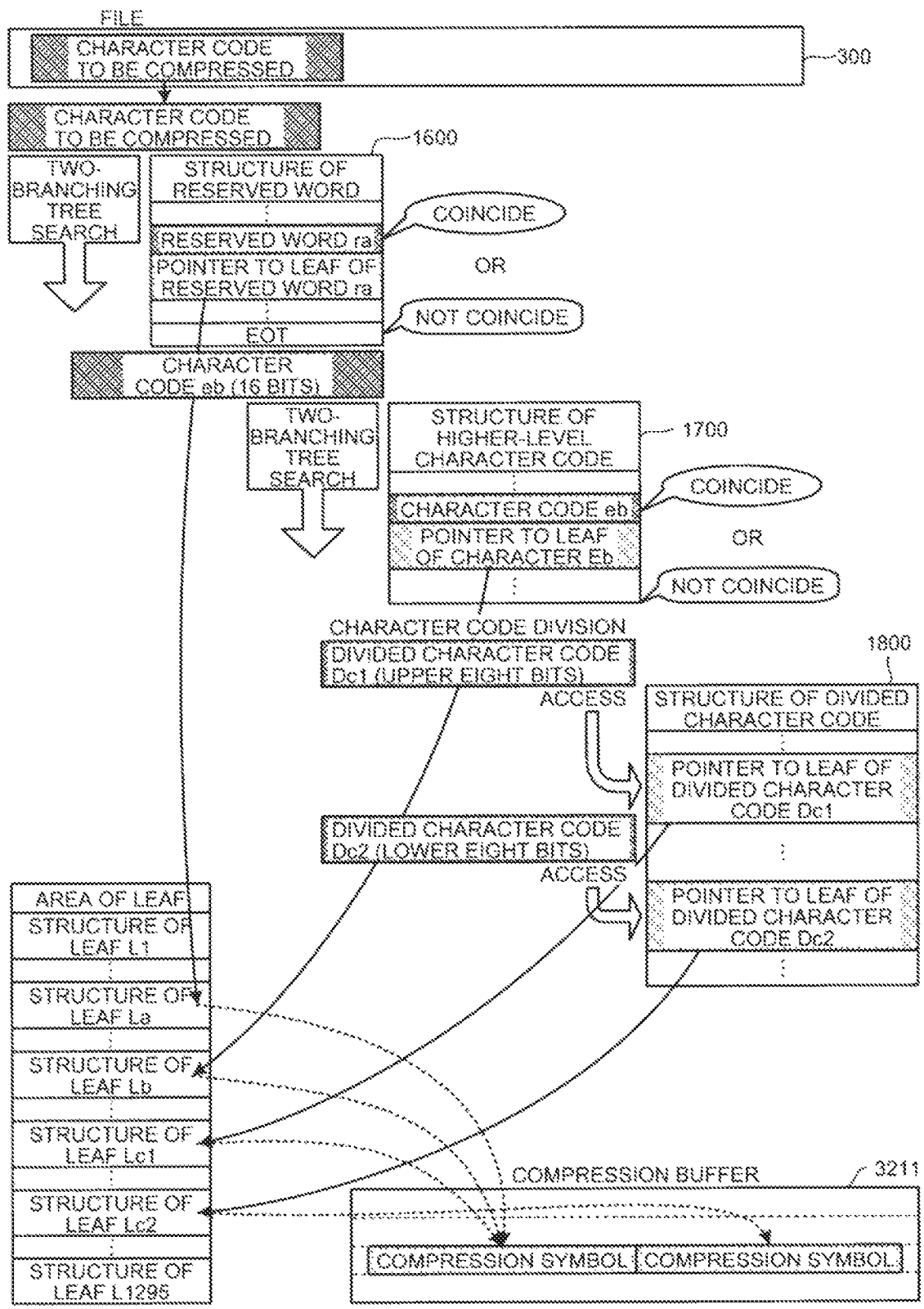
FIG. 34 is an explanatory diagram of an example of a compression process using the $2^m$-branching no-node Huffman tree.

FIG. 34 is an explanatory diagram of an example of the compression process using the $2^m$-branching no-node Huffman tree H2. The character code to be compressed of the first character is obtained from the file group Fs and is a position within an file 300 is stored. A two-branching tree search is executed with respect to the reserved word structure 1600. The reserved word is a character code string of two or more characters and therefore, when the character code to be compressed of the first character is hit, the character code of the second character is obtained as a character code to be compressed.

The character code of the second character is searched for from the position at which the character code to be compressed of the first character is hit. For the third and the subsequent characters, the two-branching search is repeatedly executed until a character code to be compressed that does not coincide appears. If a reserved word "ra" ("a" is the leaf number) that coincides is retrieved, the structure of the leaf La is accessed by the pointer to the leaf La. The compression symbol of the reserved word ra is retrieved using the Huffman tree search and is stored in the compression buffer 3211.

On the other hand, if a character code to be compressed that does not coincide appears, the two-branching search on the reserved word structure 1600 comes to an end (is advanced to End Of Transmission (EOT)), the character code to be compressed of the first character is again set in the register, and the two-branching tree search on the higher-level character code structure 1700 is executed.

If a character code eb ("b" is the leaf number) that coincides is retrieved, the structure of the leaf Lb is accessed by the pointer to the leaf Lb. The compression symbol of the character code eb is retrieved by the Huffman tree search and is stored in the compression buffer 3211.

On the other hand, if there is no character code that coincides and the two-branching tree search comes to an end, the character code to be compressed is not a higher-level character code and therefore, the character code to be compressed is divided into an upper eight bits and a lower eight bits. The two-branching tree search is executed with respect to the divided character code structure 1800 for the upper 8-bit divided character code. When a divided character code Dc1 ("c1" is the leaf number) that coincides is retrieved, the structure of the leaf Lc1 is accessed by the pointer to the leaf Lc1. The compression symbol of the divided character code Dc1 is retrieved using the Huffman tree search and is stored in the compression buffer 3211.

Continuously, the two-branching tree search is executed on the divided character code structure 1800 for the lower-8-bit divided character code. When a divided character code Dc2 ("c2" is the leaf number) that coincides is retrieved, the structure of the leaf Lc2 is accessed by the pointer to the leaf Lc2. The compression symbol of the divided character code Dc2 is retrieved using the Huffman tree search and is stored in the compression buffer 3211 subsequently to the compression symbol of the divided character code Dc1.

Figure 35:
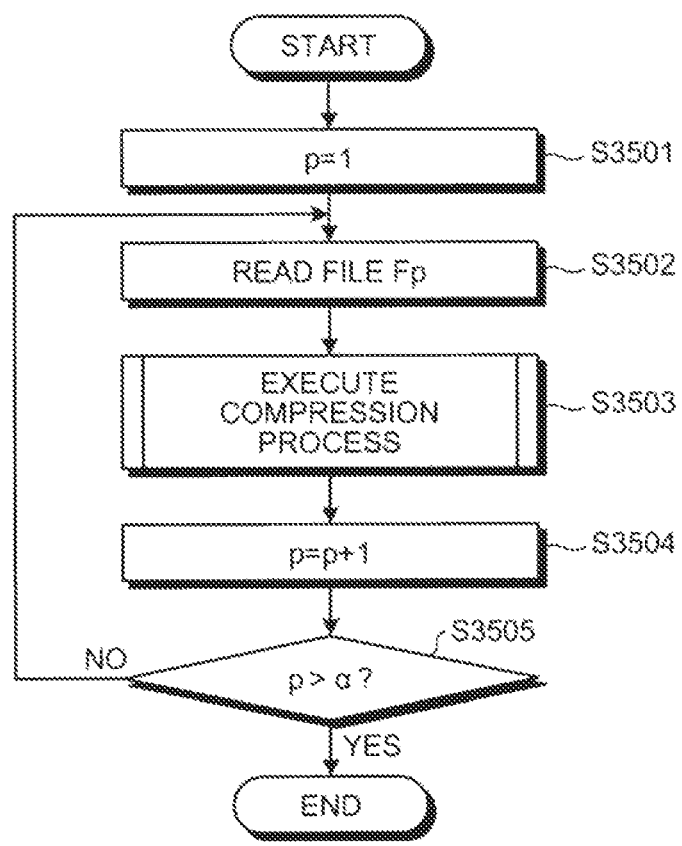
FIG. 35 is a flowchart of a file compression process procedure using the $2^m$-branching no-node Huffman tree, automatically executed by the information processing apparatus.

FIG. 35 is a flowchart of the file compression process procedure using the $2^m$-branching no-node Huffman tree H2, automatically executed by the information processing apparatus 500. The file number p is set to be p=1 (step S3501) and the file Fp is read (step S3502). The compression process is executed (step S3503) and the file number p is incremented (step S3504). Whether the file number p is p>α is □ determined (step S3505). "α" is the total number of files in the file group Fs. If it is determined that the file number p is not p>α (step S3505: NO), the procedure returns to step S3502. On the other hand, if it is determined that the file number p is p>α (step S3505: YES), the file compression process comes to an end.

Figure 36:
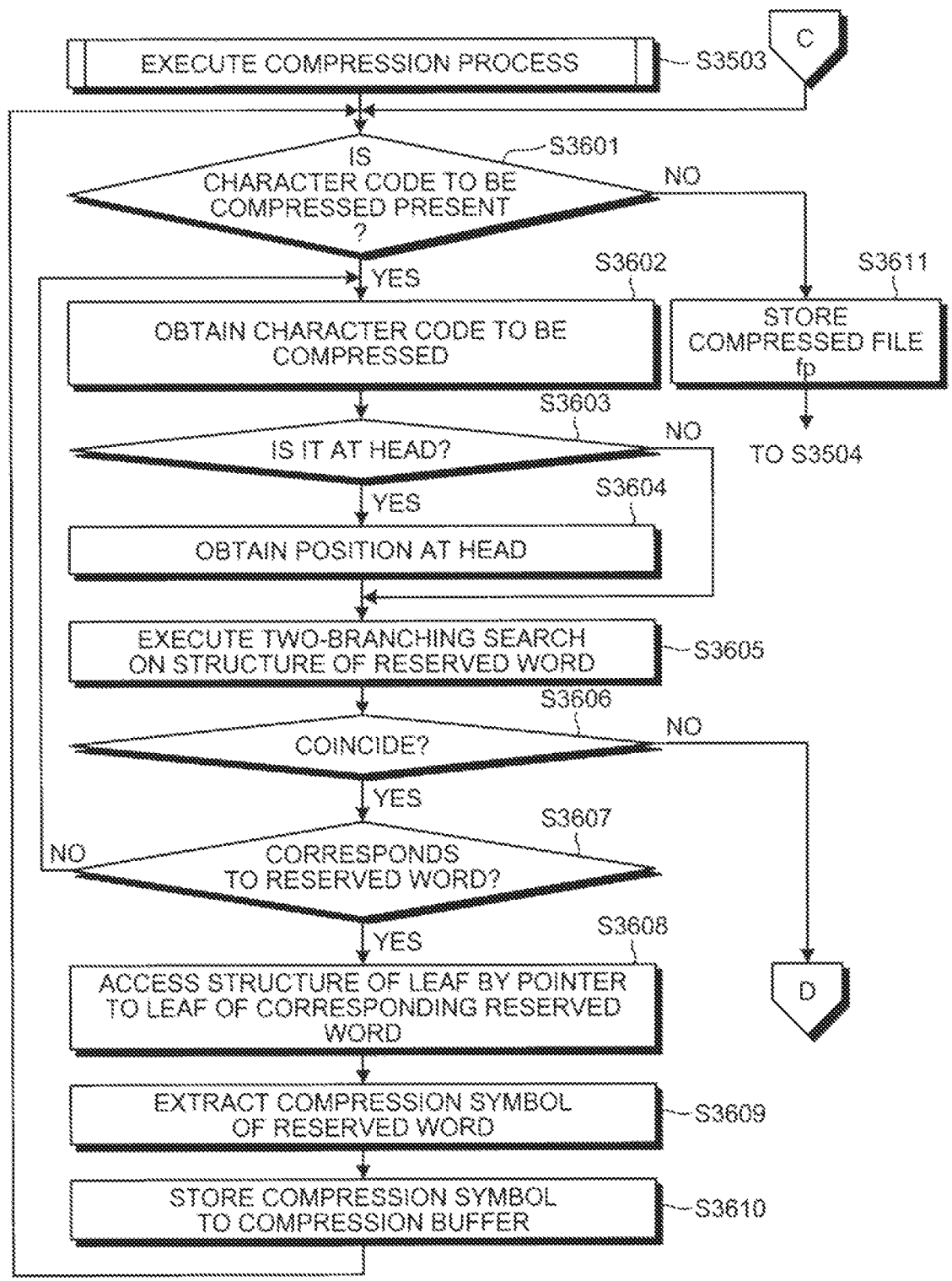
FIGS. 36 to 38 are flowcharts detailing a process procedure of the compression process (step S3503) depicted in FIG. 35.

FIG. 36 is a flowchart detailing the process procedure of the compression process (step S3503) depicted in FIG. 35. In FIG. 36, whether any character code to be compressed is present in the file group Fs is determined (step S3601). If it is determined that a character code to be compressed is present (step S3601: YES), the character code to be compressed is obtained and is set in the register (step S3602). Whether the character code to be compressed is at the head is determined (step S3603).

The "character code to be compressed at the head" refers to the character code of the first character that is not compressed. If it is determined that the character code to be compressed is at the head (step S3603: YES), the pointer that is the position of the character code to be compressed (the head position) in the file group Fs is obtained (step S3604) and the procedure moves to step S3605. On the other hand, if it is determined that the character code to be compressed is not at the head (step S3603: NO), the head position is not obtained and the procedure moves to step S3605.

The two-branching tree search is executed on the reserved word structure 1600 (step S3605). If the character code to be compressed coincides (step S3606: YES), whether the character code string that consecutively coincides corresponds to (the character code string of) the reserved word is determined (step S3607). If it is determined that the character code string does not correspond to the reserved word (step S3607: NO), the procedure returns to step S3602 and a subsequent character code is obtained as the character code to be compressed. In this case, the subsequent character code is not at the head and therefore, the head position is not obtained.

On the other hand, at step S3607, if it is determined that the character code string corresponds to the reserved word (step S3607: YES), the structure of the leaf L# is accessed by the pointer to the leaf L# of the corresponding reserved word (step S3608). The compression symbol is extracted of the reserved word stored in the structure of the leaf L# pointed (step S3609).

Thereafter, the compression symbol extracted is stored to the compression buffer 3211 (step S3610) and the procedure returns to step S3601. This loop is the flow of the compression process of the reserved word. At step S3601, if it is determined that no character code to be compressed is present (step S3601: NO), a compressed file fp formed by compression from the file Fp is output from the compression buffer 3211 and is stored (step S3611). The procedure moves to step S3504. On the other hand, if it is determined at step S3606 that the character code to be compressed does not coincide (step S3606: NO), the procedure enters the loop of the 16-bit character code compression process.

Figure 37:
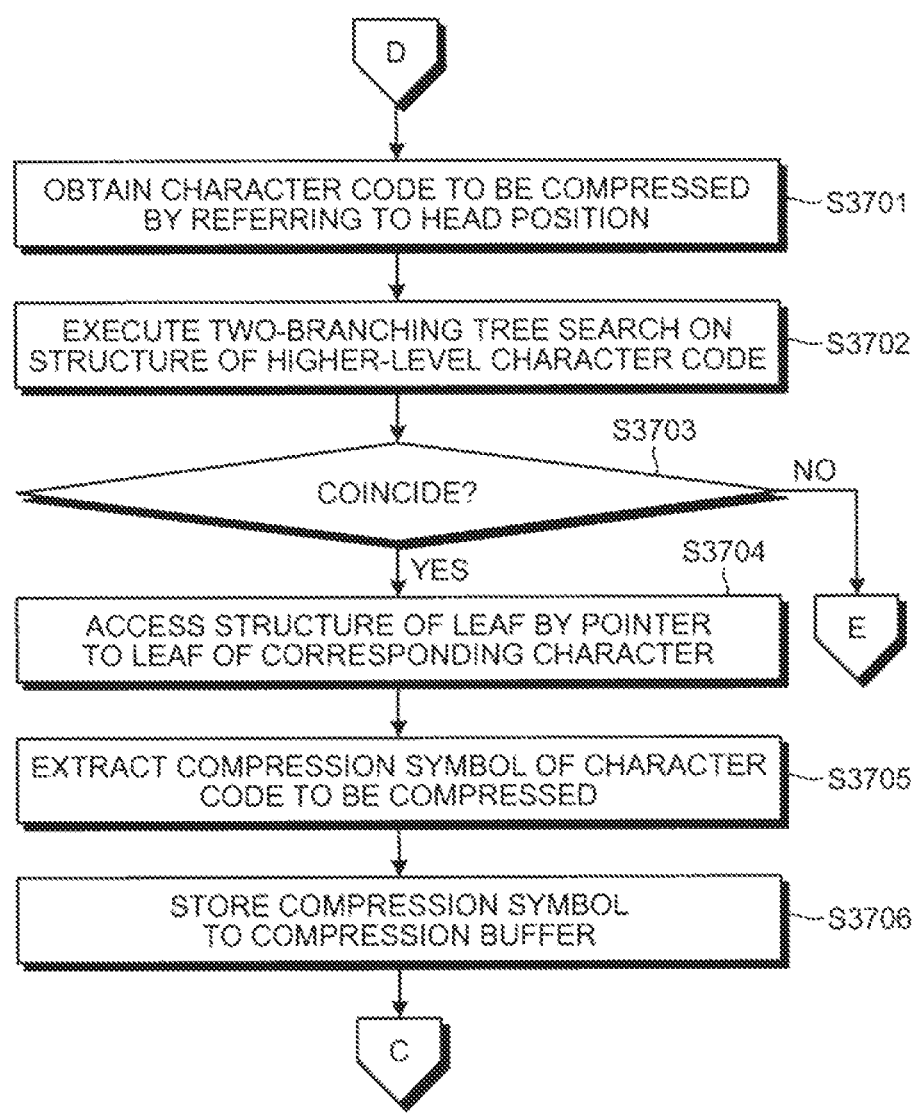

FIG. 37 is a flowchart detailing the process procedure of the compression process (step S3503) depicted in FIG. 35. In FIG. 37, the pointer at the head position obtained at step S3604 is referred to and the character code to be compressed is obtained from the file group Fs and is set in the register step S3701).

The two-branching tree search is executed on the higher-level character code structure 1700, for the character code to be compressed (step S3702). If it is determined that the character code to be compressed coincides (step S3703: YES), the structure of the leaf L# is accessed by the pointer to the leaf L# of the corresponding character (step S3704). Stored in the structure of the leaf L#, the compression symbol of the character code to be compressed is extracted (step S3705).

Thereafter, the retrieved compression symbol is stored to the compression buffer 3211 (step S3706) and the procedure returns to step S3601. This loop is the flow of the compression process of the 16-bit character code. On the other hand, if it is determined at step S3703 that no character code that coincides is present (step S3703: NO), the procedure enters the loop of the compression process of the divided character code.

Figure 38:
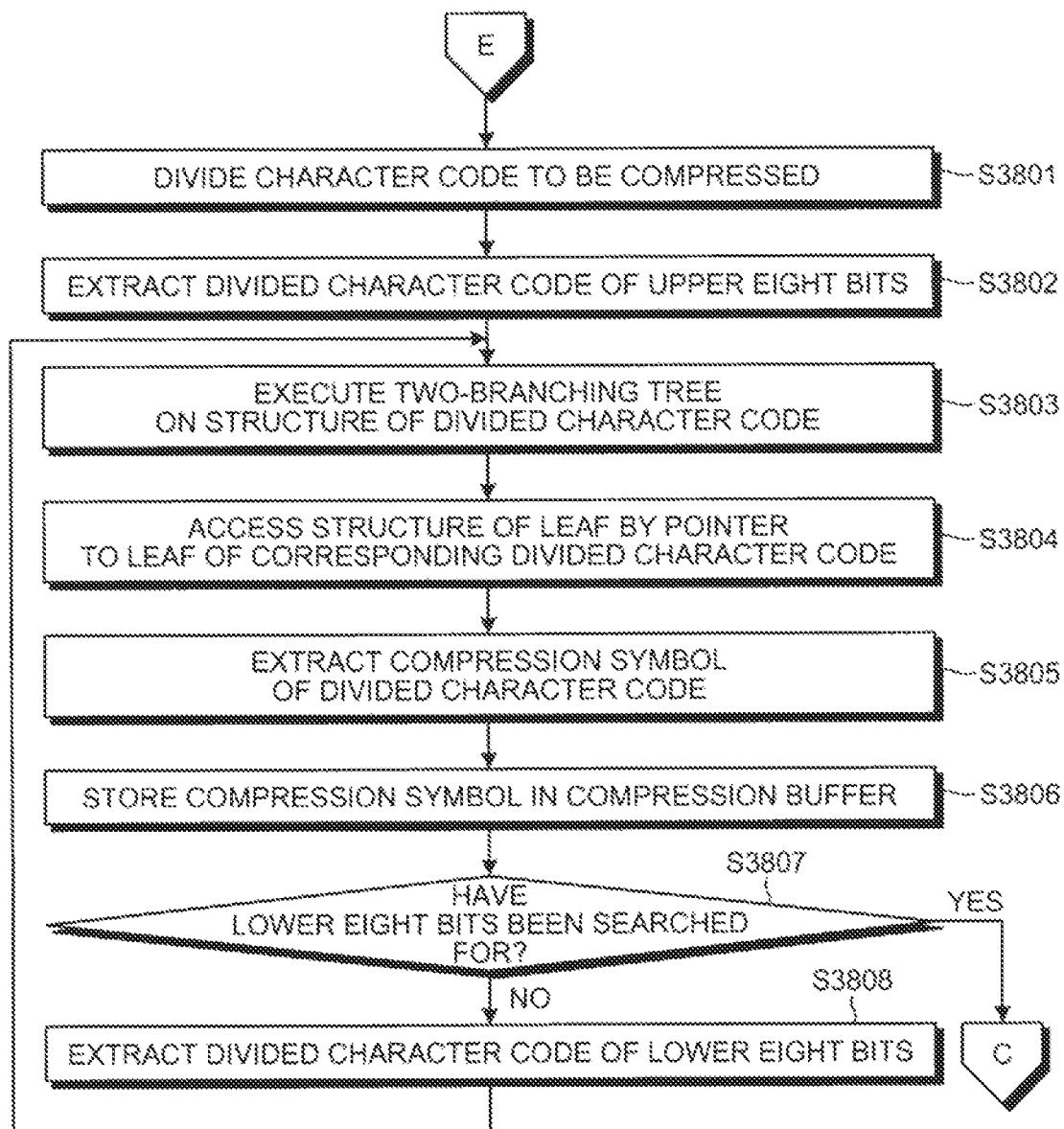

FIG. 38 is a flowchart detailing the process procedure of the compression process (step S3503) depicted in FIG. 35. In FIG. 38, the character code to be compressed is divided into an upper eight bits and a lower eight bits (step S3801) and the divided character code for the upper eight bits is extracted (step S3802). The two-branching tree search is executed on the divided character code structure 1800 (step S3803).

The structure of the leaf L# is accessed by the pointer to the leaf L# of the divided character code retrieved (step S3804). The compression symbol of the divided character code stored in the structure of the leaf L# pointed is extracted (step S3805). Thereafter, the compression symbol retrieved is stored in the compression buffer 3211 (step S3806).

Whether the lower eight bits have been searched for is determined (step S3807). If it is determined that the lower eight bits have not been searched for (step S3807: NO), the divided character code of the lower eight bits is extracted (step S3808) and steps S3803 to S3806 are executed. On the other hand, if it is determined that the lower eight bits have been searched for (step S3807: YES), the procedure returns to step S3601 and enters the loop of the compression process of the reserved word.

As described, in the compression process using the $2^m$-branching no-node Huffman tree H2, searching toward the root is not necessary because no internal node is present, and the character code stored in the structure of the leaf L# pointed to alone is extracted and written into the compression buffer 3211. Therefore, an increase in the speed of the compression process can be facilitated.

The structure of the leaf L# storing therein the character code to be compressed can be immediately identified by the reserved word structure 1600, the higher-level-character-code structure 1700, and the divided character code structure 1800. Therefore, no leaf of the $2^m$-branching no-node Huffman tree H2 needs to be searched for and an increase of the speed of the compression process can be facilitated. By dividing the lower-level character code into the upper bit code and the lower bit code, the 60,000 or more kinds of lower character codes can be compressed to compression symbols of only 256 kinds of divided character codes. Therefore, improvement of the compression rate can be facilitated.

Referring back to FIG. 32, the detecting unit 3205 to the compression symbol map compressing unit 3208 will be described. The detecting unit 3205 has a function of detecting an access to a leaf of the Huffman tree by the compressing unit 3200. More specifically, for example, access to the structure of the leaf L# by the Huffman tree searching unit 3203 is detected.

The compression symbol map identifying unit 3206 has a function of identifying the compression symbol map M# that corresponds to the character codes, etc., stored in the structure of the leaf L# from the compression symbol map group Ms. More specifically, for example, when the detecting unit 3205 detects access to the structure of the leaf L# by the Huffman tree searching unit 3203, the pointer from the structure of the leaf L# to the compression symbol map M is read. Stored in the structure of the leaf L#, the compression symbol map M that corresponds to the character codes, etc., is accessed by the pointer to the compression symbol map M read.

FIG. 39A is an explanatory diagram of the initial state of the compression symbol map group Ms. The compression symbol map group Ms has address items and bit string items. The address and the bit string are converted into records for each structure of the leaf L#, that is, for each of a higher-level character code, a reserved word, an upper-8-bit divided character code, and a lower-8-bit divided character code.

Category items of the address item each indicates the symbol category of the structure of the leaf L#. The address value of each of the address items indicates the address value of the structure of the leaf L#. Therefore, an address formed by combining the value of the category item and the address value is pointed to by the pointer to the compression symbol map M#.

The bit string item is configured by bit strings of the number of the files lined up in order of file number. The character codes, etc., designated by the address are present in the file of the file number whose bit value is "1". On the other hand, no character codes, etc., designated by the address are present in the file of the file number whose bit value is "0". In FIG. 39A, the initial state is depicted and therefore, the value of each of all the bit string is "0".

In FIG. 32, the compression symbol map updating unit 3207 has a function of updating the bit of the file number from "0" to "1". More specifically, the compression symbol map updating unit 3207 updates from "0" to "1", the bit of the file number of a file that is subject to compression processing, among the bit strings of the compression symbol map M# pointed to by the pointer to the compression symbol map M# of the compression symbol map group Ms.

FIG. 39B is an explanatory diagram of the compression symbol map group Ms after updating by the compression symbol map updating unit 3207. For example, FIG. 39B depicts that the character codes, etc., that correspond to the record in the first row are not present in the files F1 to F4 and are present in a file Fα.

The compression symbol map compressing unit 3208 has a function of compressing the compression symbol map group Ms after the updating depicted in FIG. 39B. The compression symbol map compressing unit 3208 has a bit string compressing unit 3281 and a non-compression area setting unit 3282. The bit string compressing unit 3281 compresses each bit string of the compression symbol map group Ms. When the total number a of files is huge (for example, α is α=10,000), there are many sections each having consecutive "0s" in the bit strings. In contrast, for the characters having high appearance frequencies, there are many sections each having consecutive "1s". Therefore, an appearance rate area that corresponds to the appearance rate of the character is set. The "appearance rate area" is a range of the appearance rate. A Huffman tree for compressing the compression symbol map group Ms is allocated corresponding to the appearance rate area.

Figure 40:
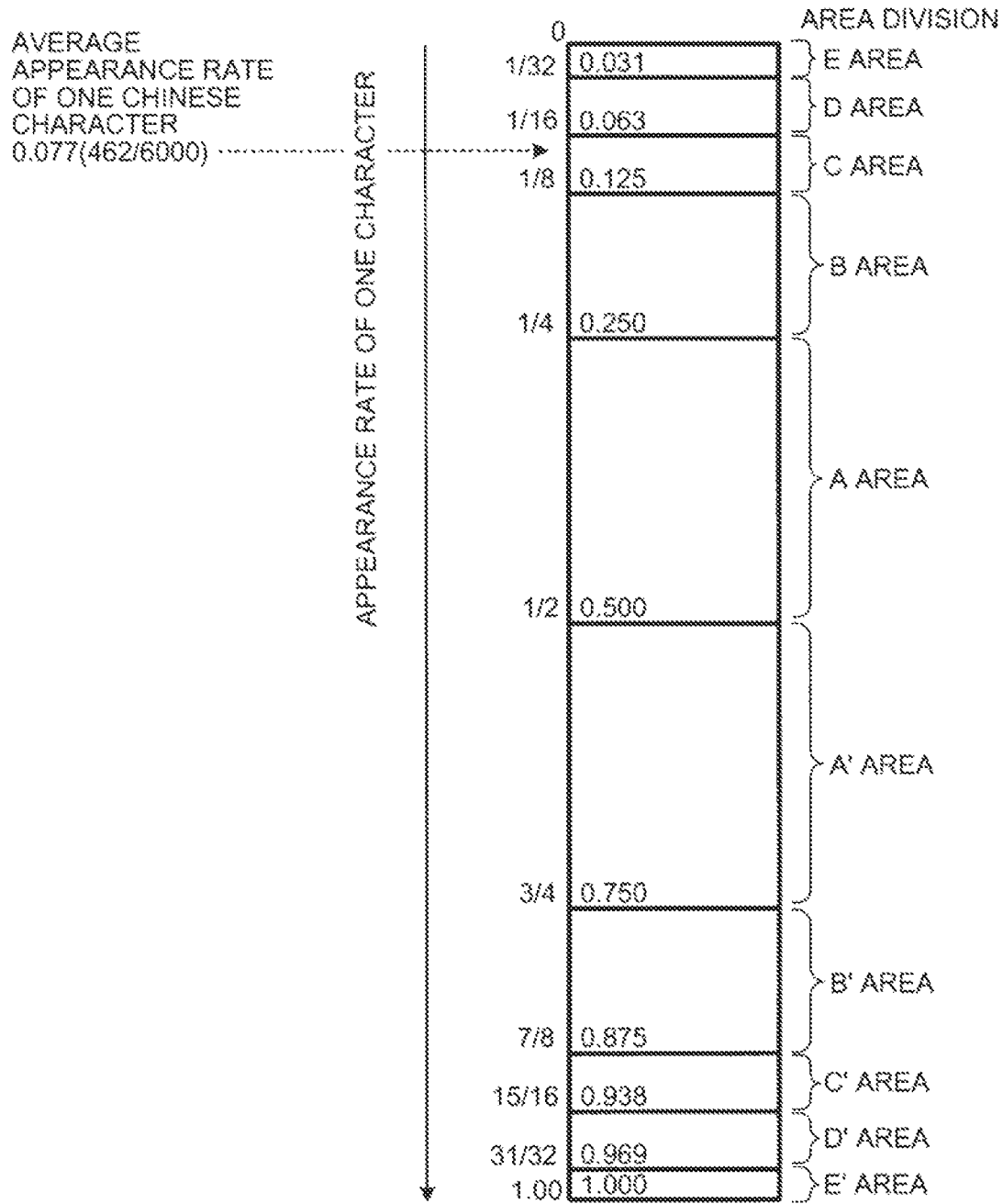
FIG. 40 is an explanatory diagram of the relation between the appearance rate and the appearance rate area.

FIG. 40 is an explanatory diagram of the relation between the appearance rate and the appearance rate area. Assuming that the appearance rate is within a range of 0 to 100%, as depicted in FIG. 40, the area may be divided into. A to E and A' to E' areas. Therefore, Huffman trees for the compression of the compression symbol map group Ms are allocated as compression patterns corresponding to appearance rate areas identified by the A to E and A' to E' areas.

FIG. 41 is an explanatory diagram of a compression pattern table having compression patterns by appearance rate area. The appearance rate areas are stored in the fourth area 2804 of the structure of the leaf L# as depicted in FIG. 28 and therefore, by designating the structure of the leaf L#, the compression pattern table is referred to and the compression pattern is identified. The A and A' areas are not compressed and therefore, no Huffman tree that is the compression pattern is present.

FIG. 42A is an explanatory diagram of the compression pattern for the B and B' areas. Sixteen kinds of Huffman trees become a compression pattern 4201.

FIG. 42B is an explanatory diagram of the compression pattern for C and C' areas. Sixteen+1 kinds of Huffman trees become a compression pattern 4202. Compared to the B and B' areas, in the compression pattern 4202, sections each having consecutive, "0s" or sections each having consecutive "1s" are more in view of probability. Therefore, a symbol word "00" is allocated to each of the bit strings each having 16 bits of consecutive "0s".

FIG. 42C is an explanatory diagram of the compression pattern for D and D' areas. Sixteen+1 kinds of Huffman trees become a compression pattern 4203. Compared to the C and C' areas, in the compression pattern 4203, sections each having consecutive "0s" or sections each having consecutive "1s" are more in view of probability. Therefore, a symbol word "00" is allocated to each of the bit strings each having 32 bits of consecutive "0s".

FIG. 42D is an explanatory diagram of the compression pattern for E and E' areas. Sixteen+1 kinds of Huffman trees become a compression pattern 4204. Compared to the D and D' areas, in the compression pattern 4204, sections each having consecutive "0s" or sections each having consecutive "1s" are more in view of probability. Therefore, a symbol word "00" is allocated to each of the bit strings each having 64 bits of consecutive "0s". As described, the number of consecutive "0s" each meaning that no character code is present is increased according to the appearance rate area and therefore, improvement of the compression efficiency of the compression symbol map Ms can be facilitated according to the appearance rate of a character code.

Figure 43:
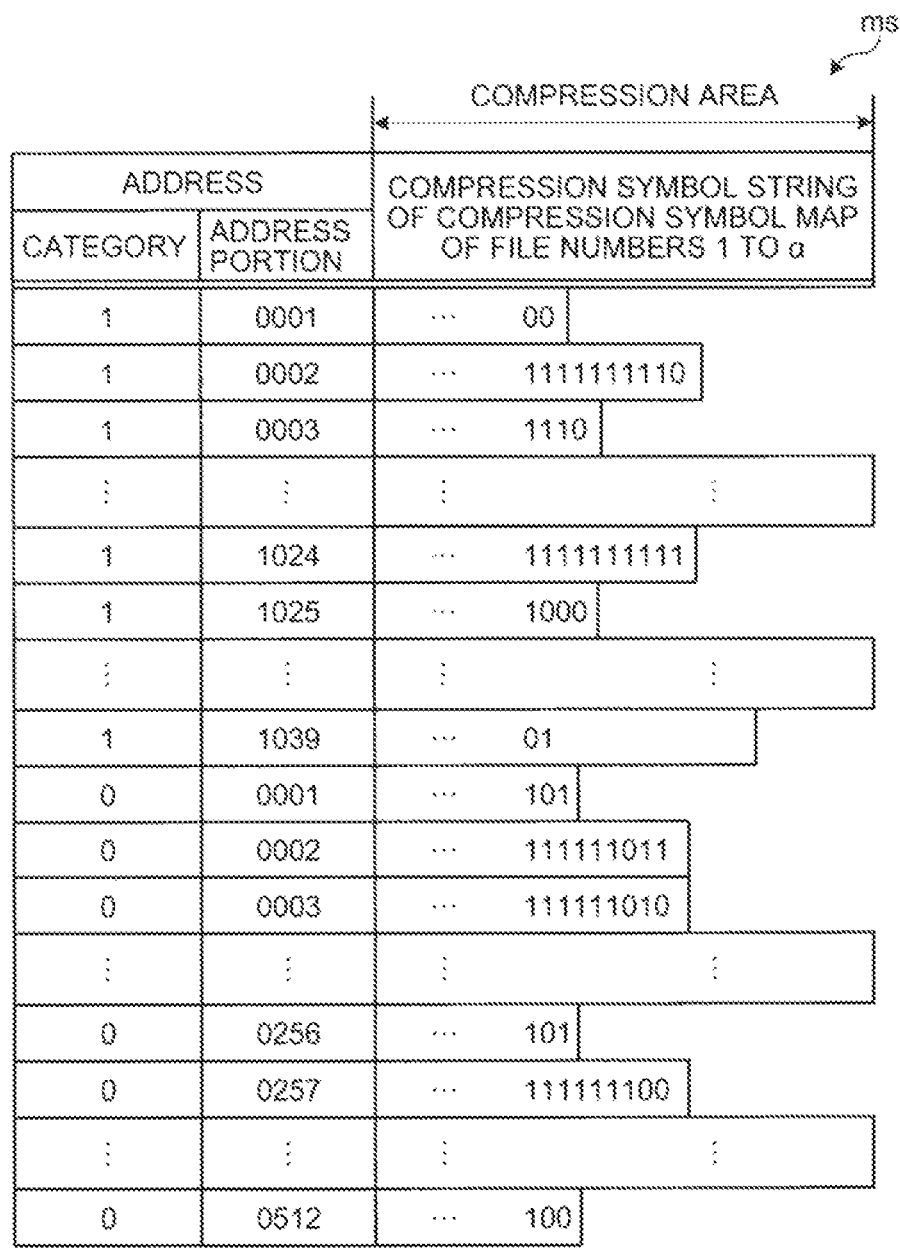
FIG. 43 is an explanatory diagram of the compression symbol map group compressed.

FIG. 43 is an explanatory diagram of the compression symbol map group Ms compressed. In the compression symbol map group Ms, the bit strings are compressed using compression patterns 4201 to 4204 depicted in FIGS. 42A to 42D for each record that corresponds to the structure of the leaf L#.

In FIG. 32, the non-compression area setting unit 3282 has a function of setting the non-compression area in the compression symbol map group Ms. More specifically, when addition of a file F is detected, the number is taken such that the file numbers p are sequentially arranged. The non-compression area is set having the bit strings that each indicate the presence or the absence of a character code in the added file for each character code, and that are arranged such that the bit strings are sequentially arranged according to the file numbers p of the file group Fs.

For example, in a case where the file F is added later, a bit string indicating the presence or the absence of the character needs to be also added to the compression symbol map group Ms when the added file Fβ is compressed. □ In the compression symbol map group Ms before the compression, the bit strings of the file numbers: 1 to α are compressed by the compression patterns 4201 to 4204 and their symbol lengths differ by record. The symbol lengths are variable and therefore, become the compression areas.

Therefore, as depicted in FIG. 43, the heads of the compression symbol strings (on the side of the file number α) are lined up while the tails are not. When the lining up of the bit strings are allocated from the side of the address item in order of file numbers: 1 to α, the bit string of the added file is inserted at the tail side of the compression symbol string and therefore, the compression symbol string and the bit string of the added file are not sequential. Therefore, the bit strings in the compression area of the compression symbol map group Ms are arranged in advance in descending order of file number p in the file group Fs from the head position to the tail position. The non-compression area setting unit 3282 sets a non-compression area between the pointer to the compression symbol map and the compression area in the compression symbol map group Ms.

FIG. 44 is an explanatory diagram of the addition of a bit string to the compression symbol map group ms compressed. As depicted in FIG. 44, the bit of the file number α is allocated on the side on which the compression symbol strings are lined up, among the file numbers 1 to α. Thereby, even if the bit strings of the file numbers 1 to α are compressed and even when the bit strings of the file numbers α+1 to β that are not compressed are inserted, the bit strings can be lined up in order of file number. Thereby, even when the bit strings of the file numbers 1 to α are compressed, no difference is present between the file number and the bit of the file added. Therefore, files can be sieved out accurately. The addition of the bit string of the file added is executed by the compression symbol map updating unit 3207.

FIG. 45 is an explanatory diagram of a deletion map. Some files are partially deleted of the file group Fs (the files F1 to Fβ). Sieving out a deleted file F is useless and therefore, a deletion map Md is prepared. The deletion map Md is a string of bits of the total number α of files (when addition is executed, β) and, in the initial state, all the bits are set to be "1".

When a deleted file is present, the value of the bit of the file number d of the deleted file in the deletion map Md is changed from "1" to "0". The deletion map Md is used only when the files are sieved out. Therefore, even if the bit of a file F is "1" for a character code in the compression symbol map group Ms, when the bit is "0" in the deletion map Md, the file F is not to be searched for. Updating of the deletion map Md is executed by the compression symbol map updating unit 3207.

A compression symbol map generation process will be described. The compression symbol map generation process is a process that is executed in parallel with the file compression process depicted in FIGS. 34 and 35. More specifically, with reference to FIG. 34, when the CPU 401 compresses the character code to be compressed, the CPU 401 accesses the structure of the leaf L#. The compression symbol map generation process is executed each time access is made to the structure of the leaf L# during the file compression process. Thereby, by only scanning the files F once, the compression of the files F and generation of the compression symbol map M of the characters that are present in the file F can simultaneously be executed. Therefore, an increase of the speed of the process can be facilitated. The initial state of the compression symbol map group Ms is as depicted in FIG. 39A.

Figure 46:
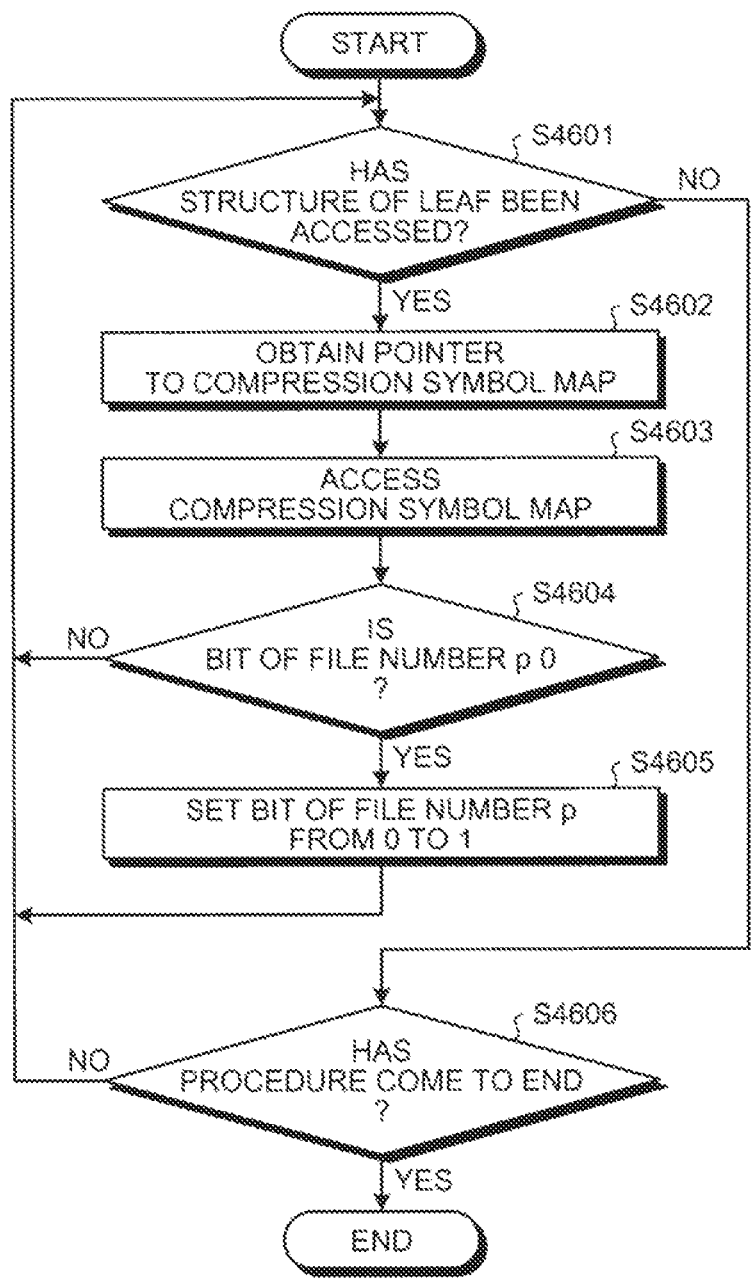
FIG. 46 is a flowchart of a procedure of a compression symbol map generation process.

FIG. 46 is a flowchart of procedure of the compression symbol map generation process. Whether any access is made to the structure of the leaf L# is determined (step S4601). If it is determined that the structure of the leaf L# has been accessed (step S4601: YES), the information (the symbol category and address value for the compression symbol map) in the fifth area 2805 of the accessed structure of the leaf L# is obtained (step S4602). An address formed by combining the symbol category obtained with the address value is the pointer to the compression symbol map M#. The corresponding compression symbol map M# is accessed by the pointer to the obtained compression symbol map M# (step S4603).

Whether the bit of the file number p at the time when the structure of the leaf L# is accessed at step S4601 is "0" is determined (step S4604). If it is determined that the bit is "0" (step S4604: YES), the bit of the file number p is set to be "1" from "0" (step S4605) and the procedure returns to step S4601. On the other hand, if it is determined at step S4604 that the bit is "1" (step S4604: NO), step S4605 is not executed and the procedure returns to step S4601.

If it is determined at step S4601 that the structure of the leaf L# has not been accessed (step S4601: NO), the procedure moves to step S4606. At step S4606, whether reading of the files comes to an end is determined (step S4606). If it is determined that the reading does not yet come to an end (step S4606: NO), the procedure returns to step S4601. On the other hand, if it is determined that the reading has come to an end (step S4606: YES), the compression symbol map generation process comes to an end. As described, by scanning only once the files F, the compression of the files F and the generation of the compression symbol map M of the characters present in the files F can simultaneously be executed. Therefore, an increase of the speed of the process can be facilitated.

The compression symbol map compression process will be described. As depicted in FIG. 39B, the compression symbol map compression process is a process of compressing the bit strings of the file numbers 1 to α that are the compression areas of the compression symbol map group Ms generated in the compression symbol map generation process. More specifically, the bit strings of the compression area of the compression symbol map group Ms are compressed using the compression pattern table depicted in FIG. 41 and the compression patterns (the Huffman trees for compression symbol map) depicted in FIGS. 42A to 42D. Thereby, the compression symbol map group Ms after the compression as depicted in FIG. 43 can be obtained. The compression symbol map compression process will be described.

Figure 47:
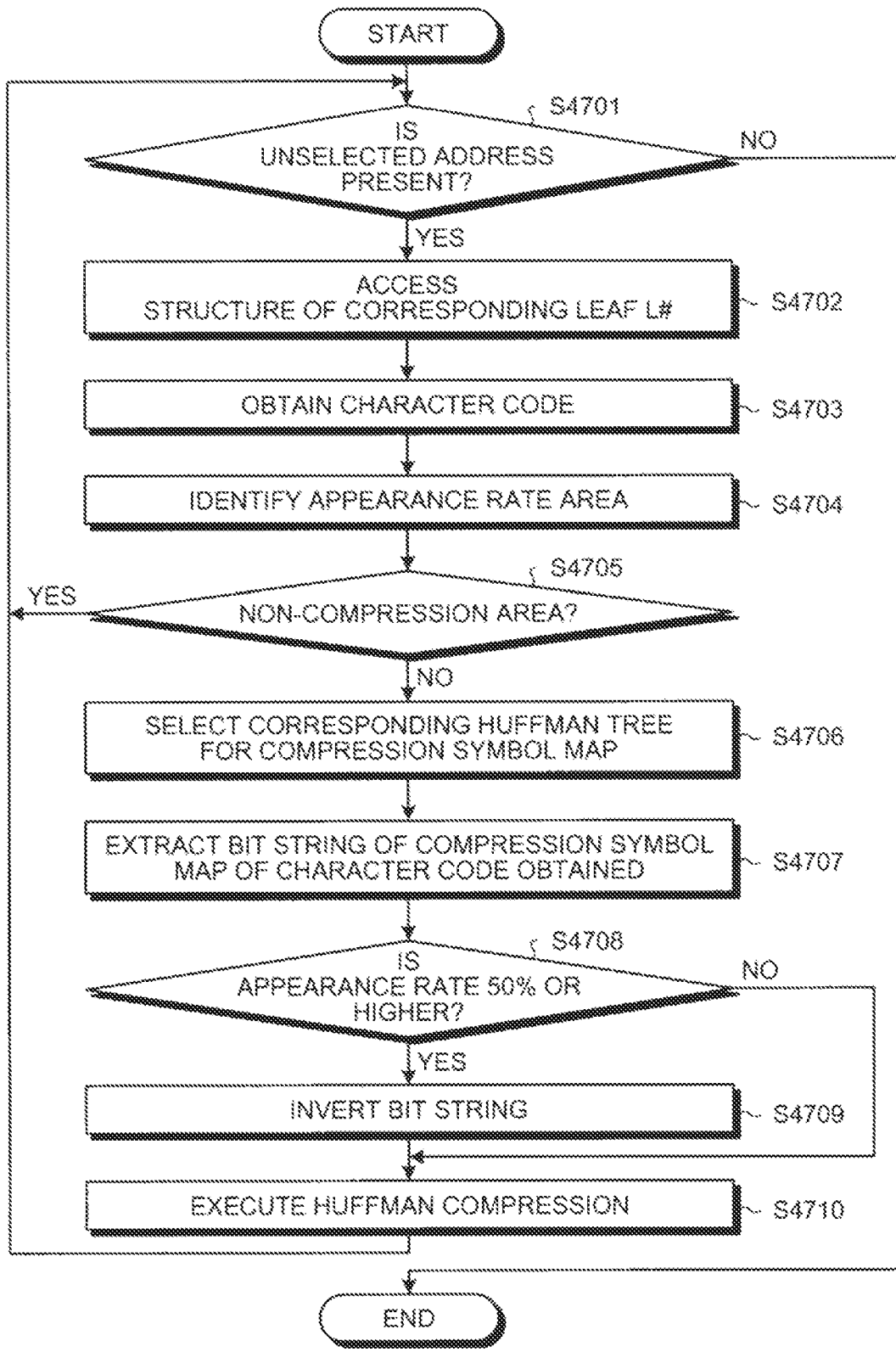
FIG. 47 is a flowchart of a procedure of a compression symbol map compression process.

FIG. 47 is a flowchart of the procedure of the compression symbol map compression process. In FIG. 47, whether any unselected address (pointer to the compression symbol map) is present in the compression symbol map group Ms is determined (step S4701). If it is determined that an unselected address is present (step S4701: YES), an unselected address is selected and the structure of the leaf L# is accessed (step S4702), and the character code is obtained from the first area 2801 of the structure of the leaf L# (step S4703). The appearance rate area is obtained from the fourth area 2804 of the structure of the leaf L# that is accessed and thereby, the appearance rate area of the character code obtained is identified (step S4704).

Thereafter, the compression pattern table of FIG. 41 is referred to and whether the appearance rate area identified is a non-compression area (for example, the appearance rate area A or A') is determined (step S4705). If it is determined that the appearance rate area is a non-compression area (step S4705: YES), the procedure returns to step S4701 and the next address is selected.

On the other hand, if it is determined that the appearance rate area is not a non-compression area (step S4705: NO), the corresponding Huffman tree for the compression symbol map is selected from the Huffman trees for the compression symbol map depicted in FIGS. 42A to 42D by the appearance rate area, identified (step S4706). A bit string is extracted, in the compression area in the compression symbol map M of the character code obtained to be compressed (step S4707).

Whether the appearance rate of the character code obtained is at least 50% is determined (step S4708). The "appearance rate" is a value obtained by using the number of all files in the file group Fs as the population (denominator) and the number of files each having the corresponding character code or reserved word present therein as the numerator. The appearance rate area is determined according to the appearance rate (see FIG. 40) and therefore, if the appearance rate areas are A to E, it is determined that the appearance rate of the character code obtained is not 50% or higher. On the other hand, if the appearance rate areas are A' to E', it is determined that the appearance rate of the character code obtained is 50% or higher.

If it is determined that the appearance rate is 50% or higher (step S4708: YES), the bit string extracted at step S4706 is inverted to improve the effect of the compression (step S4709). For example, if the bit string extracted is "1110", the number of "0s" is increased by inverting "1110" into "0001". The bit string after the inversion is compressed using the Huffman tree selected at step S4706 (step S4710) and the procedure returns to step S4701. As described, by inverting the bit string, the Huffman tree for the compression symbol map of the appearance rate areas A' to E' does not need to be prepared and therefore, saving of the memory can be facilitated.

On the other hand, if it is determined at step S4708 that the appearance rate is not 50% or higher (step S4708: NO), the bit string extracted at step S4707 is compressed using the Huffman tree selected at step S4706 (step S4710) without executing the bit string inversion (step S4709) and the procedure returns to step S4701. If it is determined at step S4701 that no unselected address is present (step S4701: NO), the compression symbol map compression process comes to an end.

According to the procedure of the compression symbol map compression process, for each address, the bit strings of the file numbers 1 to α are compressed according to the respective appearance rates thereof and the compression symbol map group Ms after the compression as depicted in FIG. 43 can be obtained.

An added file compression process will be described. The added file compression process is a process of, when files F are added later, adding bit strings of the added files for each character code (strictly, an address that is the pointer to the compression symbol map) for the added files. More specifically, by adding the bit strings of the file numbers α+1 to β, the compression symbol map group Ms as depicted in FIG. 44 can be obtained. Taking an example of the compression symbol map group Ms after the compression, the procedure of the added file compression process will be described. The file numbers α+1 to β are given to the added β files.

Figure 48:
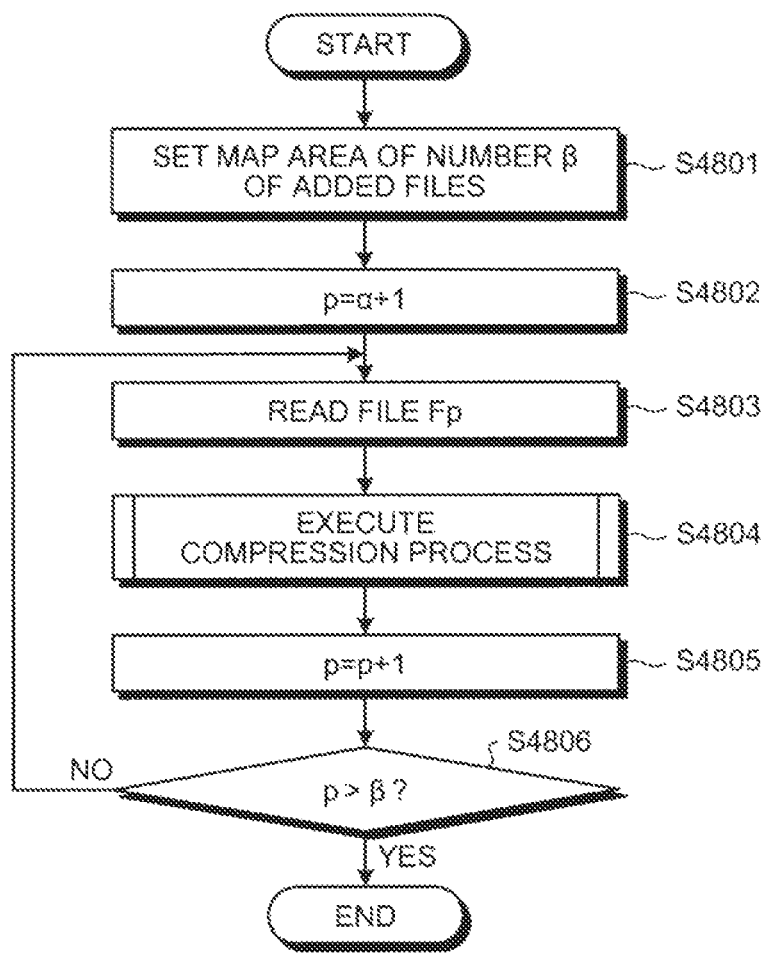
FIG. 48 is a flowchart of a procedure of an added file compression process.

FIG. 48 is a flowchart of the procedure of the added file compression process. Map areas of the number of the β added files are set (step S4801). More specifically, the bit strings of the added files (whose initial values each are "0") are secured between the address of the compression symbol map group Ms and the compression symbol strings of the file numbers 1 to α.

The file number p is changed to p=α+1 (step S4802) and the file Fp is read (step S4803). The compression process is executed (step S4804). The compression process (step S4804) is a process identical to the compression process (step S3503) depicted in FIGS. 35 and 36. After the compression process (step S4804), the file number p is incremented (step S4805) and whether the file number p is p>β is determined (step S4806). If it is determined that the file number p is not p>β (step S4806: NO), the procedure returns to step S4803. On the other hand, if it is determined that the file number p is p>β (step S4806: YES), the added file compression process comes to an end.

A deletion map updating process will be described. The deletion map updating process is a process of updating the bit selected in the deleted map Md depicted in FIG. 45.

Figure 49:
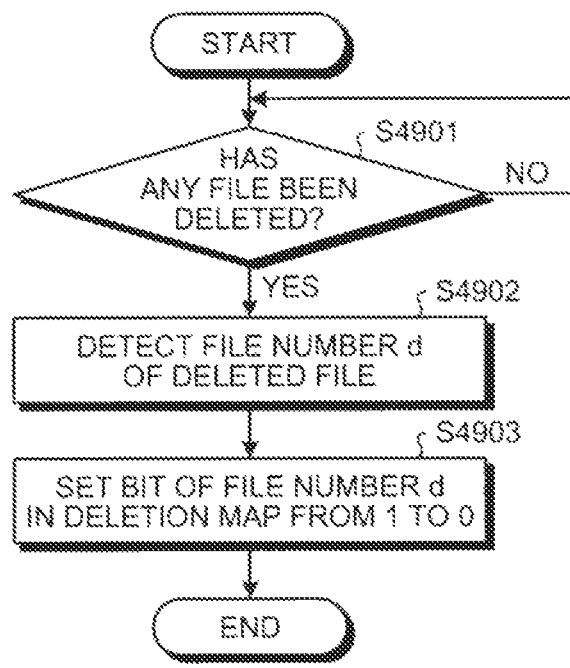
FIG. 49 is a flowchart of a procedure of a deletion map updating process.

FIG. 49 is a flowchart of the procedure of the deletion map updating process. File deletion is waited for (step S4901: NO). When the file deletion is executed (step S4901: YES), the file number d of the file deleted is detected (step S4902). The bit of the file number d in the deletion map Md is updated from "1" to "0" (step S4903). Thereby, the deletion map updating process comes to an end. The deletion map Md is used to screen the files. Therefore, even if the bit of a file for a character is "1" in the compression symbol map group Ms, the file is not to be searched for when the bit is "0" in the deletion map Md.

Figure 50:
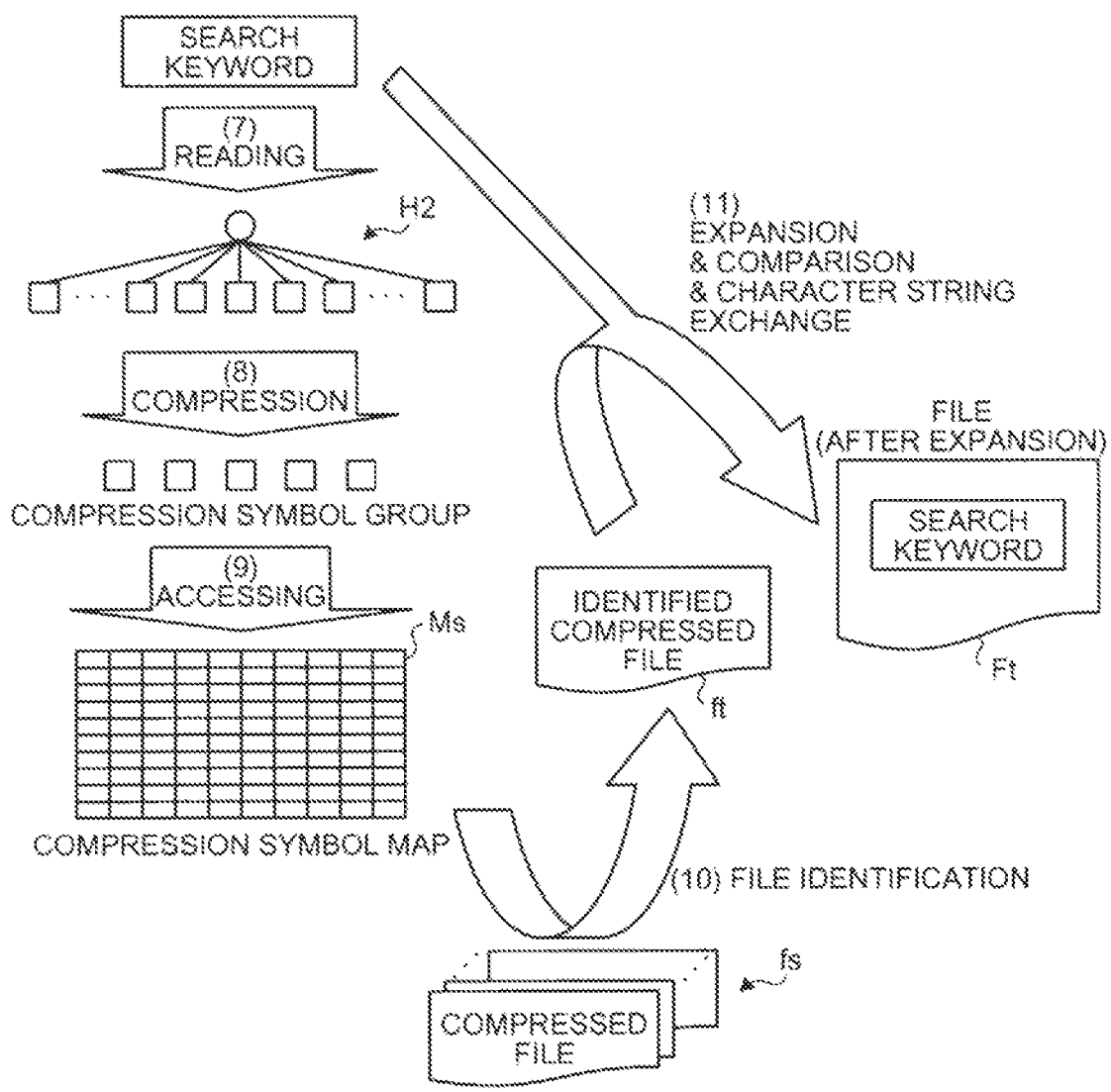
FIG. 50 is an explanatory diagram of a process of searching for a compressed file and expansion of the file.

FIG. 50 is an explanatory diagram of the flow of the process of searching for the compressed file f and expansion to the file F. In FIG. 50: (7) an information search apparatus accepts and reads an input of search keywords; (8) the compression symbol group is obtained by compressing the character codes of the characters that constitute the search keywords by the no-node Huffman tree H2, and (9) the pointer from the structure of the leaf L# that corresponds to each compression symbol, to the compression symbol map is obtained and the compression symbol map group Ms is accessed.

For the compression symbol map group Ms, (7) triggered by the reading of the search keywords, the compression symbol map group Ms is expanded by the Huffman tree for the compression symbol map and the compression symbol map group Ms is generated.

(10) By AND-computing for each file number p the bit string of the compression symbol map M of each character code, the compressed file f (identified compressed file ft) including all the characters constituting the search keywords is identified. Thereby, screening files for the search keywords can be executed on the compressed file group fs as it is.

(11) Finally, the identified compressed file ft is expanded in (9) using the no-node Huffman tree H2 and the character strings in the file F expanded (expanded file Ft) and the search keywords are compared with each other and the character strings that coincide are character-string-exchanged such as highlighted displaying. Thereby, the expansion of, the compressed file f and the determination of the coincidence (comparison) of the search keywords can be executed at the series of process steps.

Figure 51:
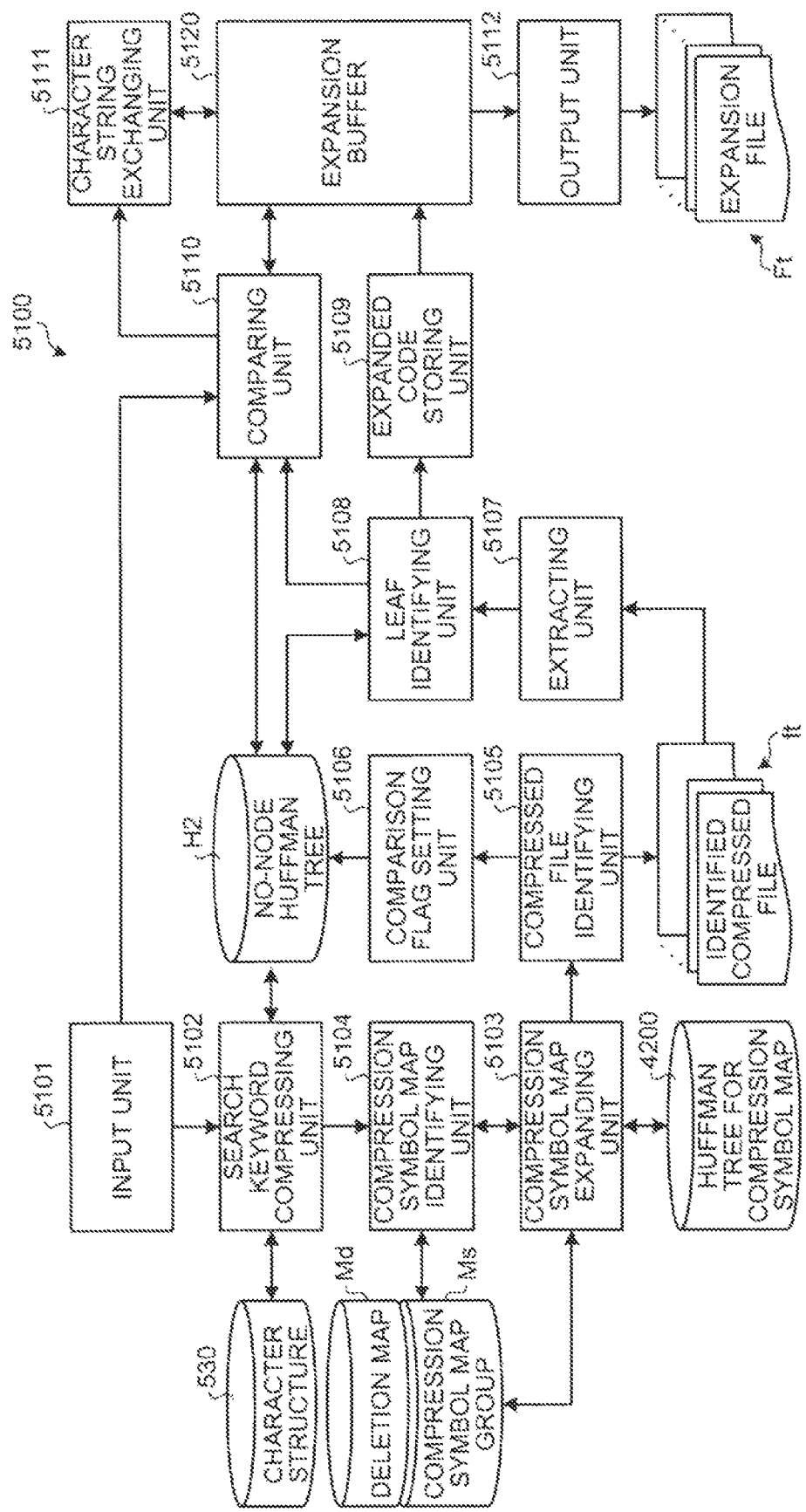
FIG. 51 is a block diagram of a functional configuration of an information search apparatus according to the embodiment.

FIG. 51 is a block diagram of the functional configuration of the information search apparatus according to the embodiment. FIG. 51 depicts the functional configuration to execute the processes (7) to (11) depicted in FIG. 50. In FIG. 51, the information search apparatus 5100 includes an input unit 5101, a search keyword compressing unit 5102, a compression symbol map expanding unit 5103, a compression symbol map identifying unit 5104, a compressed file identifying unit 5105, a comparison flag setting unit 5106, an extracting unit 5107, a leaf identifying unit 5108, an expansion code storing unit 5109, a comparing unit 5110, a character string exchanging unit 5111, and an output unit 5112.

Functions of the input unit • 5101 to the output unit 5112 are implemented by causing the CPU 401 to execute a program stored in a storage medium such as the RAM 403, the magnetic disk 405, and the optical disk 407 depicted in FIG. 4, or by using the I/F 409. A function of an expansion buffer 5120 is implemented by using a storage medium such as the RAM 403, the magnetic disk 405, and the optical disk 407 depicted in FIG. 4. The information search apparatus 5100 may be the same apparatus as the information processing apparatus 500 and may be a different apparatus therefrom.

The input unit 5101 has a function of accepting an input of the search keywords. The input unit 5101 is the function that corresponds to (7) depicted in FIG. 50.

The search keyword compressing unit 5102 has a function of compressing the search keywords. The search keyword compressing unit 5102 has a function that corresponds to (8) depicted in FIG. 50. More specifically, as depicted in FIG. 34, the search keywords (character code strings to be compressed) are sequentially compressed. The character structure 530 is referred to and a pointer to the leaf L# is identified for each character code that constitutes the search keywords input via the input unit 5101. The structure of the leaf L# is accessed by the pointer to the leaf L# identified, and the compression symbol stored in the structure of the leaf L# accessed is extracted. The compression symbol group of the search keyword compressed is stored in the compression buffer.

The compression symbol map expanding unit 5103 has a function of expanding the compression symbol map group Ms that is applied with the compression process. More specifically, triggered by the input of the search keywords, the compression symbol strings (see FIGS. 43 and 44) of the compression symbol map of the file numbers 1 to α in the compression symbol map group Ms are Huffman-expanded by the Huffman tree for the compression symbol map used for the compression. Thereby, the compression symbol map group Ms can be restored.

The compression symbol map identifying unit 5104 has a function of identifying the compression symbol map M that corresponds to the character codes of the characters constituting the search keywords of the compression symbol map group Ms. The compression symbol map identifying unit 5104 corresponds to (9) depicted in FIG. 50. The compression symbol map identifying unit 5104 obtains the pointer to the compression symbol map stored in the structure of the leaf L# accessed when the search keywords are compressed, and the corresponding compression symbol map M is accessed by the pointer to the compression symbol map obtained.

The compressed file identifying unit 5105 has a function of identifying the compressed file that includes all the compression symbol groups compressed by the search keyword compressing unit 5102 from the compressed file group, by referring to the compression symbol map M identified by the compression symbol map identifying unit 5104. The compressed file identifying unit 5105 corresponds to (10) depicted in FIG. 50. The compressed file identifying unit 5105 AND-computes the bit of each of the character codes that constitute the search keywords for each compressed, file. When the result of the AND-computation is "1", all the characters constituting the search keywords are included in the compressed file fp of the file number p. Thereby, screening of the compressed file group Fs can be executed.

FIG. 52 is an explanatory diagram of exemplary identification by the compressed file identifying unit 5105. In FIG. 52, a search keyword is " 増殖細胞 " as an example and the compression symbol maps M identified by the compression symbol map identifying unit 5104 are compression symbol maps M1 to M4. In FIG. 52, to facilitate understanding, the number of files α is α=4 and the number of added files β is β=0.

The bit strings of the compression symbol maps M1 to M4 and the deletion map Md are AND-computed in the row of each file number. In the row of the file number 1, all of " 増 ", " 殖 ", " 細 ", and " 胞 " are not present and therefore, the result of the AND-computation is "0". In the row of the file number 2, though all of " 増 ", " 殖 ", " 細 ", and " 胞 " are present, the file F2 is deleted and therefore, the bit of the deletion map Md is "0". Therefore, the result of the AND-computation is "0". In the row of the file number 3, all of " 増 ", " 殖 ", " 細 ", and " 胞 " are present and the bit of the deletion map Md is "1". Therefore, the result of the AND-computation is "1". In the row of the file number 4, " 増 ", " 細 ", and " 胞 " are not present and therefore, the result of the AND-computation is "0". Thereby, in the example of FIG. 52, the compressed file f3 of the file number 3 is finally selected, among the compressed files f1 to f4. The compressed symbol string in the compressed file f identified by the compressed file identifying unit 5105 is written by the CPU 401 into its internal register or an external buffer.

The comparison flag setting unit 5106 has a function of setting a comparison flag in the structure of the leaf L# to be "ON" when the structure of the leaf L# is accessed by the compressed file identifying unit 5105. The comparison flag is a flag that, when a character code that corresponds to the structure of the leaf L# is stored in the expansion buffer 5120, determines whether the character code is compared to the character codes in the search keywords to be compared. When the comparison flag is ON, the comparison is executed and, when the comparison flag is OFF, no comparison is executed. The default is OFF and, when the search result is obtained, the flag is reset to OFF. Thereby, comparison can be executed only with the character code of the structure of the leaf L# whose comparison flag is ON. Therefore, useless comparison can be prevented.

The extracting unit 5107 has a function of extracting a compression symbol string having the same length as that of the pointer to the leaf L# from the compressed file f identified by the compressed file identifying unit 5105. The compression symbol string extracted coincides with any of the pointers of the pointer group to the leaf L# stored in the root structure cell C(1, 1).

The leaf identifying unit 5108 has a function of identifying the structure of the leaf L# by the no-node Huffman tree H2 based on compression symbol string extracted by the extracting unit 5107. More specifically, for example, the leaf identifying unit 5108 searches for the pointer to the leaf L# that coincides with the branch number including the compression symbol extracted, in the root structure cell C(1, 1) of the no-node Huffman tree H2 and, when the pointer is retrieved, accesses the structure of the leaf L# that is the pointing destination through one path.

For example, the compression symbol included in the structure of the leaf L1 is "0000" and the pointers L1P(1) to L1P(256) to the leaf L1 that point the leaf L1 are "000000000000" to "000011111111". Therefore, when the pointers to the leaf L# including the compression symbol "0000" extracted are "000000000000" to "000011111111", the leaf identifying unit 5108 accesses the structure of the leaf L1 to which the extracted pointers point.

The expansion code storing unit 5109 has a function of extracting the character codes, etc., that are stored in the structure of the leaf L# accessed by the leaf identifying unit 5108 and storing the character codes, etc., in the expansion buffer 5120 as expansion codes. More specifically, for example, in the above example, the structure of the leaf L1 is accessed and therefore, a character code e1 stored in the third area 2803 of the structure of the leaf L1 is extracted as the expansion code. The expansion code extracted is written into the expansion buffer 5120. A specific example of the storage of the expansion code will be described.

FIGS. 53A to 53E are explanatory diagrams of the specific example of the expansion process by the extracting unit 5107, the leaf identifying unit 5108, and the expansion code storing unit 5109 using the $2^m$-branching no-node Huffman tree H2. FIGS. 53A to 53E depict an example of expanding the compression symbol string depicted in FIG. 33B. In the expansion process, the compression symbol string is set in the register and the compression symbol is extracted by the mask pattern. The compression symbol extracted is searched for from the root of the $2^m$-branching no-node Huffman tree H2 through one path (an access equivalent to one branch). The character code stored in the structure of the leaf L# accessed is read and is stored in the expansion buffer 5120.

The mask position of the mask pattern is off-set to extract the compression symbol. The initial value of the mask pattern is set to be "0xFFF00000". The mask pattern is a bit string whose 12 bits from its head are "1" and whose 20 bits subsequent thereto are "0".

The CPU 401 calculates a bit address "abi", a byte offset "byos", and a bit offset "bios". The bit address abi is a value that indicates the bit position of the compression symbol extracted and the current bit address abi is a value obtained by adding a compression symbol length leg of the compression symbol obtained at the previous extraction to the previous bit address abi. In the initial state, the bit address abi is abi=0.

The byte offset byos is a value that indicates a byte border of the compression symbol string retained in the memory and is obtained as the quotient of bit address abi/8. For example, when the byte offset byos is byos=0, the compression symbol string from the head stored in the memory is set in the register and, when the byte offset byos is byos=1, the compression symbol string from the first byte at the head stored in the memory is set in the register.

The bit offset bios is a value to offset the mask position ("FFF") of the mask pattern and is the remainder of bit address abi/8. For example, when the bit offset bios is bios=0, the mask position is not shifted and the mask pattern is "0xFFF00000". On the other hand, when the bit offset bios is bios=4, the mask position is shifted by four bits toward the tail and the mask pattern is "0x0FFF0000".

The number of register shifts is the number of bits by which the compression symbol string in the register after the AND-computation with the mask pattern is shifted toward the tail and is obtained according to rs=32-12-bios. Due to this shifting, the bit string of m bits from the tail of the register after the shifting is extracted as an object bit string. After the object bit string is extracted, the register is cleared.

In FIGS. 53A to 53E, the memory retains the compression symbol string depicted in FIG. 34. Blocks in the memory of FIGS. 53A to 53E each represent a bit string of one byte and a digit therein indicates the byte position that is the byte border.

Figure 53A:
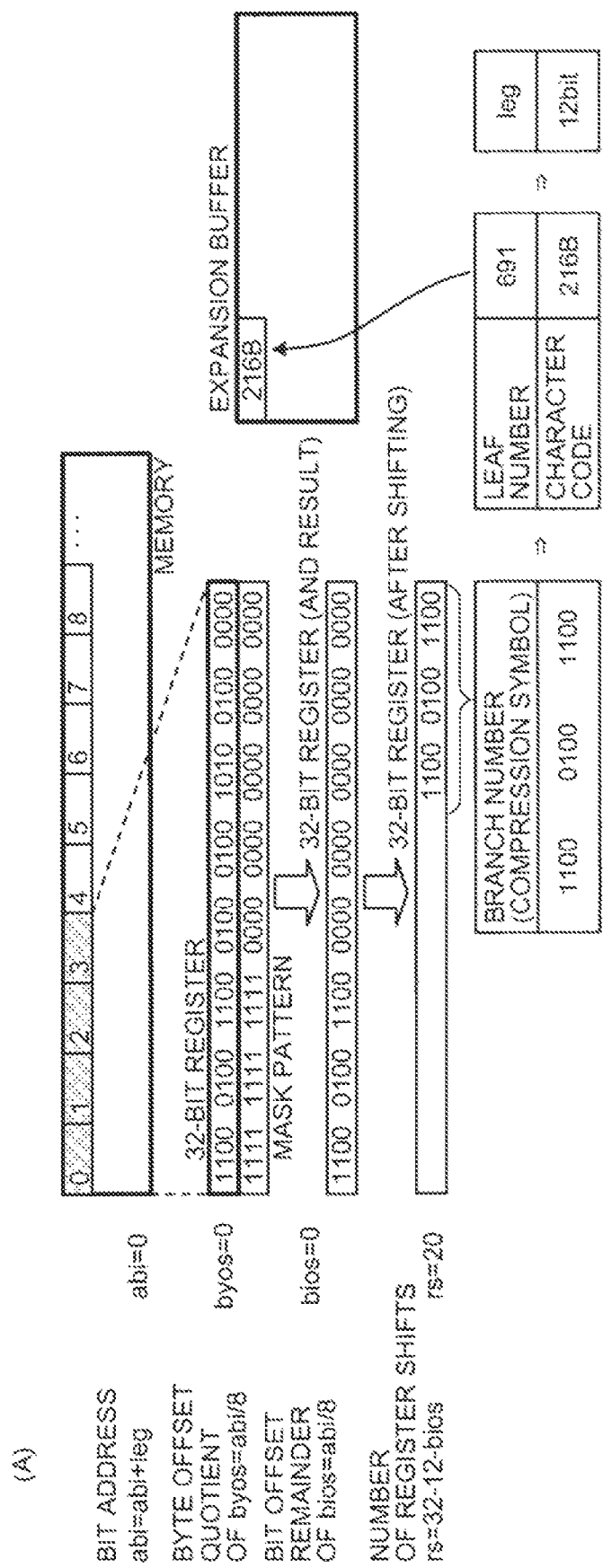

FIG. 53A depicts the initial state (the state of (A)). In (A), due to the bit address abi that is abi=0, the byte offset byos is byos=0 and the bit offset bios is bios=0. Due to the byte offset byos that is byos=0, a compression symbol string of four bytes (highlighted in FIG. 53A) from the head of the compression symbol string retained in the memory is set in the register.

Due to the bit offset bios that is bios=0, the mask pattern is "0xFFF00000". Therefore, an AND result is obtained by logical-product (AND) computing the compression symbol string set in the register and the mask pattern "0xFFF00000".

Due to the bit offset bios that is bios=0, the number of register shifts rs is rs=32-m-bios=32-12-0=20. Therefore, the AND result in the register is shifted by 20 bits toward the tail. Due to this shifting, "110001001100" is left in the register and therefore, the 12 bits from the tail are extracted as the object bit string. In this case, "110001001100" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the extracted object bit string "110001001100" is searched for in the root structure cell C(1, 1) of the no-node Huffman tree H2. In this case, one pointer in the pointer group to the leaf L3421 coincides and therefore, the corresponding pointer to the leaf L3421 is read and the structure of the leaf L3421 is accessed.

A character code "0x216B" (that corresponds to the character: "☆") is stored in the structure of the leaf L3421 and therefore, the character code "0x216B" is extracted and is stored in the expansion buffer 5120. The compression symbol length leg (=12 bits) of the character code "0x2168" is also stored in the structure of the leaf L3421 and therefore, the compression symbol length leg of the character code "0x216B" is also extracted. The bit address abi is updated using the compression symbol length leg extracted. In this case, the bit address abi after the updating is abi=0+12=12.

FIG. 53B depicts the expansion process (the state of (B)) executed when the register is shifted by the byte offset bios from the state of (A) depicted in FIG. 53A. The bit address abi of (A) that is the previous session is abi=0 and the compression symbol length leg thereof is 12 bits and therefore, the bit address abi in (B) is abi=12 bits.

Further, due to the bit address abi that is abi=12, the byte offset byos is byos=1 and the bit offset bios is bios=4. Due to the byte offset byos that is byos=1, a compression symbol string of four bytes (highlighted in drawing) from the first byte from the head of the compression symbol string retained in the memory is set in the register.

Due to the bit offset bios that is bios=4, the mask pattern is "0x0FFF0000". Therefore, an AND result is obtained by logical-product (AND) computing the compression symbol string set in the register and the mask pattern "0x0FFF0000".

Due to the bit offset bios that is bios=4, the number of register shifts rs is rs=32-m-bios=32-12-4=16. Therefore, the AND result in the register is shifted by 16 bits toward the tail. Due to this shifting, "0000010001001010" is left in the register and therefore, the 12 bits from the tail are extracted as the object bit string. In this case, "010001001010" is extracted as the object bit string. After the extraction, the register is cleared.

As depicted in FIG. 27, the pointers to the leaves L1 to L1295 are stored in the root structure cell. C(1, 1) of the no-node Huffman tree H2. Therefore, a pointer (the branch number) to the leaf L# that coincides with the extracted object bit string "010001001010" is searched for in the root structure cell C(1, 1) of the no-node Huffman tree H2. In this case, the extracted object bit string "010001001010" coincides with one pointer in the pointer group to the leaf L24 and therefore, the corresponding pointer to the leaf L24 is read and the structure of the leaf L24 is accessed.

A character code "0x6E30" (that corresponds to the character: "の") is stored in the structure of the leaf L24 and therefore, the character code "0x6E30" is extracted and is stored in the expansion buffer 5120. The compression symbol length leg (=8 bits) of the character code "0x6E30" is also stored in the structure of the leaf L24 and therefore, the compression symbol length leg of the character code "0x6E30" is also extracted. The bit address abi is updated using the compression symbol length leg extracted. In this case, the bit address abi after the updating is abi=12+8=20.

FIG. 53C depicts the expansion process (the state of (C)) executed when the register is shifted by the byte offset bios from the state of (B) depicted in FIG. 53B. The bit address abi of (B) that is the previous session is abi=12 and the compression symbol length leg thereof is 8 bits and therefore, the bit address abi in (C) is abi=20 bits.

Further, due to the bit address abi that is abi=20, the byte offset byos is byos=2 and the bit offset bios is bios=4. Due to the byte offset byos that is byos=2, a compression symbol string of four bytes (highlighted in drawing) from the second byte from the head of the compression symbol string retained in the memory is set in the register.

Due to the bit offset bios that is bios=4, the mask pattern is "0x0FFF0000". Therefore, an AND result is obtained by logical-product (AND) computing the compression symbol string set in the register and the mask pattern "0x0FFF0000".

Due to the bit offset bios that is bios=4, the number of register shifts rs is rs=32−m−bios=32−12−4=16. Therefore, the AND result in the register is shifted by 16 bits toward the tail. Due to this shifting, "0000101001000000" is left in the register and therefore, the 12 bits from the tail are extracted as the object bit string. In this case, "101001000000" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the extracted object bit string "101001000000" is searched for in the root structure cell C(1, 1) of the no-node Huffman tree H2. In this case, the extracted object bit string "101001000000" coincides with one pointer in the pointer group to the leaf L167 and therefore, the corresponding pointer to the leaf L167 is read and the structure of the leaf L167 is accessed.

A divided character code "0x51" is stored in the structure of the leaf L167 and therefore, the character code "0x51" is extracted and is stored in the expansion, buffer 5120. The compression symbol length leg (=12 bits) of the character code "0x51" is also stored in the structure of the leaf L167 and therefore, the compression symbol length leg of the character code "0x51" is also extracted. The bit address abi is updated using the compression symbol length leg extracted. In this case, the bit address abi after the updating is abi=20+12=32.

Figure 53D:
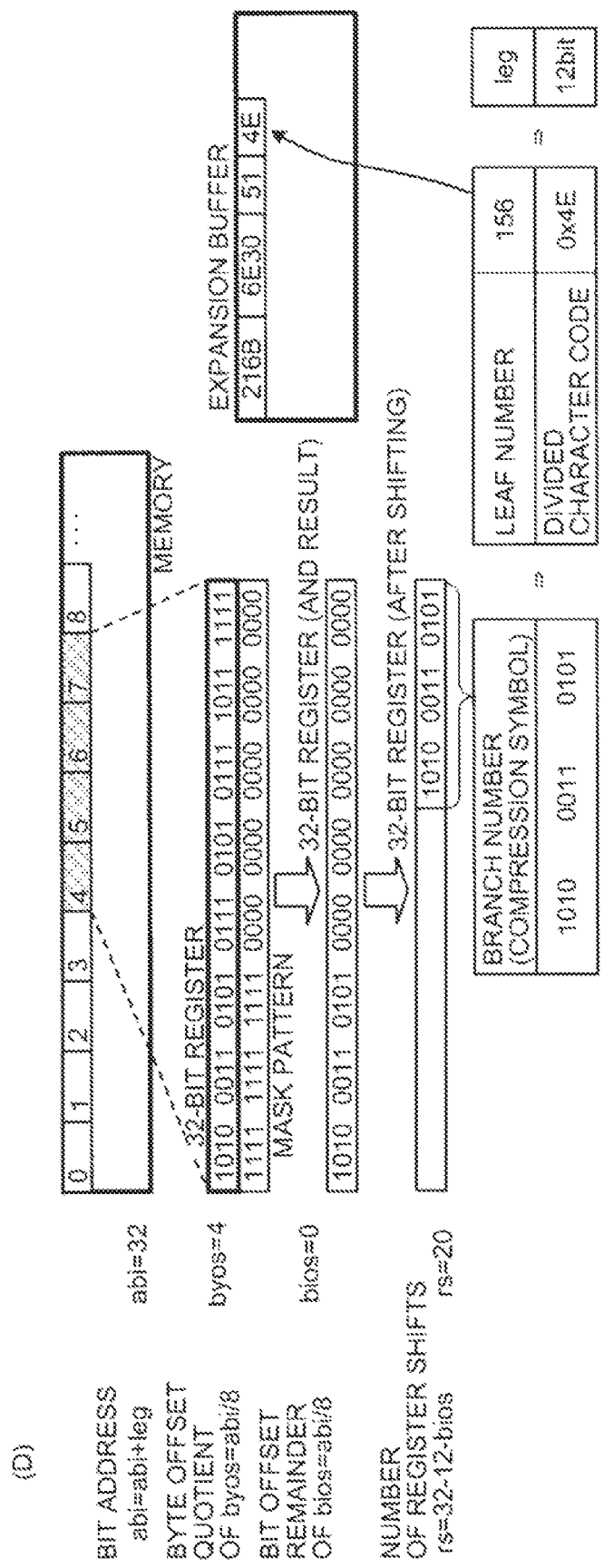

FIG. 53D depicts the expansion process (the state of (D)) executed when the register is shifted by the byte offset bios from the state of (C) depicted in FIG. 53B. The bit address abi of (C) that is the previous session is abi=20 and the compression symbol length leg thereof is 12 bits and therefore, the bit address abi in (D) is abi=32 bits.

Further, due to the bit address abi that is abi=32, the byte offset byos is byos=4 and the bit offset bios is bios=0. Due to the byte offset byos that is byos=4, a compression symbol string of four bytes (highlighted in drawing) from the fourth byte from head of the compression symbol string retained in the memory is set in the register.

Due to the bit offset bios that is bios=0, the mask pattern is "0xFFF00000". Therefore, an AND result is obtained by logical-product (AND) computing the compression symbol string set in the register and the mask pattern "0xFFF00000".

Due to the bit offset bios that is bios=0, the number of register shifts rs is rs=32−m−bios=32−12−0=20. Therefore, the AND result in the register is shifted by 20 bits toward the tail. Due to this shifting, "101000110101" is left in the register and therefore, the 12 bits from the tail are extracted as the object bit string. In this case, "101000110101" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the extracted object bit string "101001000000" is searched for in the root structure cell C(1, 1) of the no-node Huffman tree H2. In this case, the extracted object bit string "101001000000" coincides with one pointer in the pointer group to the leaf L156 and therefore, the pointer to the leaf L156 is read and the structure of the leaf L156 is accessed.

A divided character code "0x4E" is stored in the structure of the leaf L156 and therefore, the character code "0x4E" is extracted and is stored in the expansion buffer 5120. The compression symbol length leg (=12 bits) of the character code "0x4E" is also stored in the structure of the leaf L156 and therefore, the compression symbol length leg of the character code "0x4E" is also extracted. The bit address abi is updated using the compression symbol length leg extracted. In this case, the bit address abi after the updating is abi=32+12=44.

Figure 53E:
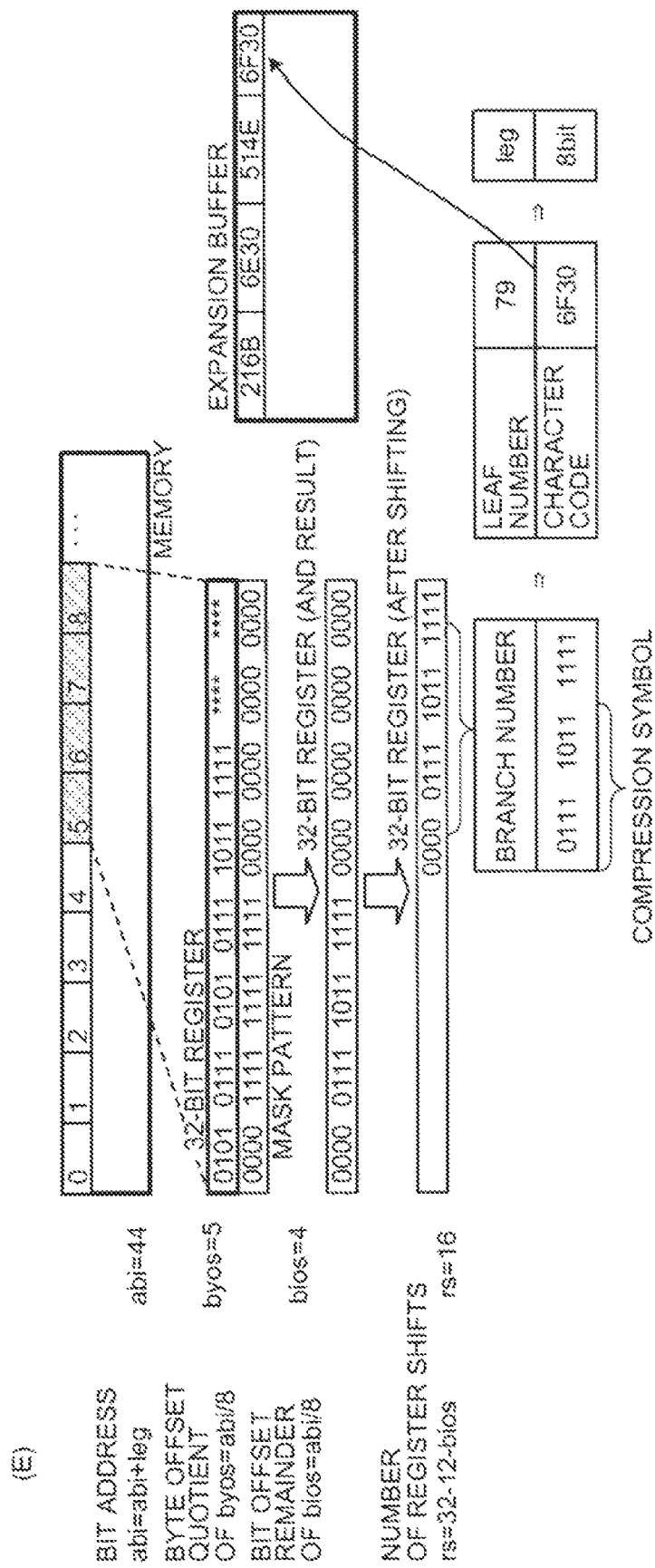

FIG. 53E depicts the expansion process (the state of (E)) executed when the register is shifted by the byte offset bios from the state of (D) depicted in FIG. 53B. The bit address abi of (D) that is the previous session is abi=32 and the compression symbol length leg thereof is 12 bits and therefore, the bit address abi in (E) is abi=44 bits.

Further, due to the bit address abi that is abi=44, the byte offset byos is byos=5 and the bit offset bios is bios=4. Due to the byte offset byos that is byos=5, a compression symbol string of four bytes (highlighted in drawing) from the fifth byte from head of the compression symbol string retained in the memory is set in the register.

Due to the bit offset bios that is bios=4, the mask pattern is "0x0FFF0000". Therefore, an AND result is obtained by logical-product (AND) computing the compression symbol string set in the register and the mask pattern "0x0FFF0000".

Due to the bit offset bios that is bios=4, the number of register shifts rs is rs=32−m−bios=32−12−4=16. Therefore, the AND result in the register is shifted by 16 bits toward the tail. Due to this shifting, "0000011110111111" is left in the register and therefore, the 12 bits from the tail are extracted as the object bit string. In this case, "011110111111" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the extracted object bit string "011110111111" is searched for in the root structure cell C(1, 1) of the no-node Huffman tree H2. In this case, the extracted object bit string "011110111111" coincides with one pointer in the pointer group to the leaf L2000 and therefore, the pointer to the leaf L2000 is read and the structure of the leaf L2000 is accessed.

A character code "0x6F30" is stored in the structure of the leaf L2000 and therefore, the character code "0x6F30" is extracted and is stored in the expansion buffer 5120. The compression symbol length leg (=8 bits) of the character code "0x6F30" is also stored in the structure of the leaf L2000 and therefore, the compression symbol length leg of the character code "0x6F30" is also extracted. The bit address abi is updated using the compression symbol length leg extracted. In this case, the bit address abi after the updating is abi=44+8=52.

In FIG. 51, the comparing unit 5110 has a function of comparing the character code string of the search keyword with the expanded code string stored in the expansion buffer 5120. The comparing unit 5110 compares the expanded code each time the expanded code storing unit 5109 sequentially stores the expanded codes in the expansion buffer 5120. Thereby, comparison with the search keywords can be executed simultaneously with the expansion process. Therefore, high-speed processing is realized.

More specifically, for example, the comparing unit 5110 executes the comparison on the expanded code whose comparison flag is ON, among the expanded codes sequentially stored in the expansion buffer 5120. The character codes to be compared are the character codes in the search keywords. The character codes to be compared with the expanded codes are determined based on the expanded code lengths of the expanded codes. For example, when the expanded code length of an expanded code is 16 bits, the character code of 16 bits similarly is to be compared. On the other hand, when the expanded code length is 8 bits, the character code of 8 bits (the divided character code) similarly is to be compared. The starting position of the character code to be compared is the head of the search keyword.

The comparing unit 5110 shifts the character code to be compared to the subsequent character code each time coincidence is obtained as the comparison result. During the comparison, when an expanded code that results in non-coincidence in the comparison appears or when an expanded code whose comparison flag is OFF appears, the comparison is again executed from the head of the search keyword.

The character string exchanging unit 5111 has a function of, when the comparing unit 5110 compares the character string that coincides with the search keyword, character-string-exchanging such that the compared character string is displayed highlighted. More specifically, for example, the character string exchanging unit 5111 sandwiches the expanded code string that coincides in the comparison using tags to display the expanded code string highlighted. Thereby, when the search result is displayed, the character string that corresponds to the expanded code string that coincides in the comparison is displayed highlighted.

The output unit 5112 converts the expanded code string stored in the expanded buffer 5120 into a file and outputs the file as an file after the expansion (expanded file). The expanded file output is stored in a storing apparatus or is displayed on a display. When the expanded file output is displayed on the display, the expanded code string that coincides with the search keyword is sandwiched by the tags by the character string exchanging unit 5111 to display the expanded code string highlighted and therefore, the expanded code string is displayed highlighted when the expanded code string is displayed on the display.

Figure 54A:
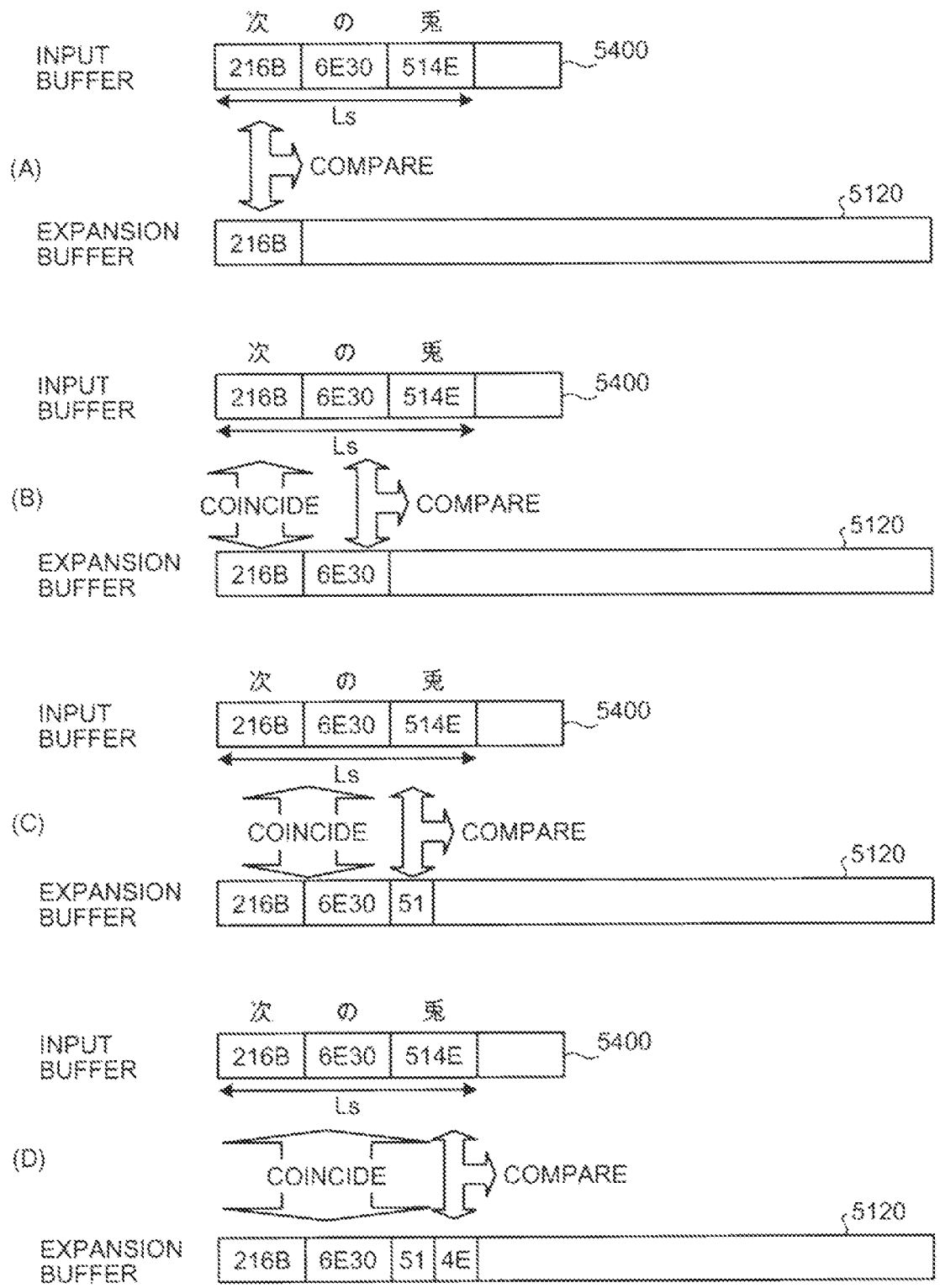

FIGS. 54A to 54C are explanatory diagrams of an example of the comparison process. It is assumed that the input buffer 5400 stores therein "216B6E30514E" that is the character code string of the search keywords " 次の兎 ".

In (A) of FIG. 54A, when the character code "0x216B" of the character " 次 " is stored as an expanded code in the expansion buffer 5120, ON or OFF is determined of the comparison flag of the structure of the leaf L# that stores therein the expanded code "0x216B". In this case, the comparison flag is ON and therefore, the comparison is executed on the expanded code "0x216B".

The expanded code "0x216B" is a 16-bit character code and therefore, the character code to be compared is the character code of 16 bits from the head. In the example, the character code is the character code "0x216B" of the character " 次 ". In this case, the expanded code and the character code to be compared coincide with each other and therefore, the same comparison process is executed • on the expanded code to subsequently be stored in the expansion buffer 5120.

In (B), when the character code "0x6E30" of the character " の " is stored as an expanded code in the expansion buffer 5120, ON or OFF is determined of the comparison flag of the structure of the leaf L# that stores therein the expanded code "0x6E30". In this case, the comparison flag is ON and therefore, the comparison is executed on the expanded code "0x6E30".

The expanded code "0x6E30" is a 16-bit character code and therefore, the character code to be compared is a character code obtained by shifting by 16 bits from the character code "0x216B" and, in this example, is the character code "0x6E30" of the character " の ". In this case, the expanded code and the character code to be compared coincide with each other and therefore, the same comparison process is executed on the expanded code that is subsequently stored in the expansion buffer 5120.

In (C), when the divided character code "0x51" of the character " 兎 " is stored as an expanded code in the expansion buffer 5120, ON or OFF is determined of the comparison flag of the structure of the leaf L# that stores therein the expanded code "0x51". In this case, the comparison flag is ON and therefore, the comparison is executed on the expanded code "0x51".

The expanded code "0x51" is an 8-bit character code and therefore, the character code to be compared is a character code obtained by shifting by 8 bits from the character code "0x6E30" and, in this example, is the character code "0x51". In this case, the expanded code and the character code to be compared coincide with each other and therefore, the same comparison process is executed on the expanded code that is subsequently stored in the expansion buffer 5120.

In (D), when the divided character code "0x4E" of the character " 兎 " is stored as an expanded code in the expansion buffer 5120, ON or OFF is determined of the comparison flag of the structure of the leaf L# that stores therein the expanded code "0x4E". In this case, the comparison flag is ON and therefore, the comparison is executed on the expanded code "0x4E".

The expanded code "0x4E" is an 8-bit character code and therefore, the character code to be compared is a character code obtained by shifting by 8 bits from the character code "0x51" and, in this example, is the character code "0x4E". Since all the character code strings in the search keywords are subject to the comparison and are found coincide, the expanded code string "216B6E30514E" in the expansion buffer 5120 is sandwiched by the tags to be displayed highlighted. Thereby, when the search result is displayed, the search result can be displayed highlighted as the character string that coincides with the search keyword.

FIG. 54B depicts a first example of the character code that does not coincide with during the comparison for coincidence. In (E), as (A) and (B) of FIG. 54A, it is assumed that expanded codes "216B" and "6E30" coincide in the comparison.

In (E), when the character code "0x0580" of the character " 者 " is stored in the expansion buffer 5120 as the expanded code, ON or OFF of the comparison flag of the structure of the leaf L# that stores therein the expanded code "0x0580" is determined. In this case, the comparison flag is OFF and therefore, no comparison is executed on the expanded code "0x0580". Because the comparison flag is OFF, the character code to be compared returns to the head.

In (F), when the character code "0x6F30" of the character " は " is stored in the expansion buffer 5120 as the expanded code, ON or OFF of the comparison flag of the structure of the leaf L# that stores therein the expanded code "0x6F30" is determined. In this case, the comparison flag is OFF and therefore, no comparison is executed on the expanded code "0x6F30". Because the comparison flag is OFF, the character code to be compared returns to the head. As described, no comparison is executed on the expanded code whose comparison flag is OFF and therefore, useless comparison processing can be prevented and an increase of the speed of the comparison process is realized.

FIG. 54C depicts a second example of the character code that does not coincide with during the comparison for coincidence. In (G), as (A) and (B) of FIG. 54A, it is assumed that expanded codes "216B" and "6E30" coincide in the comparison.

In (G), when the character code "0x216B" of the character "文" in a second session is stored in the expansion buffer 5120 as an expanded code, ON or OFF of the comparison flag of the structure of the leaf L# that stores therein the expanded code "0x216B" is determined. In this case, the comparison flag is ON and therefore, the comparison is executed on the expanded code "0x216B".

The expanded code "0x216B" (in the second session) is a 16-bit character code and therefore, the character code to be compared is the character code obtained by shifting by 16 bits from the character code "0x6E30" and, in the example, is the character code "0x514E" of the character "0". In this case, though the expanded code and the character code to be compared do not coincide with each other, the comparison flag for the expanded code "0x216B" (in the second session) is ON and the character code is a 16-bit character code.

Therefore, in (H), the character code to be compared is compared with the character code "0x216B" of 16 bits from the head of the search keyword. In this case, the character codes coincide with each other and therefore, the comparison process is executed on the expanded code to be subsequently stored in the expansion buffer 5120.

Figure 55:
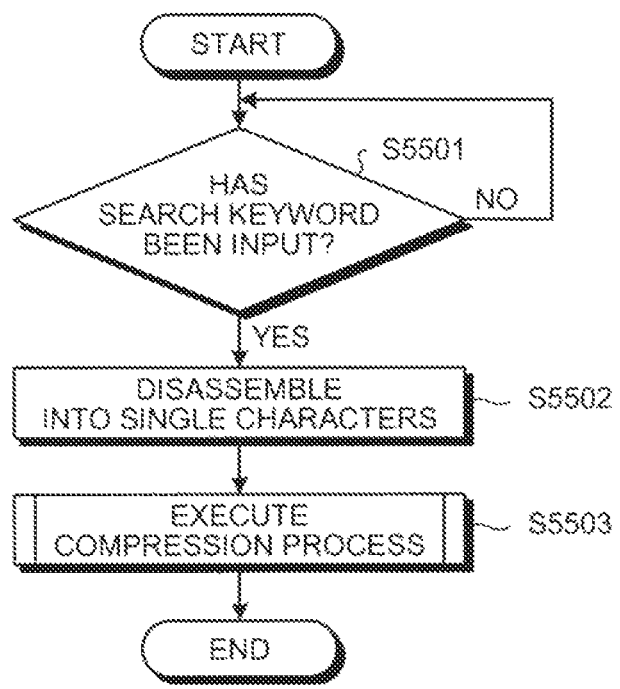
FIG. 55 is a flowchart of a procedure of a search keyword compression process.

FIG. 55 is a flowchart of the procedure of a search keyword compression process. The input unit 5101 waits for a search keyword to be input (step S5501: NO). When the search keyword is input (step S5501: YES), the input unit 5101 disassembles the search keyword into single characters (step S5502) and the search keyword compressing unit 5102 executes the compression process of Huffman-compressing each of the characters that constitute the search keyword by the no-node Huffman tree H2 (step S5503). The compression process (step S5503) is same as the process depicted in FIGS. 34 and 36 to 38 and will not again be described. Thereby, the search keyword compression process comes to an end.

Figure 56:
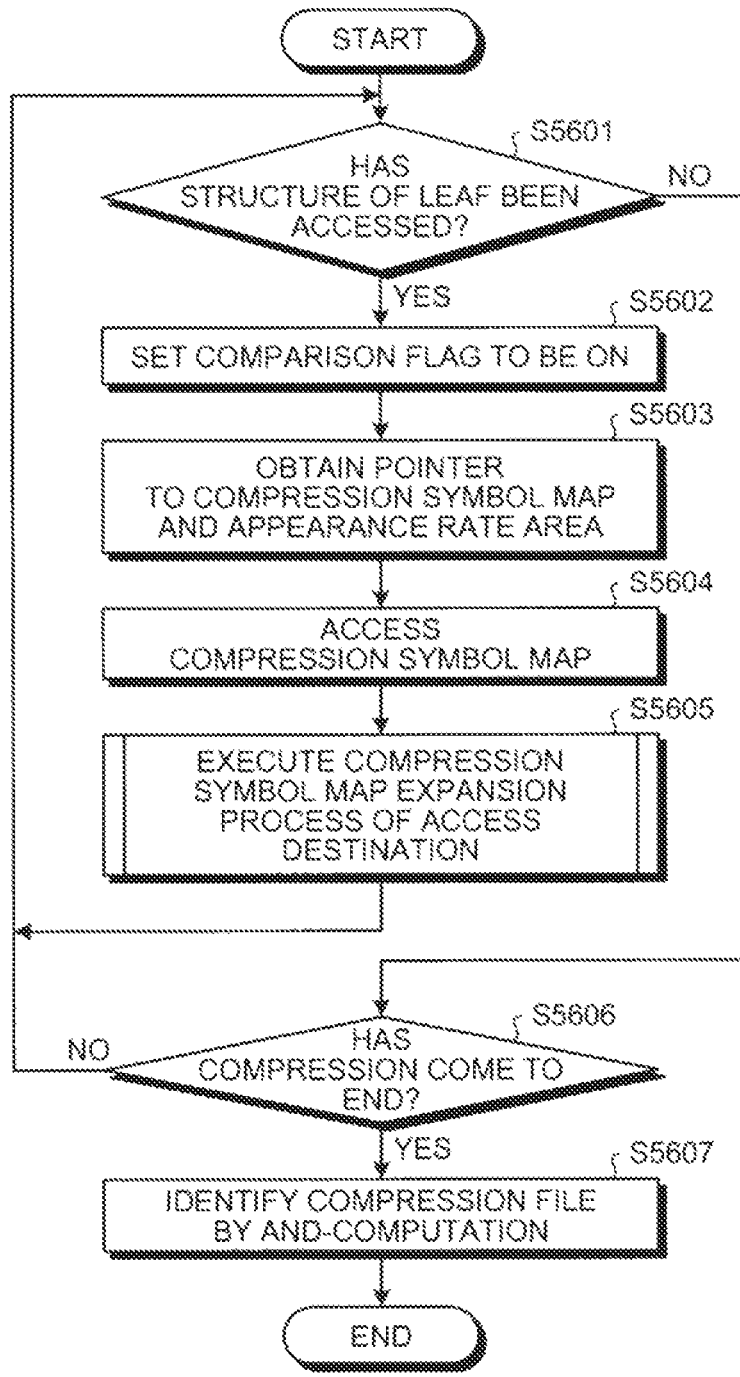
FIG. 56 is a flowchart of a procedure of a file screening process.

FIG. 56 is a flowchart of the procedure of a file screening process. In the compression process (step S5503) depicted in FIG. 55, whether the structure of the leaf L# is accessed is determined (step S5601). If it is determined that the structure has been accessed (step S5601: YES), the comparison flag of the structure of the leaf L# is set to be ON (step S5602). The pointer from the structure of the leaf L# to the compression symbol map and the appearance rate area are obtained (step S5603).

The compression symbol map is accessed by the pointer to the compression symbol map obtained (step S5604), the compression symbol map expansion process for the access destination is executed (step S5605), and the procedure returns to step S5601. The compression symbol map expansion process for the access destination (step S5605) will be described later. If it is determined at step S5601 that the structure of the leaf L# has not been accessed (step S5601: NO), whether the search keyword compression process depicted in FIG. 55 has come to an end is determined (step S5606).

If it is determined that the search keyword compression process has not yet come to an end (step S5606: NO), the procedure returns to step S5601. On the other hand, if it is determined that the search keyword compression process has come to an end (step S5606: YES), identification of the compressed file by the AND-computation is executed as depicted in FIG. 52 (step S5607). The compressed file identified in this manner is referred to as "identified compressed file". Thereby, the file screening process comes to an end.

Figure 57:
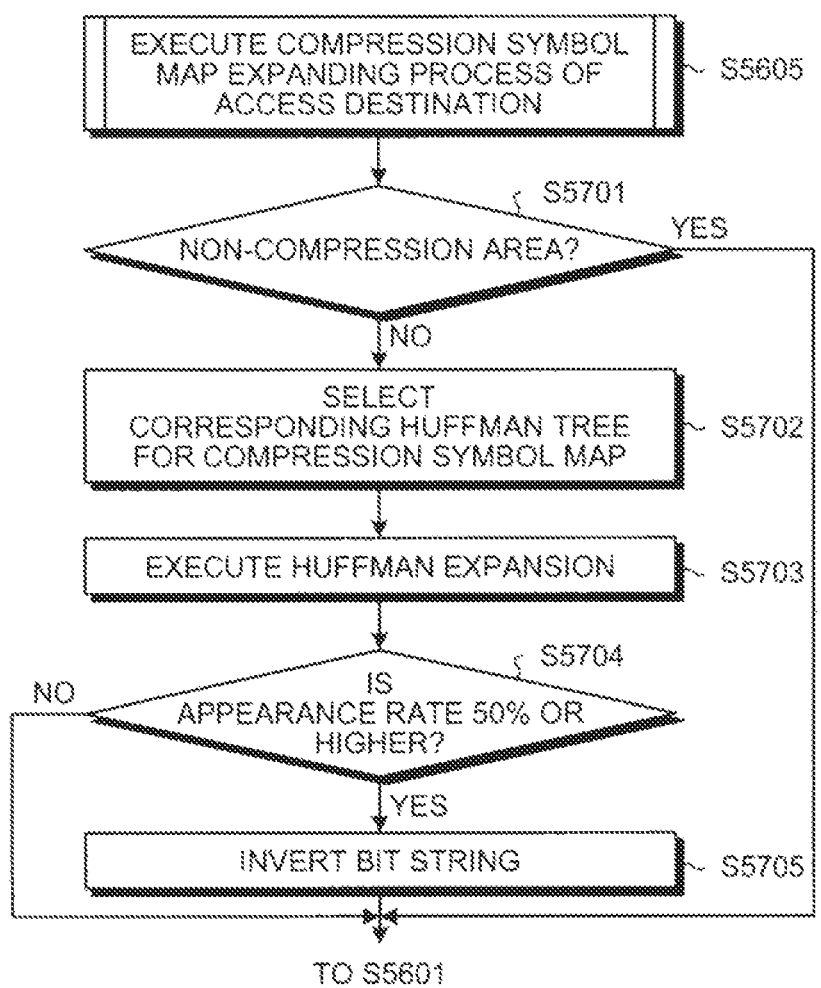
FIG. 57 is a flowchart detailing a process procedure of a compression symbol map expansion process for the access destination (step S5605) depicted in FIG. 56.

FIG. 57 is a flowchart detailing the process procedure of the compression symbol map expansion process for the access destination (step S5605) depicted in FIG. 56. The compression pattern table depicted in FIG. 41 is referred to and whether the appearance rate area obtained at step S5603 is a non-compression area is determined (step S5701). If it is determined that the appearance rate area is a non-compression area (step S5701: YES), the expansion process is not executed and the procedure returns to step S5601.

On the other hand, if it is determined that the appearance rate area is not a non-compression area (step S5701: NO), a Huffman tree for the compression symbol map that corresponds to the appearance rate area is selected (step S5702). The compression symbol map M at the destination of the access by the pointer to the compression symbol map obtained at step S5603 is Huffman-expanded by the selected Huffman tree for the compression symbol map (step S5703). Whether the appearance rate is at least 50% is determined (step S5704).

More specifically, the appearance rate area is determined according to the appearance rate (see FIG. 40) and therefore, when the appearance rate areas are A to E, it is determined that the appearance rate of the character code obtained is not 50% or higher. On the other hand, when the appearance rate areas are A' to E', it is determined that the appearance rate of the character code obtained is 50% or higher.

If it is determined that the appearance rate is 50% or higher (step S5704: YES), the inversion has been executed at step S4709 and therefore, the bit string expanded at step S5703 is inverted (step S5705). Thereby, the bit string returns to its original bit string.

On the other hand, if it is determined at step S5704 that the appearance rate is not 50% or higher (step S5704: NO), the bit string inversion (step S5705) is not executed and the procedure returns to step S5601.

By the compression symbol map expansion process for the access destination (step S5605), only the compression symbol strings in the compression symbol map for the characters constituting the search keywords can be expanded and therefore, the expansion of only compression symbol strings that are necessary for the search has to be executed. Therefore, improvement of the expansion efficiency can be facilitated.

Figure 58:
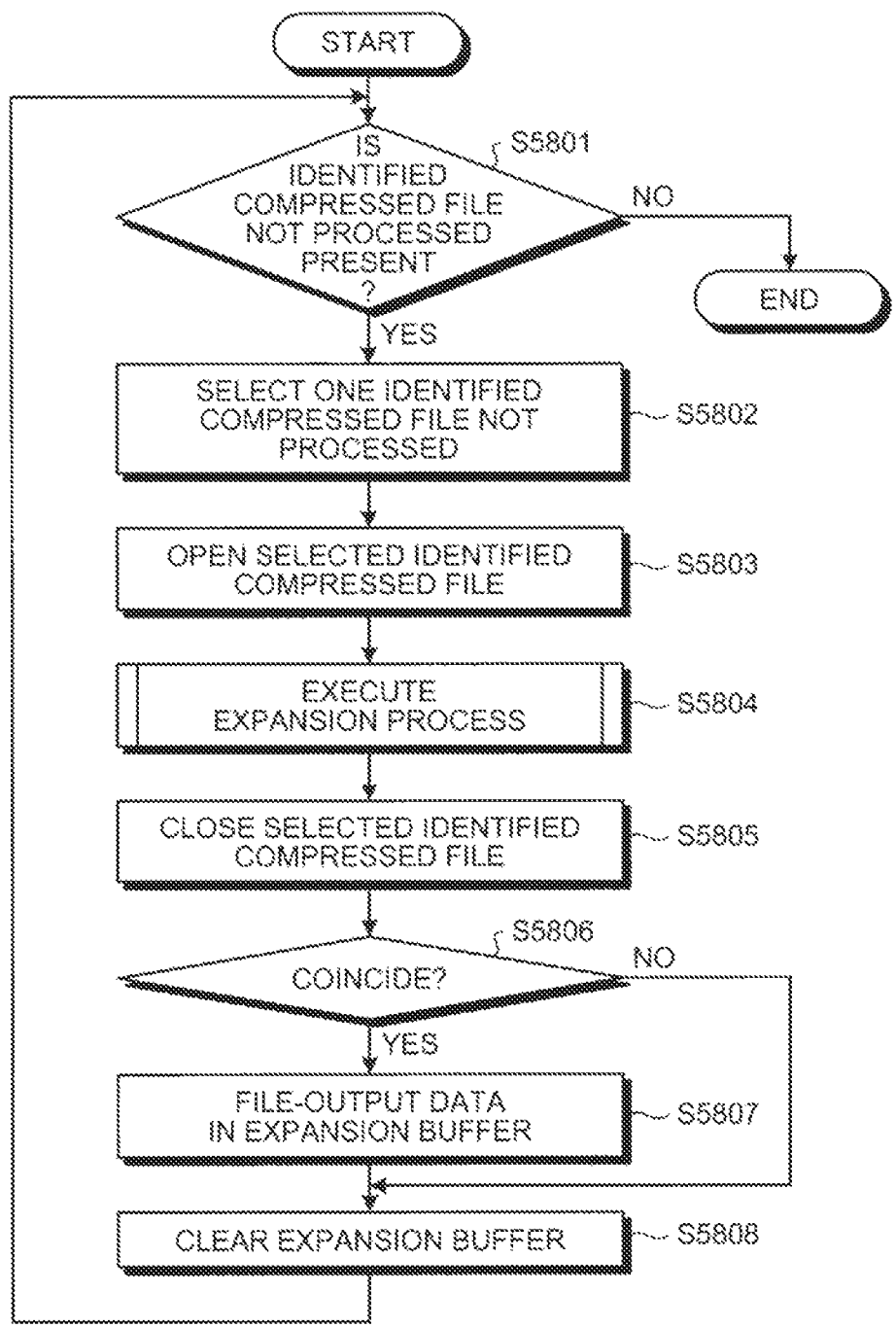
FIG. 58 is a flowchart of a procedure of an identified compressed file expansion process.

FIG. 58 is a flowchart of the procedure of an identified compressed file expansion process. Whether any unprocessed identified compressed file is present is determined (step S5801). If it is determined that some unprocessed identified compressed files are present (step S5801: YES), one unprocessed identified compressed file ft is selected (step S5802) and the identified compressed file ft selected is opened (step S5803). The expansion process is executed (step S5804). The details of the expansion process (step S5804) will be described later. The identified compressed file ft selected is closed (step S5805).

Whether any coincidence is present in the identified compressed file ft selected is determined (step S5806). More specifically, whether any character code string that coincides with the search keyword is present is determined. If it is determined that coincidence is present (step S5806: YES), the character code string that coincides with the search keyword is present in the file obtained by expanding the identified compressed file, and the data in the expansion buffer 5120 is file-output (step S5807). If it is determined that no coincidence is present (step S5806: NO), the procedure moves to step S5808.

Thereby, the expanded file can be obtained from the identified compressed file. Thereafter, the expansion buffer 5120 is cleared (step S5808) and the procedure returns to step S5801. On the other hand, if it is determined at step S5801 that no unprocessed identified compressed file is present step S5801: NO), the identified compressed file expansion process comes to an end.

Figure 59:
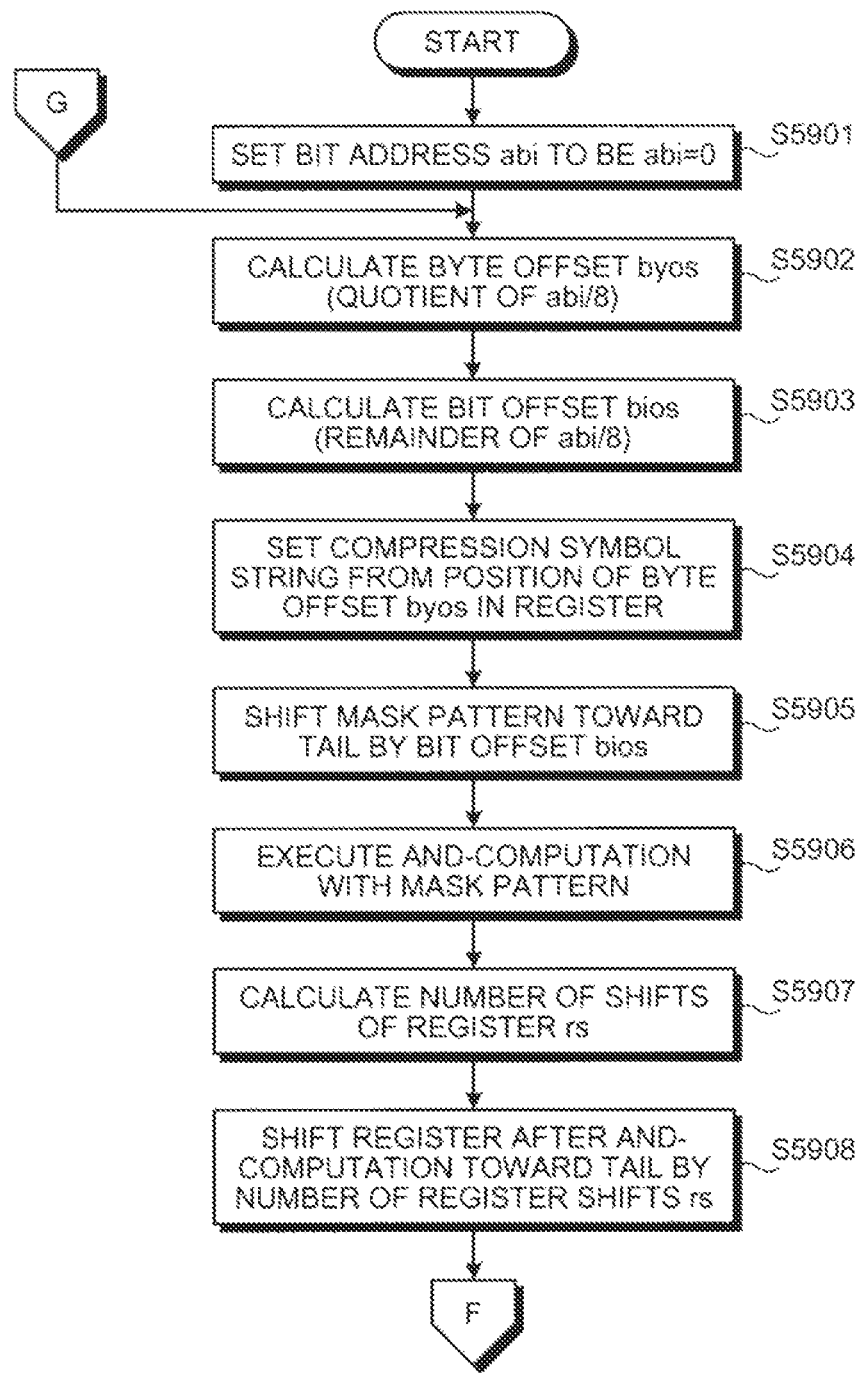
FIGS. 59 and 60 are flowcharts of a procedure of an expansion process using the no-node Huffman tree.
Figure 60:
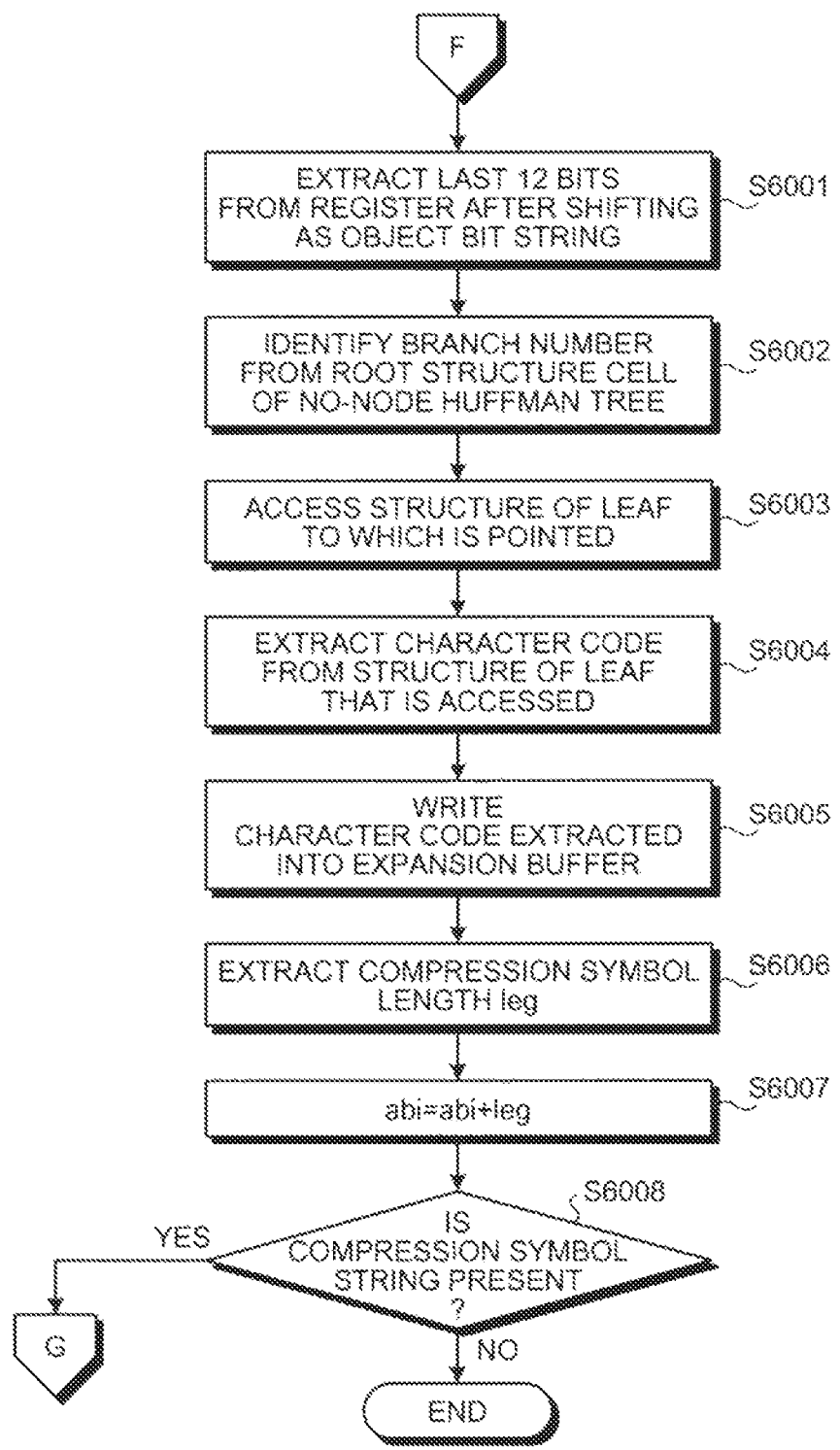

FIGS. 59 and 60 are flowcharts of the procedure of the expansion process using the no-node Huffman tree H2. In FIG. 59, the bit address abi is set to be abi=0 (step S5901); the byte offset byos is calculated (step S5902); and the bit offset bios is calculated (step S5903). The compression symbol string from the position of the byte offset byos is set in the register (step S5904).

The mask pattern "0xFFF00000" is shifted by the bit offset bios toward the tail (step S5905) and AND-computation of the shifted mask pattern and the compression symbol string set in the register is executed (step S5906). Thereafter, the number of register shifts rs is calculated (step S5907) and the register after the AND-computation is shifted by the number of register shifts rs toward the tail (step S5908).

After step S5908, in FIG. 60, m (m=12) bits from the tail are extracted as an object bit string from the register after the shifting (step S6001). A pointer to the leaf L# that is the branch number is identified from the root structure cell C(1, 1) of the no-node Huffman tree H2 (step S6002) and the structure of the leaf L# to which the pointer points is accessed through one path (step S6003). The character code is extracted from the structure of the leaf L# of the access destination (step S6004) and the extracted character code is written into the expansion buffer 5120 (step S6005).

The compression symbol length leg is extracted from the structure of the leaf L# (step S6006) and the bit address abi is updated (step S6007). Thereafter, whether any compression symbol string is present, or more specifically, whether any compression symbol string to which no masking process by the mask pattern is applied is present, in the memory is determined (step S6008). This is determined by, for example, determining whether any byte position that corresponds to the byte offset byos is present. If it is determined that the compression symbol string is present (step S6008: YES), the procedure returns to step S5902 of FIG. 59. On the other hand, if it is determined that the compression symbol string is not present (step S6008: NO), the series of expansion process steps come to an end.

By the expansion process, the compression symbol can be extracted by m bits as a unit from the compression symbol string and, by accessing the root structure cell C(1, 1) of the no-node Huffman tree H2, the pointer to the leaf L# that is the corresponding branch number can be identified. The compression symbol is expanded by extracting the character code from the structure of the leaf L# that is the access destination. In this manner, the no-node Huffman tree H2 has no internal node and therefore, when the pointer to the leaf L# is identified, the structure of the leaf L# can be accessed through one path. Therefore, an increase of the speed of the expansion can be facilitated.

Figure 61:
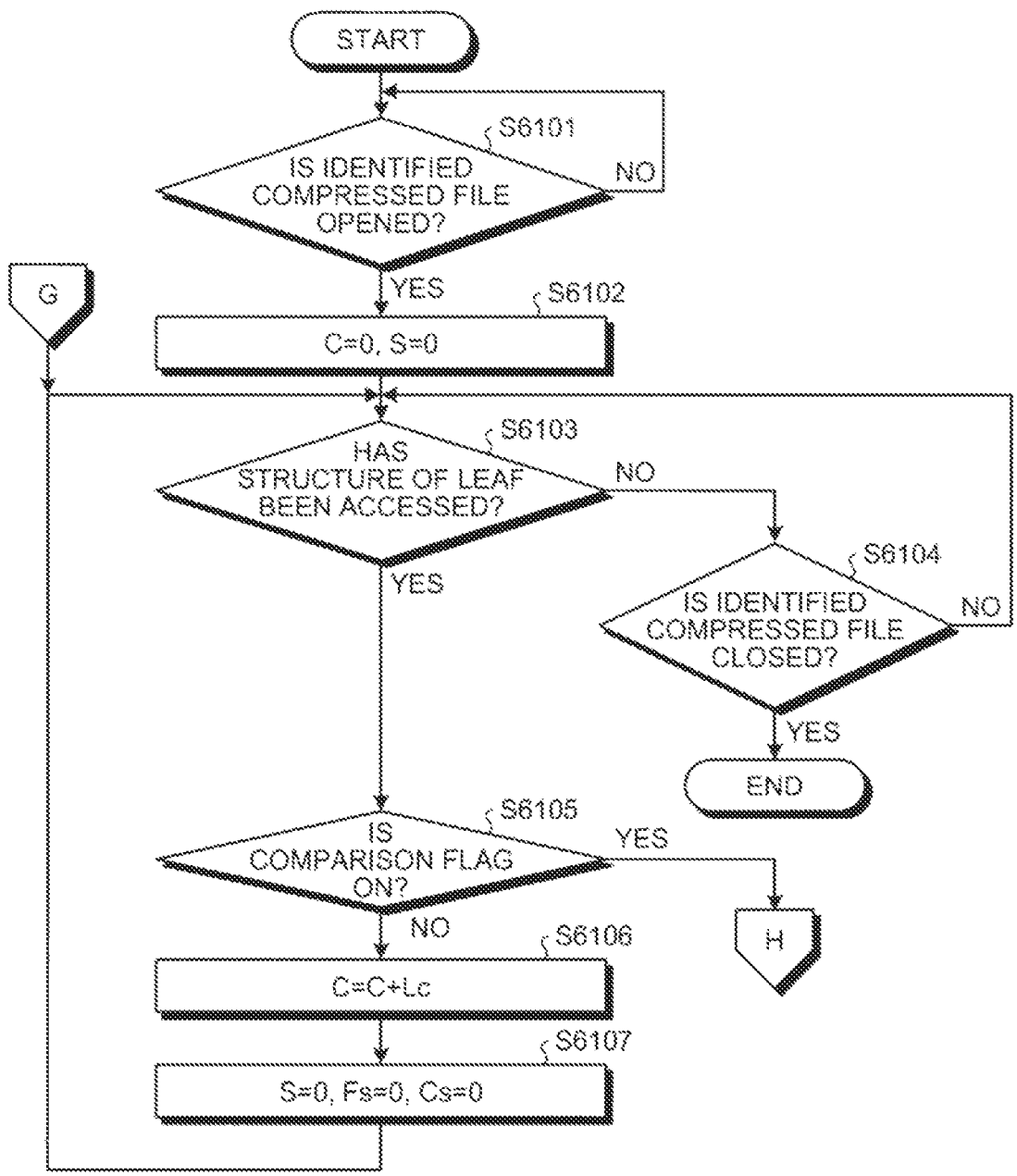
FIGS. 61 and 62 are flowcharts of a procedure of the comparison process.
Figure 62:
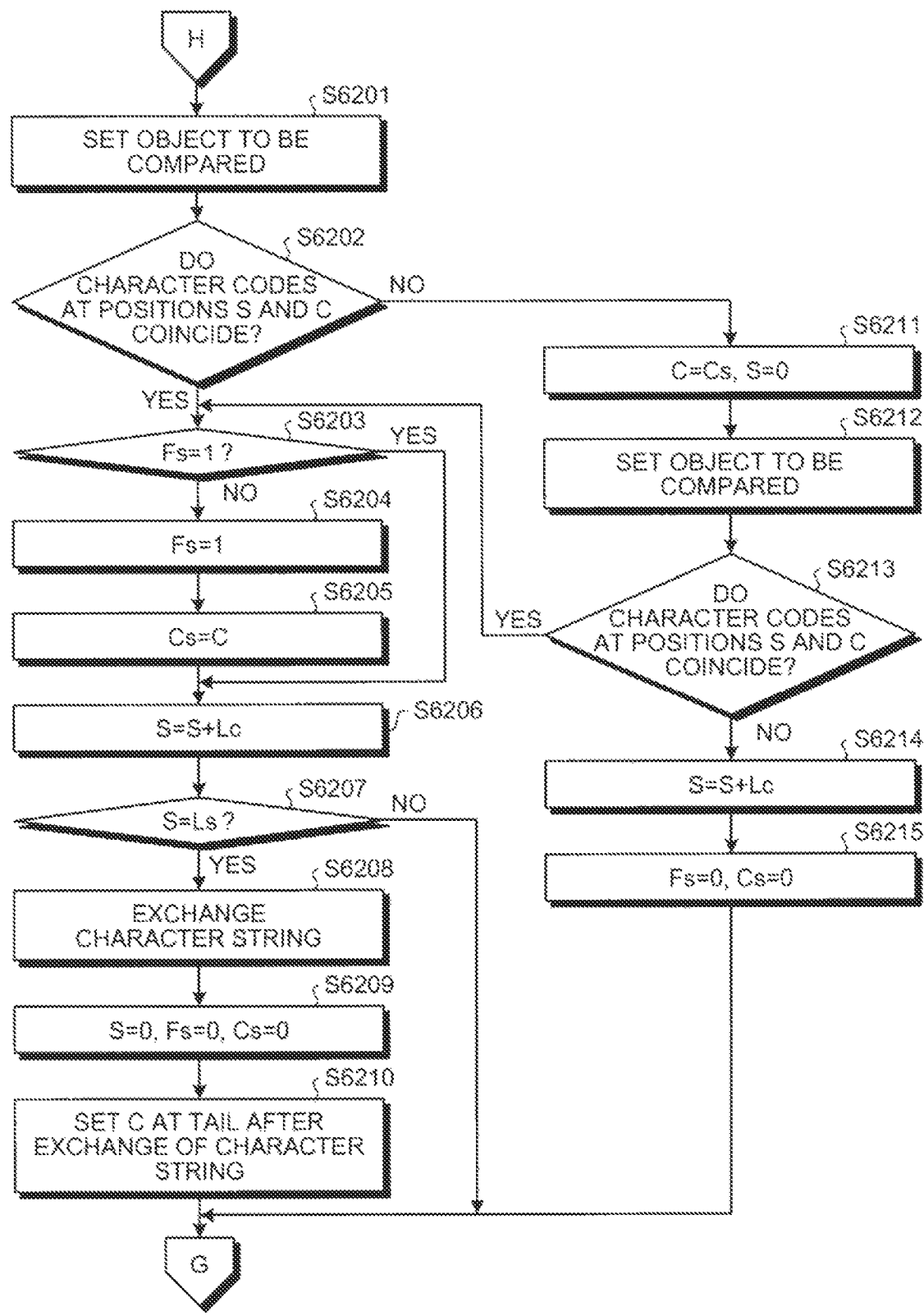

FIGS. 61 and 62 are flowcharts of the procedure of the comparison process. In FIG. 61, the opening of the identified compressed file at step S5803 of FIG. 58 is waited for to be detected (step S6101: NO). When the opening of the identified compressed file is detected (step S6101: YES), "C" is set to be C=0 and "S" is set to be S=0 (step S6102). "C" is the current position in the expansion buffer 5120. "S" is the current position in the input buffer 5400 that retains the search keyword.

Whether the structure of the leaf L# that is the pointing destination at step S6003 of FIG. 60 is accessed is determined (step S6103). If it is determined that the structure has not been accessed (step S6103: NO), whether the identified compressed file is closed at step S5805 of FIG. 58 is determined (step S6104). If it is determined that the identified compressed file is not closed (step S6104: NO), the procedure returns to step S6103. If it is determined that the identified compressed file is closed (step S6104: YES), the comparison process comes to an end.

On the other hand, if it is determined that the structure of the leaf L# is accessed (step S6103: YES), whether the comparison flag in the structure of the leaf L# of the access destination is ON is determined (step S6105). If it is determined that the comparison flag is not ON (step S6105: NO), no comparison is executed with the expanded code stored in this session in the expansion buffer 5120 (that coincides with the character code in the structure of the leaf L# of the access destination) and therefore, the current position C is updated by adding the expanded code length Lc of the expanded code stored in this session in the expansion buffer 5120 to the current position C in the expansion buffer 5120 (step S6106). Thereby, the comparison can again be executed from the current position C.

Thereafter, the current position S in the input buffer 5400 is set to be S=0, a start flag Fs is set to be Fs=0, and the current position Cs of the expansion buffer 5120 obtained when the start flag Fs is Fs=1 is set to be Cs=0 (step S6107) and the procedure returns to step S6103. The "start flag Fs" is a flag that is set up (set to be Fs=1) when the character code of the character at the head of the search keyword coincides, and "Cs" is the current position C at this time. Thereby, the comparison process as depicted in FIG. 54B is executed. On the other hand, if it is determined at step S6105 that the comparison flag is ON (step S6105: YES), the procedure moves to step S6201 of FIG. 62.

In FIG. 62, an object to be compared is set (step S6201). More specifically, a character code having the character code length of the expanded code stored in this session from the current position C of the character code string of the search keyword is set as the object to be compared with the expanded code.

The expanded code from the position S and the character code from the position C to be compared are compared with each other (to determine their coincidence) (step S6202). If it is determined that the expanded code and the character code coincide with each other (step S6202: YES), whether the start flag Fs is Fs=1 is determined (step S6203). If it is determined that the start flag Fs is Fs=1 (step S6203: YES), the procedure moves to step S6206. On the other hand, if it is determined that the start flag Fs is not Fs=1 (step S6203: NO), the start flag Fs is set to be Fs=1 (step S6204) and Cs is set to be Cs=C (step S6205). Thereby, the position can be stored of the expanded code that coincides with the character code at the head of the search keyword.

At step S6206, the current position S is updated by adding the expanded code length Lc of the expanded code stored in this session in the expansion buffer 5120 to the current position S in the input buffer 5400 (step S6206). Whether the current position S is S=Ls is determined (step S6207). "Ls" is the character code length of the search keyword, i.e., whether the current position S is at the tail of the search keyword is determined. If it is determined that the current position S is S=Ls (step S6207: YES), the character string that coincides with the search keyword is obtained from the expansion buffer 5120 and therefore, the expanded code string is character-string-exchanged (step S6208).

Thereafter, the current position S in the input buffer 5400 is set to be S=0, the start flag Fs is set to be Fs=0, and the current position Cs of the expansion buffer 5120 obtained when the start flag Fs is Fs=1 is set to be Cs=0 (step S6209). The current position C in the expansion buffer 5120 is set to be at the tail after the character-string-exchange (step S6210). Thereby, the comparison process as depicted in FIG. 54A can be executed. Thereafter, the procedure returns to step S6103.

If it is determined at step S6207 that the current position S is not S=Ls (step S6207: NO), the length of the expanded code string does not reach the character code length of the search keyword and therefore, the steps S6208 to 6210 are not executed and the procedure returns to step S6103.

If it is determined at step S6202 that the expanded code from the position S and the character code to be compared from the position C do not coincide with each other (step S6202: NO), the current position C in the expansion buffer 5120 is set to be C=Cs and the current position S in the input buffer 5400 is set to be S=0 (step S6211). Similarly to step S6202, an object to be compared is set (step S6212). More specifically, a character code having the character code length of the expanded code stored in this session from the current position C (C=Cs) of the character code strings of the search keyword is set as the object to be compared with the expanded code. Thereby, the comparison process as depicted in FIG. 54C can be executed.

Thereafter, similarly to step S6202, the expanded code from the position S and the character code from the position C to be compared are compared with each other (to determine their coincidence) (step S6213). If it is determined that the expanded code and the character code coincide with each other (step S6213: YES), the procedure moves to step S6203.

On the other hand, if it is determined that the expanded code and the character code do not coincide with each other (step S6213: NO), the current position S is updated by adding the expanded code length Lc of the expanded code stored in this session in the expansion buffer 5120 to the current position S (S=0) in the input buffer 5400 (step S6214). Thereafter, the start flag Fs is set to be Fs=0 and Cs is set to be Cs=0 (step S6215) and the procedure moves to step S6103.

According to the comparison process, the comparison is not executed after the expansion process comes to an end but rather the comparison is executed concurrently with the expansion process. Therefore, an increase of the speed of the comparison process can be realized.

Although the comparison with the search keyword is executed concurrently with the expansion process in the above example, for example, the comparison may be executed with the compression symbol group (compressed keyword) as it is obtained by compressing the search keyword and the compression symbol string compared may be expanded as described in the WO2008-142800 pamphlet. Even when this is executed, an increase of the speed of the comparison process can also be realized.

As described, according to the embodiment, saving of the memory can be facilitated by reducing the number of kinds of the characters to about 1,300. Due to the reduction of the kinds of character, the no-node Huffman tree H2 can be generated. By executing the compression and expansion using the no-node Huffman tree H2, 12 bits (that is, one character) can collectively be determined at one time, and an increase of the speed of each of the compression process and the expansion process can be realized.

By making the compression process and the compression symbol map generation process common to each other using the Huffman tree search, the generation of the compression symbol map group Ms can be executed associated with and in parallel with the compression process. Therefore, reduction of the program steps and the running steps can be facilitated, and an increase of the speed can be facilitated for both the compression process of the file Fs and the generation process of the compression symbol map group Ms. The lower-level character codes each having a low appearance frequency are each divided into 8-bit divided character codes and the compression process is executed. Therefore, for the divided character codes, the compression symbol map group Ms can be generated associated with the compression process.

By compressing the bit string that is the compression area of the compression symbol map group Ms at the compression rate that corresponds to the appearance rate of the corresponding character, improvement of the compression efficiency can be facilitated and saving of the memory can be facilitated. In a Huffman tree 4200 for the compression symbol map, the number of consecutive "0s" meaning that no character code is present is increased corresponding to the appearance rate area. Therefore, improvement of the compression efficiency of the compression symbol map Ms can be facilitated corresponding to the appearance rate of the character code.

By configuring the arrangement of the bit strings that are the compression areas to be in descending order of file number p from the head, the bit strings that are the compression areas can be compressed maintaining the sequence of the file numbers even if a file is added. Thereby, the selection of any of one of the adding function of the file F and the compressing function of the compression symbol map group Ms is not necessary and both of the functions can be implemented. Therefore, improvement of the degree of freedom in the way of the addition of files, and saving of the memory in the way of compression of the compression symbol map group Ms can be realized.

By using the deletion map Md that represents the presence and the absence of deletion of the file F, deleted files can be excluded from screening when the compressed files are screened using the compression symbol map group. Thereby, improvement of the precision of the screening of the compressed files can be facilitated and an increase of the speed of the expansion process can be realized.

By executing the comparison using the search keyword associated with and in parallel with the expansion process, an increase of the speed of the determination of coincidence with the search keyword can be realized. The determination of the coincidence of the search keyword is executed during the expansion of the compressed file f and therefore, whether any expanded code string that coincides with the search keyword is present can be known at the time when the compressed file is expanded.

By setting the comparison flag to be ON of the structure of the leaf L# that stores therein the character codes constituting the search keyword prior to the comparison, comparison can be prevented with the expanded code obtained from the structure of the leaf L# whose comparison flag is OFF when the comparison process is executed. Therefore, comparison with the expanded code whose non-coincidence is known does not need to be executed and therefore, an increase of the speed of the comparison process can be realized.

The information processing method described in the present embodiment may be implemented by causing a computer such as a personal computer and a workstation to execute a prepared program stored on a non-transitory, computer-readable recording medium such as a hard disk, a flexible disk, a CD-ROM, an MO, and a DVD, read out from the recording medium. The program may be a transmission medium that can be distributed through a network such as the Internet.

According to the embodiments disclosed herein, the generation of the compression symbol map group can be executed in parallel and associated with the compression process of the files. Therefore, an effect is achieved in that the speed of the file compression process and the compression symbol map group generation process can be increased.

Further, according to the embodiments disclosed herein, comparison with a search keyword is executed in parallel and associated with the compressed file expansion process. Thereby, an effect is achieved in that the speed of the coincidence determination with the search key word can be increased.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium storing therein an information processing program causing a computer to execute:

compressing sequentially and according to a Huffman tree, a character code to be compressed that is described in a file selected from a file group, wherein a leaf of the Huffman tree corresponding to the character code stores therein a pointer to a compression symbol map of the character code to convert the character code into a compression symbol of the character code;

detecting access to the leaf of the Huffman tree at the compressing;

identifying a compression symbol map of the character code to be compressed, among a compression symbol map group by a pointer stored in the accessed leaf, wherein the compression symbol map group has a bit string indicating for each character code, presence or absence of the character code in the file group; and updating a bit that indicates presence or absence of the character code to be compressed in the compression symbol map identified at the identifying the compression symbol map.

2. The recording medium according to claim 1, wherein the compressing includes:

searching a character structure for the character code to be compressed and extracting from the character structure, a pointer to a leaf storing therein the character code to be compressed, wherein the character structure has for each character code, a pointer to a structure of the leaf storing therein the character code; and obtaining the extracted pointer to the leaf storing therein the character code to be compressed, identifying a leaf of a no-node Huffman tree storing the character code to be compressed, and extracting a compression symbol of the character code to be compressed from the identified leaf, wherein the no-node Huffman tree has leaves each storing therein a pointer to the character code, the compression symbol of the character code, and the compression symbol map of the character code, and a root to which pointers to the leaves, which are of a length corresponding to the number of leaves, are allocated as branches to the leaves, in a quantity corresponding to an appearance rate of the character code, the detecting includes detecting identification of the leaf storing the character code to be compressed, and the identifying, when the identification of the leaf is detected at the detecting, includes obtaining a pointer to the compression symbol map stored in the identified leaf and identifying among the compression symbol map group, a compression symbol map to which the pointer points.

3. The recording medium according to claim 2, wherein the information processing program causes the computer to further execute:

obtaining a totaling result of appearance frequencies for character codes described in the file;

classifying the character codes by layer according to appearance probabilities P (P being $\frac{1}{2}^{ni} < P \leq \frac{1}{2}^{n(i-1)}$, while P is $\frac{1}{2}^{ni} < P < 1$ when i=1 and is $P < \frac{1}{2}^{n(i-1)}$ when i=n, n being a natural number and $\geq 2$ and i being a natural number), based on the obtained totaling result;

calculating, based on a node set having k layers of nodes (k being a natural number and $\geq 2$), having $2^n$ branches from a node to lower nodes, and having $2^{n(i-1)}$ nodes in an i-th layer ($1 \leq i \leq k$), each of the nodes of the node set storing therein pointers to upper nodes and capable of storing therein $2^n$ pointers to leaves or to lower nodes, and based on the number of character codes in the i-th layer classified at the classifying, the number of pointers to the leaves in the i-th layer and based on the number of pointers to the leaves in the i-th layer, further calculating the number of pointers to lower nodes in the i-th layer and the number of nodes used in the i-th layer, each lower node having nodes in an (i+1) layer as a link destination;

generating based on calculation results obtained at the calculating, a $2^n$-branching Huffman tree; and converting the generated $2^n$-branching Huffman tree into a $2^m$-branching (where m=n×k) no-node Huffman tree and storing the $2^m$-branching no-node Huffman tree.

4. The recording medium according to claim 3, wherein the generating includes:

generating based on the calculation results obtained at the calculating, a pointer to a leaf in the i-th layer and a pointer to a lower node in the i-th layer;

storing to nodes of a quantity used in the i-th layer, the generated pointer to the leaf in the i-th layer and the generated pointer to the lower node in the i-th layer;

generating for each character code, a leaf that is the link destination of a node in the i-th layer and is indicated by the generated pointer stored in the node in the i-th layer, for each character in the i-th layer classified at the classifying; and storing in a generated leaf, a character code that is correlated with a leaf number of the leaf, to generate the $2^n$-branching Huffman tree.

5. The recording medium according to claim 4 and storing therein the information processing program causing the computer to further execute:

detecting in an (i−1)th layer in the $2^n$-branching Huffman tree, the number of pointers to leaves in the i-th layer and the number of blank pointers in blank nodes;

identifying, in the i-th layer and based on the detected number of pointers to the leaves in the i-th layer and the number of blank pointers in the blank nodes in the (i−1)th layer, a pointer-to-be-moved pointing to a leaf that is to be moved from the i-th layer to a blank node in the (i−1)th layer; and optimizing by deleting from a node in the (i−1)th layer, the pointer to the node storing therein the identified pointer-to-be-moved, and moving the pointer-to-be-moved to a node in the (i−1)th layer, wherein the converting includes converting the optimized $2^n$-branching Huffman tree into the $2^m$-branching no-node Huffman tree, and storing the $2^m$-branching no-node Huffman tree.

6. The recording medium according to claim 3, wherein the converting includes:

determining for each leaf in the i-th layer and based on the number of layers of the $2^n$-branching Huffman tree and the number of leaves in the i-th layer, the number of kinds of pointers to the leaf;

duplicating the leaves of the $2^n$-branching Huffman tree;

generating a root capable of storing therein pointers to $2^m$ leaves and storing the generated root;

constructing, for each of the leaves duplicated at the duplicating and based on the number of kinds determined at the determining, a pointer to the leaf and storing the constructed pointer in the generated root; and constructing a no-node Huffman tree configured by the root and the leaves by reconstructing a leaf by extracting for the leaf, a compression symbol configured by a bit string common to a pointer group to the leaf and storing to the leaf, the compression symbol and the length of the compression symbol.

7. The recording medium according to claim 3 and storing therein the information processing program causing the computer to further execute:

dividing the character codes ordered in descending order of appearance frequency into character codes having a higher level of appearance frequency and character codes having a lower level of appearance frequency and further dividing each of the character codes having the lower level of appearance frequency into an upper bit code and a lower bit code; and totaling the appearance frequencies of the upper bit codes and the lower bit codes, wherein the classifying includes classifying the character codes by layer, according to the appearance probabilities P, based on a totaling result for the character codes having the higher level of appearance frequency and the totaling result obtained at the obtaining.

8. The recording medium according to claim 2 and storing therein the information processing program causing the computer to further execute:

dividing the character code to be compressed, into two portions such that the portions have an equivalent number of bits, wherein the compression symbol map group has a compression symbol map having a bit string that indicates for each higher-level character code whose appearance frequency is a predetermined frequency or higher, presence or absence of the character code in the file group and a bit string that indicates presence or absence, in the file group, of the divided character code obtained by dividing lower-level character code whose appearance frequency is lower than the predetermined frequency, wherein the no-node Huffman tree has a leaf storing therein pointers to the higher-level character code, to a compression symbol of the higher-level character code, and to a compression symbol map that indicates the presence or the absence of the higher-level character code in the file group; a leaf storing therein pointers to the divided character code, to a compression symbol of the divided character code, and to a compression symbol map that indicates the presence or the absence of the divided character code in the file group; and a root storing therein pointers to the leaves, the character structure has a higher-level character code structure having a pointer to a structure of a leaf storing therein the higher-level character code for each higher-level character code, and a divided character code structure having a pointer to a leaf storing therein the divided character code for each divided character code, the dividing, when the character code to be compressed is not present in the higher-level character code structure as determined at the searching, includes dividing the character code to be compressed and generating an upper divided character code to be compressed and a lower divided character code to be compressed, the searching for the character code to be compressed includes searching the divided code structure for the character code to be compressed, with respect to each divided character code to be compressed and extracting from the divided character code structure, a pointer to a leaf storing therein the divided character code to be compressed, and the searching the Huffman tree includes obtaining a pointer to a leaf storing therein the divided character code to be compressed extracted at the searching for the character code to be compressed, identifying a leaf storing therein the divided character code to be compressed, and extracting from the identified leaf, a compression symbol of the divided character code to be compressed.

9. The recording medium according to claim 8, wherein bit strings of the compression symbol map group are compression areas arranged in descending order of file number of the files from a head position to a tail position, and the information processing program causes the computer to further execute:

setting a non-compression area, when addition of a file is detected, by adopting a number such that the file numbers are sequential and setting the non-compression area to have a bit string that indicates for each character code, presence or absence of the character code in the added file and that is arranged sequentially according to the file numbers of the files; and compressing an arbitrary bit string selected from a bit string group in the compression area, using a Huffman tree for a compression symbol map having, as leaves, a plurality of kinds of symbol strings that cover all patterns represented by a predetermined number of bits and special symbol strings each having a number of bits that is greater than the predetermined number of bits.

10. The recording medium according to claim 9, wherein the compressing includes referring for each compression symbol map, to a table that correlates the appearance rate and the Huffman trees for the compression symbol map, extracting for the compression symbol map from among a plurality of kinds of Huffman trees for the compression symbol map, each having a compression rate corresponding to an appearance rate of the character code in the file group, a Huffman tree for the compression symbol map having the compression rate corresponding to the appearance rate of the character code corresponding to the compression symbol map, and compressing the bit string of the compression area of the compression symbol map, using the extracted Huffman tree for the compression symbol map.

11. The recording medium according to claim 9, wherein the special symbol string is a symbol string having symbols that are sequentially lined up and that each mean that the character code does not appear.

12. The recording medium according to claim 9, wherein the Huffman trees for the compression symbol map are a set of Huffman trees that are the compression rates corresponding to the appearance rates that are lower than 50%, and the compressing, when an appearance rate Q of the character code is 50% or higher, includes inverting the bit string of the compression area of the compression symbol map that corresponds to the character code, referring to the table, extracting from the Huffman trees for the compression symbol map, a Huffman tree for the compression symbol map that is a compression rate corresponding to the appearance rate of (100−Q) %, and compressing the inverted bit string using the extracted Huffman tree for the compression symbol map.

13. A non-tangible, computer-readable recording medium storing therein an information search program causing a computer to execute:

receiving input of a search keyword;

compressing a search keyword by referring to a character structure having for each character code, a pointer to a structure of a leaf storing therein the character code, obtaining a pointer to a leaf for each character code constituting the search keyword received at the receiving, accessing the leaf using the pointer to the leaf, and extracting and compressing a compression symbol stored in the leaf that is an access destination;

identifying a compression symbol map among a compression symbol map group having a bit string that for each character code, indicates presence or absence of the character code in a file group, by obtaining a pointer to the compression symbol map stored in the leaf that is an access destination, and identifying for each character code constituting the search keyword, the compression symbol map;

identifying for each character code constituting the search keyword and by referring to the compression symbol map identified at the identifying a compression symbol map, a compressed file of the file having present therein a character code constituting the search keyword, the identified compressed file being among a compressed file group that are compressed from the file group using a no-node Huffman tree having leaves each storing therein pointers to the character code, a compression symbol of the character code, and a compression symbol map that indicates presence or absence of the character code in the file group; and extracting from the identified compressed file, a compression symbol string having a length equivalent to that of the pointer to the leaf;

identifying from a root of a no-node Huffman tree to which pointers to the leaves of a length corresponding to the number of leaves are allocated as branches to the leaves, in a quantity corresponding to the appearance rate of the character code, a pointer to a leaf coinciding with the compression symbol string extracted at the extracting, and further identifying the leaf pointed to by the identified pointer; and storing an expansion code to the predetermined storage area, by extracting, as the expansion code, a character code in the identified leaf.

14. The recording medium according to claim 13, wherein the identifying includes referring to the compression symbol map group and a deletion map having a bit string that indicates the presence or the absence of the compressed file to identify, for each character code constituting the search keyword received at the receiving and among the compressed file group, a compressed file of a file that has present and not deleted therein a character code constituting the search keyword.

15. The recording medium according to claim 13, wherein the compression symbol map group has a compression area formed by compressing the bit strings using a Huffman tree for a compression symbol map having, as leaves, a plurality of kinds of symbol strings that cover all patterns represented by a predetermined number of bits and special symbol strings each having number of bits that is greater than the predetermined number of bits, the information search program causes the computer to further execute expanding the compression area of the identified compression symbol map, using the Huffman tree for the compression symbol map, and the identifying includes referring to the expanded compression symbol map to identify, for each character code constituting the search keyword and among the compressed file group, a compressed file of the file having present therein the character code constituting the search keyword.

16. The recording medium according to claim 13 and storing therein the information search program causing the computer to further execute:

comparing by setting, from the search keyword based on the number of times of coincidence with the expanded codes, a character code to be compared with expanded codes sequentially stored, and respectively comparing the sequentially stored, expanded codes with the set character codes, and determining whether the sequentially stored, expanded code string and the search keyword coincide; and outputting a comparison result obtained at the comparing.

17. The recording medium according to claim 16, wherein the leaf has a comparison flag that indicates coincidence or non-coincidence determined at the comparing, the information search program causes the computer to further execute setting, when at the identifying, a pointer to the leaf is identified for each compression symbol compressed at the compressing, a comparison flag of the identified leaf to have a value indicating comparison permission, and the comparing includes comparing, based on the comparison flags of the identified leaves, each of the sequentially stored, expanded codes among leaves indicating comparison permission with the character codes set at the setting a comparison flag, and determining whether the sequentially stored, expanded code strings and the search keyword coincide.

18. An information processing apparatus comprising:

a compressing unit that sequentially compresses according to a Huffman tree, a character code to be compressed that is described in a file selected from a file group, wherein a leaf of the Huffman tree corresponding to the character code stores therein a pointer to a compression symbol map of the character code to convert the character code into a compression symbol of the character code;

a detecting unit that detects access to the leaf of the Huffman tree by the compressing unit;

a compression symbol map identifying unit that identifies a compression symbol map of the character code to be compressed, among a compression symbol map group by a pointer stored in the accessed leaf as detected by the detecting unit, wherein the compression symbol map group has a bit string indicating for each character code, presence or absence of the character code in the file group; and an updating unit that updates a bit that indicates presence or absence of the character code to be compressed in the compression symbol map identified by the compression symbol map identifying unit.

19. An information search apparatus comprising:

an input unit that receives input of a search keyword;

a search keyword compressing unit that refers to a character structure having for each character code, a pointer to a structure of a leaf storing therein the character code, that obtains a pointer to a leaf for each character code constituting the search keyword input by the input unit, that accesses the leaf using the pointer to the leaf, and that extracts a compression symbol stored in the leaf that is an access destination;

a compression symbol map identifying unit that obtains a pointer to a compression symbol map stored in the leaf that is an access destination, and that identifies for each character code constituting the search keyword, the compression symbol map among a compression symbol map group having a bit string that for each character code, indicates presence or absence of the character code in a file group;

a compressed file identifying unit that for each character code constituting the search keyword and by referring to the compression symbol map identified by the compression symbol map identifying unit, identifies among a compressed file group, a compressed file of the file having present therein a character code constituting the search keyword, wherein the compressed file group are compressed from the file group using a no-node Huffman tree having leaves each storing therein pointers to the character code, a compression symbol of the character code, and a compression symbol map that indicates presence or absence of the character code in the file group;

an extracting unit that extracts from the compressed file identified by the compressed file identifying unit, a compression symbol string having a same length as that of the pointer to the leaf;

a leaf identifying unit that identifies from a root of the no-node Huffman tree, a pointer to a leaf coinciding with the compression symbol string extracted by the extracting unit, and that identifies a leaf pointed to by the pointer to the leaf coinciding with the extracted compression symbol string, wherein to the root of the no-node Huffman tree, pointers to the leaves of a length corresponding to the number of leaves are allocated as branches to the leaves, in a quantity corresponding to the appearance rate of the character code; and an expansion code storing unit that extracts, as an expansion code, a character code in the leaf identified by the leaf identifying unit, and that stores to the predetermined storage area, the character code.

* * * * *